(12) United States Patent
Okazaki et al.

(10) Patent No.: US 10,170,599 B2
(45) Date of Patent: Jan. 1, 2019

(54) SEMICONDUCTOR DEVICE INCLUDING INSULATING FILMS WITH DIFFERENT THICKNESSES AND METHOD FOR MANUFACTURING THE SEMICONDUCTOR DEVICE

(71) Applicant: Semiconductor Energy Laboratory Co., Ltd., Atsugi-shi, Kanagawa-ken (JP)

(72) Inventors: Kenichi Okazaki, Tochigi (JP); Toshiyuki Miyamoto, Kanuma (JP); Masafumi Nomura, Tochigi (JP); Takashi Hamochi, Shimotsuga (JP); Shunpei Yamazaki, Setagaya (JP); Toshinari Sasaki, Shinagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/147,105

(22) Filed: May 5, 2016

(65) Prior Publication Data

US 2016/0247903 A1    Aug. 25, 2016

Related U.S. Application Data

(63) Continuation of application No. 13/833,389, filed on Mar. 15, 2013, now Pat. No. 9,337,342.

(30) Foreign Application Priority Data

Apr. 13, 2012 (JP) .................................. 2012-092324
May 10, 2012 (JP) .................................. 2012-108840
May 31, 2012 (JP) .................................. 2012-125447

(51) Int. Cl.
*H01L 29/78* (2006.01)
*H01L 21/16* (2006.01)
(Continued)

(52) U.S. Cl.
CPC .... *H01L 29/66969* (2013.01); *H01L 21/0217* (2013.01); *H01L 21/02271* (2013.01);
(Continued)

(58) Field of Classification Search
CPC ..... H01L 29/7869; H01L 21/16; H01L 21/00; H01L 29/24; H01L 21/479;
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A    9/2010
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
(Continued)

*Primary Examiner* — Didarul Mazumder
(74) *Attorney, Agent, or Firm* — Robinson Intellectual Property Law Office; Eric J. Robinson

(57) ABSTRACT

In a semiconductor device including an oxide semiconductor, the amount of oxygen vacancies is reduced. Moreover, electrical characteristics of a semiconductor device including an oxide semiconductor are improved. The semiconductor device includes a transistor including a gate electrode over a substrate, a gate insulating film covering the gate electrode, an oxide semiconductor film overlapping with the gate electrode with the gate insulating film provided ther-
(Continued)

ebetween, and a pair of electrodes in contact with the oxide semiconductor film; and over the transistor, a first insulating film covering the gate insulating film, the oxide semiconductor film, and the pair of electrodes; and a second insulating film covering the first insulating film. An etching rate of the first insulating film is lower than or equal to 10 nm/min and lower than an etching rate of the second insulating film when etching is performed at 25° C. with 0.5 weight % of hydrofluoric acid.

18 Claims, 26 Drawing Sheets

(51) Int. Cl.
| | |
|---|---|
| H01L 21/00 | (2006.01) |
| H01L 29/24 | (2006.01) |
| H01L 21/47 | (2006.01) |
| H01L 29/66 | (2006.01) |
| H01L 27/12 | (2006.01) |
| H01L 21/02 | (2006.01) |
| H01L 29/786 | (2006.01) |
| H01L 21/4757 | (2006.01) |

(52) U.S. Cl.
CPC .. *H01L 21/02565* (2013.01); *H01L 21/47573* (2013.01); *H01L 27/1225* (2013.01); *H01L 27/1259* (2013.01); *H01L 29/7869* (2013.01); *H01L 29/78696* (2013.01)

(58) Field of Classification Search
CPC ......... H01L 29/66969; H01L 21/47573; H01L 27/1259; H01L 21/0217; H01L 21/02271; H01L 21/02565; H01L 27/1225; H01L 29/78696
USPC ........ 257/410, 411, 43, 64; 438/85, 86, 104, 438/754
See application file for complete search history.

(56) References Cited

U.S. PATENT DOCUMENTS

| | | | |
|---|---|---|---|
| 6,294,274 | B1 | 9/2001 | Kawazoe et al. |
| 6,492,681 | B2 | 12/2002 | Koyama et al. |
| 6,563,174 | B2 | 5/2003 | Kawasaki et al. |
| 6,727,522 | B1 | 4/2004 | Kawasaki et al. |
| 6,784,495 | B2 | 8/2004 | Koyama et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,838,351 | B2 | 11/2010 | Toyota et al. |
| 7,955,995 | B2 | 6/2011 | Kakehata et al. |
| 8,384,079 | B2 | 2/2013 | Yamazaki et al. |
| 8,502,217 | B2 | 8/2013 | Sato et al. |
| 8,629,438 | B2 | 1/2014 | Yamazaki |
| 8,884,294 | B2 | 11/2014 | Yamazaki et al. |
| 9,142,648 | B2 | 9/2015 | Yamazaki |
| 9,209,311 | B2 | 12/2015 | Ueda et al. |
| 9,231,070 | B2 | 1/2016 | Kakehata et al. |
| 9,276,129 | B2 | 3/2016 | Yamazaki et al. |
| 9,490,368 | B2 | 11/2016 | Kimura et al. |
| 9,601,602 | B2 | 3/2017 | Yamazaki |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0013280 | A1 | 1/2003 | Yamanaka |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0241924 | A1 | 12/2004 | Chen et al. |
| 2005/0017302 | A1 | 1/2005 | Hoffman |
| 2005/0199959 | A1 | 9/2005 | Chiang et al. |
| 2005/0202601 | A1 | 9/2005 | Koide |
| 2005/0263767 | A1 | 12/2005 | Yamazaki et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0163678 | A1 | 7/2006 | Anezaki |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0190886 | A1* | 8/2008 | Choi ............... C03C 17/34 216/23 |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |

(56) References Cited

U.S. PATENT DOCUMENTS

| | | |
|---|---|---|
| 2009/0152541 A1 | 6/2009 | Maekawa et al. |
| 2009/0184326 A1 | 7/2009 | Lee et al. |
| 2009/0278122 A1 | 11/2009 | Hosono et al. |
| 2009/0280600 A1 | 11/2009 | Hosono et al. |
| 2010/0062578 A1 | 3/2010 | Wilhelm |
| 2010/0065844 A1 | 3/2010 | Tokunaga |
| 2010/0072467 A1 | 3/2010 | Yamazaki et al. |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0301328 A1 | 12/2010 | Yamazaki et al. |
| 2011/0024750 A1 | 2/2011 | Yamazaki et al. |
| 2011/0062435 A1 | 3/2011 | Yamazaki et al. |
| 2011/0114942 A1 | 5/2011 | Akimoto et al. |
| 2011/0121289 A1* | 5/2011 | Miyanaga ........... H01L 29/7869 257/43 |
| 2011/0127518 A1* | 6/2011 | Jung ................... H01L 29/7869 257/43 |
| 2011/0175080 A1* | 7/2011 | Kim .................... H01L 29/7869 257/43 |
| 2011/0180802 A1 | 7/2011 | Morosawa et al. |
| 2011/0193846 A1 | 8/2011 | Kimura et al. |
| 2011/0227139 A1* | 9/2011 | Kakehata ............. H01L 27/115 257/316 |
| 2011/0269266 A1 | 11/2011 | Yamazaki |
| 2011/0284846 A1* | 11/2011 | Endo ................... H01L 29/4908 257/57 |
| 2011/0303913 A1 | 12/2011 | Yamazaki et al. |
| 2011/0309456 A1 | 12/2011 | Yamazaki |
| 2012/0018721 A1* | 1/2012 | Choi ................. H01L 29/78606 257/43 |
| 2012/0032163 A1 | 2/2012 | Yamazaki |
| 2012/0061663 A1* | 3/2012 | Yamazaki ......... H01L 21/02488 257/43 |
| 2012/0064703 A1 | 3/2012 | Jintyou et al. |
| 2012/0223306 A1 | 9/2012 | Saito et al. |
| 2012/0244658 A1* | 9/2012 | Koezuka .............. H01L 21/425 438/104 |
| 2012/0273779 A1 | 11/2012 | Yamazaki et al. |
| 2012/0273780 A1 | 11/2012 | Yamazaki et al. |
| 2012/0280230 A1 | 11/2012 | Akimoto et al. |
| 2013/0009111 A1 | 1/2013 | Morita et al. |
| 2013/0175530 A1* | 7/2013 | Noda ................ H01L 29/78693 257/57 |
| 2013/0264563 A1 | 10/2013 | Okazaki et al. |
| 2014/0106502 A1* | 4/2014 | Tezuka .............. H01L 29/66969 438/104 |
| 2017/0033234 A1 | 2/2017 | Kimura et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-250956 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-004929 A | 1/2008 |
| JP | 2009-027122 A | 2/2009 |
| JP | 2009-141002 A | 6/2009 |
| JP | 2012-004549 A | 1/2012 |
| JP | 2012-009843 A | 1/2012 |
| JP | 2012-019207 A | 1/2012 |
| JP | 2012-054547 A | 3/2012 |
| WO | WO-2004/114391 | 12/2004 |
| WO | WO-2007/138937 | 12/2007 |
| WO | WO-2009/072532 | 6/2009 |
| WO | WO-2011/027467 | 3/2011 |
| WO | WO-2011/126093 | 10/2011 |
| WO | WO-2011/145635 | 11/2011 |
| WO | WO-2011/155502 | 12/2011 |

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technica Digest of International Electron Devices Meeting Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabircation of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vo. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09: SID International Symposium Digest of Technical Papers, May 31, 2009, pp. 184-187.

Nomura.K et al., "Carrier transport in transparent oxide semiconductor with intrinsic structural randomness probed using single-

(56) References Cited

OTHER PUBLICATIONS crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02: Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08: SID International Symposium Digest May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga⇒Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07: SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09: SID International Symposium Digest of Technical Papers, May 31, 2009, pp. 395-398.
Lee.H et al., "Current Status of, Challenges to, and Perspective View of AM-OLED", IDW '06: Proceedings of the 13th International Display Workshops, Dec. 7, 2006, pp. 663-666.
Kikuchi.H et al., "62.2:Invited Paper:Fast Electro-Optical Switching in Polymer-Stabilized Liquyid Crystalline Blue Phases for Display Application", SID Digest '07: SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Lett. (Applied Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08: Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett (Applied Physics Letters), Sep. 1, 2003, vol. 83, No. 9, pp. 1755-1757

* cited by examiner

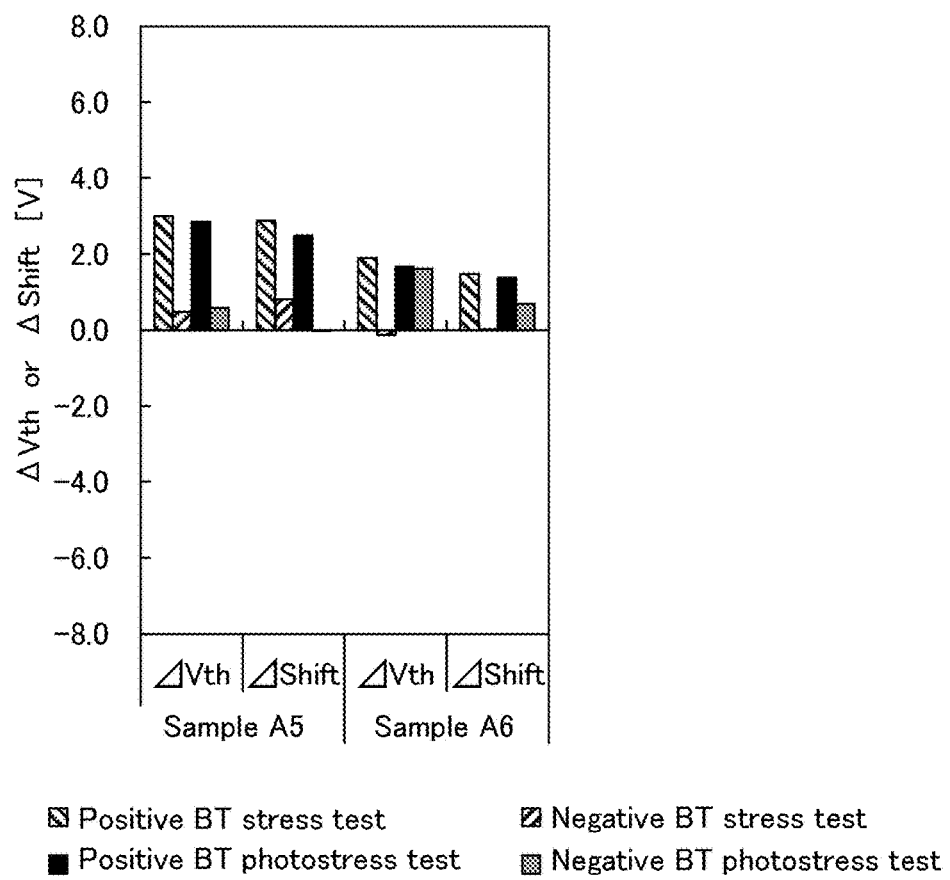

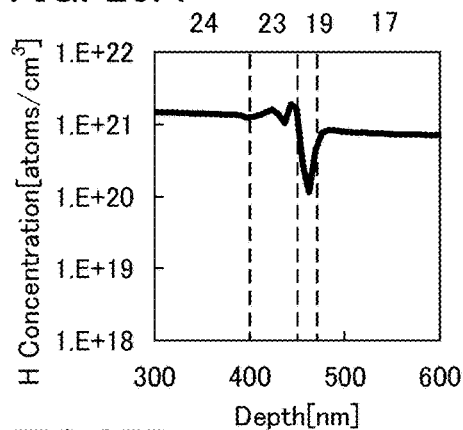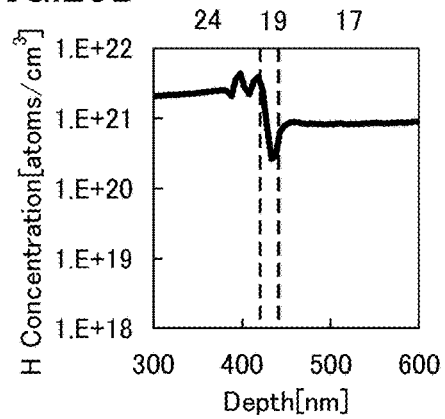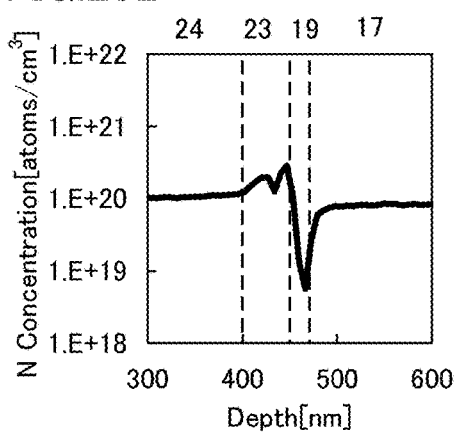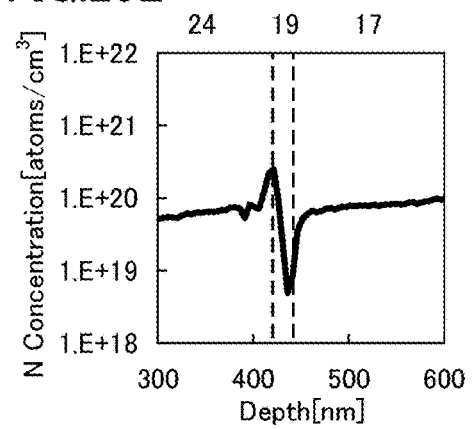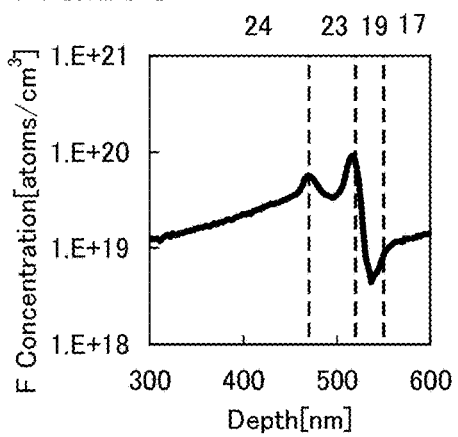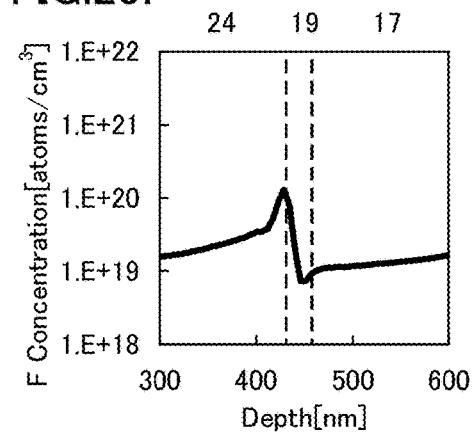

SEMICONDUCTOR DEVICE INCLUDING INSULATING FILMS WITH DIFFERENT THICKNESSES AND METHOD FOR MANUFACTURING THE SEMICONDUCTOR DEVICE

BACKGROUND OF THE INVENTION

1. Field of the Invention

The present invention relates to a semiconductor device including a transistor.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

REFERENCE

[Patent Document 1] Japanese Published Patent Application No. 2007-123861

[Patent Document 2] Japanese Published Patent Application No. 2007-096055

SUMMARY OF THE INVENTION

In a transistor including an oxide semiconductor, oxygen vacancies in an oxide semiconductor film cause the transistor to have poor electrical characteristics. For example, the threshold voltage of a transistor including an oxide semiconductor film which includes oxygen vacancies tends to shift in the negative direction, and thus the transistor tends to have normally-on characteristics. This is because charge is generated owing to the oxygen vacancies in the oxide semiconductor film, resulting in reduction of the resistance of the oxide semiconductor film. The transistor having normally-on characteristics causes various problems in that malfunction is likely to be caused when in operation and that power consumption is increased when not in operation.

Further, when the oxide semiconductor film includes an oxygen vacancy, as a problem, the amount of change in electrical characteristics, typically, the threshold voltage of the transistor is increased due to change over time or a bias-temperature stress test (hereinafter also referred to as a BT stress test).

Thus, one object of one embodiment of the present invention is to reduce the amount of oxygen vacancies in a semiconductor device including an oxide semiconductor. Another object of one embodiment of the present invention is to improve electrical characteristics of a semiconductor device including an oxide semiconductor.

According to one embodiment of the present invention, a semiconductor device includes a transistor including a gate electrode over a substrate, a gate insulating film covering the gate electrode, an oxide semiconductor film overlapping with the gate electrode with the gate insulating film provided therebetween, and a pair of electrodes in contact with the oxide semiconductor film; and over the transistor, a first oxide insulating film covering the gate insulating film, the oxide semiconductor film, and the pair of electrodes; and a second oxide insulating film covering the first oxide insulating film. In the semiconductor device, the first oxide insulating film is dense and hard, typically an etching rate of the first oxide insulating film is lower than or equal to 10 nm/min and lower than an etching rate of the second oxide insulating film when etching is performed at 25° C. with a solution of 0.5 weight % of hydrofluoric acid.

Note that similar to the first insulating film, the gate insulating film may be an insulating film which is dense and hard, typically an insulating film having an etching rate lower than or equal to 10 nm/min and lower than an etching rate of the second insulating film when etching is performed at 25° C. with 0.5 weight % of hydrofluoric acid.

According to another embodiment of the present invention, a semiconductor device includes a transistor including a gate electrode over a substrate, a gate insulating film covering the gate electrode, an oxide semiconductor film overlapping with the gate electrode with the gate insulating film provided therebetween, and a pair of electrodes in contact with the oxide semiconductor film; and a first insulating film covering the transistor and a second insulating film over the first insulating film. In the semiconductor device, the first insulating film is an oxide insulating film into which and from which oxygen is diffused, and the second insulating film is an oxide insulating film which contains oxygen at a higher proportion than a stoichiometric composition.

According to another embodiment of the present invention, a semiconductor device includes a transistor including a gate electrode over a substrate, a gate insulating film covering the gate electrode, an oxide semiconductor film overlapping with the gate electrode with the gate insulating film provided therebetween, and a pair of electrodes in contact with the oxide semiconductor film; and an oxide insulating film covering the transistor. In the semiconductor device, the transistor has electrical characteristics in which the threshold voltage does not change or changes in a positive direction by a bias-temperature stress test, and the amount of change is less than or equal to 3.0 V, preferably less than or equal to 2.5 V.

Note that the bias-temperature stress test is a positive BT stress test for applying a higher potential to the gate electrode than the pair of electrodes.

The bias-temperature stress test is a negative BT stress test for applying a lower potential to the gate electrode than the pair of electrodes.

Note that the bias-temperature stress test is a positive BT photostress test for applying a higher potential to the gate electrode than the pair of electrodes while irradiating a transistor with light.

The bias-temperature stress test is a negative BT photostress test for applying a lower potential to the gate electrode than the pair of electrodes while irradiating a transistor with light.

According to another embodiment of the present invention, a gate electrode and a gate insulating film are formed over a substrate, an oxide semiconductor film overlapping with the gate electrode is formed with the gate insulating film provided therebetween, and a pair of electrodes which is in contact with the oxide semiconductor film is formed.

Next, an exposed portion of the oxide semiconductor film is exposed to plasma generated in an atmosphere containing oxygen and then a first insulating film which is dense and hard is formed immediately over the oxide semiconductor film and the pair of electrodes after the oxide semiconductor film and the pair of electrode have been exposed to plasma. The first insulating film is formed under conditions where the substrate placed in a treatment chamber which is vacuum-evacuated is held at a temperature higher than or equal to 180° C. and lower than or equal to 400° C., the pressure in the treatment chamber is greater than or equal to 100 Pa and less than or equal to 250 Pa with introduction of a source gas into the treatment chamber, and a high-frequency power is supplied to an electrode provided in the treatment chamber.

Further, the second insulating film is formed over the first insulating film. The second insulating film may be an insulating film which contains oxygen at a higher proportion than a stoichiometric composition. The insulating film which contains oxygen at a higher proportion than the stoichiometric composition is formed under conditions where the substrate placed in a treatment chamber which is vacuum-evacuated is held at a temperature higher than or equal to 180° C. and lower than or equal to 250° C., the pressure is greater than or equal to 100 Pa and less than or equal to 250 Pa with introduction of a source gas into the treatment chamber, and a high-frequency power higher than or equal to $0.17$ W/cm$^2$ and lower than or equal to $0.5$ W/cm$^2$ is supplied to an electrode provided in the treatment chamber.

The atmosphere containing oxygen for generating plasma is an atmosphere containing one or more of oxygen, ozone, dinitrogen monoxide, nitrogen dioxide, and air.

A silicon oxide film or a silicon oxynitride film is formed as the first insulating film and the second insulating film with a deposition gas containing silicon and an oxidizing gas as a source gas.

A silicon oxynitride film is formed as the first insulating film and the second insulating film with silane and dinitrogen monoxide as a source gas.

An oxide semiconductor film is exposed to plasma generated in an oxidizing atmosphere to supply oxygen to the oxide semiconductor film, whereby the amount of oxygen vacancies in the oxide semiconductor film can be reduced. Further, when a first insulating film which is dense and hard is formed immediately after the plasma treatment is performed, the concentration of impurities at the interface between the oxide semiconductor film and the first insulating film can be reduced. Furthermore, with the formation of the first insulating film which is dense and hard, the oxide semiconductor film can be prevented from being exposed to plasma and plasma damage to the oxide semiconductor film can be reduced during later film formation of a second insulating film. Accordingly, according to one embodiment of the present invention, a semiconductor device having excellent electrical characteristics can be manufactured.

Moreover, when an oxide insulating film into which and from which oxygen is diffused is formed over the oxide semiconductor film and then an oxide insulating film which contains oxygen at a higher proportion than the stoichiometric composition is formed over the oxide insulating film, oxygen of the oxide insulating film which contains oxygen at a higher proportion than the stoichiometric composition can be diffused into the oxide semiconductor film. Consequently, the amount of oxygen vacancies in the oxide semiconductor film can be reduced. Thus, a semiconductor device having excellent electrical characteristics can be manufactured.

BRIEF DESCRIPTION OF THE DRAWINGS

FIG. 12 shows a threshold voltage (Vth) and a shift value (Shift) of a transistor.

FIGS. 25A to 25F show results of SIMS measurement.

DETAILED DESCRIPTION OF THE INVENTION

Figure 1A:
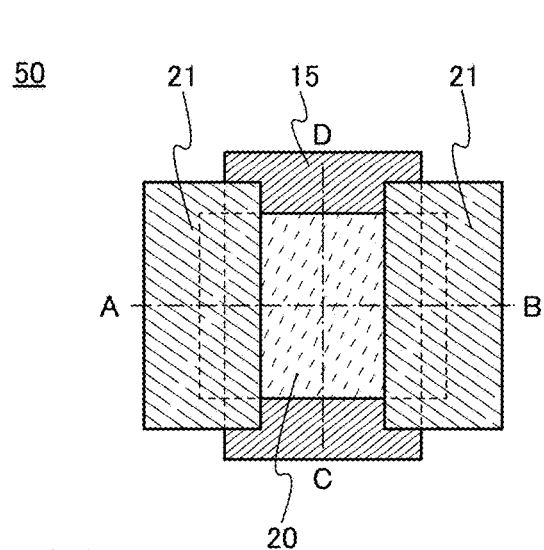
FIGS. 1A to 1D are a top view and cross-sectional views illustrating one embodiment of a transistor, and a graph showing electrical characteristics of the transistor.

Embodiments and examples of the present invention will be described below in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is in some cases exaggerated for clarity. Therefore, the embodiments and the examples of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used in many cases as synonymous words. Thus, in this specification, a potential may be rephrased as a voltage and a voltage may be rephrased as a potential unless otherwise specified.

In this specification, in the case where an etching step is performed after a photolithography process, a mask formed in the photolithography process is removed.

Embodiment 1

In this embodiment, a semiconductor device of one embodiment of the present invention and a method for manufacturing the semiconductor device will be described with reference to drawings.

Figure 1C:
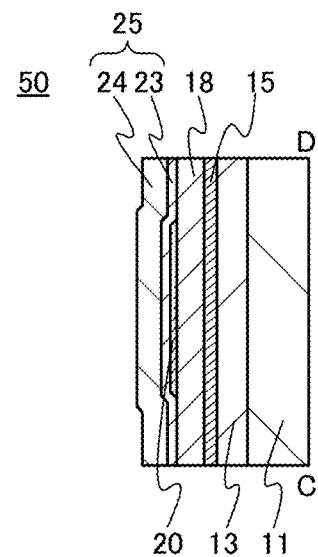
Figure 1B:
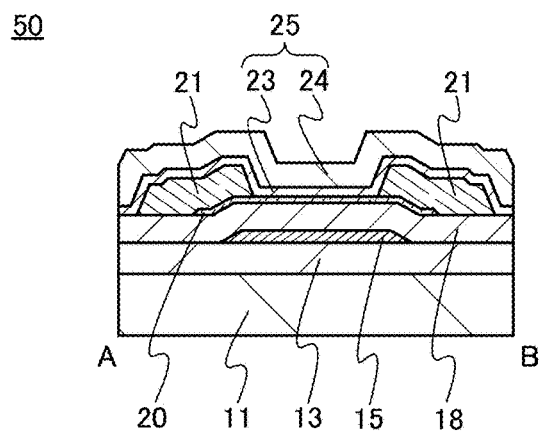

FIGS. 1A to 1C are a top view and cross-sectional views of a transistor 50 of a semiconductor device. FIG. 1A is a top view of the transistor 50, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, some components of the transistor 50 (e.g., a gate insulating film 18), a substrate 11, a base insulating film 13, an insulating film 23, an insulating film 24, and the like are omitted for simplicity.

The transistor 50 illustrated in FIGS. 1B and 1C includes a gate electrode 15 over the base insulating film 13. Moreover, the gate insulating film 18 over the base insulating film 13 and the gate electrode 15, an oxide semiconductor film 20 overlapping with the gate electrode 15 with the gate insulating film 18 provided therebetween, and a pair of electrodes 21 in contact with the oxide semiconductor film 20 are included. A protective film 25 including the insulating film 23 and the insulating film 24 is over the gate insulating film 18, the oxide semiconductor film 20, and the pair of electrodes 21.

In the transistor 50 of this embodiment, the oxide semiconductor film 20 may be exposed to plasma generated in an oxidizing atmosphere. Atmospheres of oxygen, ozone, dinitrogen monoxide, nitrogen dioxide, and the like can be given as examples of oxidizing atmospheres. Further, in the plasma treatment, the oxide semiconductor film 20 is preferred to be exposed to plasma generated with no bias applied to the substrate 11 side. By exposure of an oxide semiconductor film to such plasma, the oxide semiconductor film can be supplied with oxygen without being damaged; accordingly, the amount of oxygen vacancies in the oxide semiconductor film 20 can be reduced.

Further, the insulating film 23 is formed to be in contact with the oxide semiconductor film 20. The insulating film 23 is an insulating film which is dense and hard. Specifically, the insulating film 23 is a silicon oxide film or a silicon oxynitride film having an etching rate lower than or equal to 10 nm/min, preferably lower than or equal to 8 nm/min, and lower than an etching rate of the insulating film 24 when etching is performed at 25° C. with 0.5 weight % of hydrofluoric acid.

When the insulating film 23 is dense and hard, the oxide semiconductor film can be prevented from being exposed to plasma and plasma damage to the oxide semiconductor film can be reduced during later film formation of the insulating film 24. Accordingly, generation of oxygen vacancies in the oxide semiconductor film can be suppressed.

In the insulating film 23, spin densities of a signal detected by electron spin resonance (ESR), which appear at E'-center (g-factor is 2.001) that show dangling bonds of silicon, are preferably lower than or equal to $2 \times 10^{15}$ spins/cm$^3$, more preferably lower than or equal to the lower limit of detection ($1 \times 10^{15}$ spins/cm$^3$). Such an insulating film 23 has extremely few silicon dangling bonds. Therefore, the amount of change in threshold voltage of the transistor 50 having the insulating film 23 over time or in a BT stress test is small, and thus the transistor 50 has excellent electrical characteristics.

Further, the insulating film 23 is formed to be in contact with the oxide semiconductor film 20 in the transistor 50. The insulating film 23 is an oxide insulating film into which and from which oxygen is diffused. Note that here, diffusion of oxygen includes movement of oxygen remaining in the insulating film 23 as well as movement of oxygen to the oxide semiconductor film 20 through the insulating film 23.

When an oxide insulating film into which and from which oxygen is diffused is formed as the insulating film 23, oxygen diffused from the insulating film 24 provided over the insulating film 23 can be diffused into the oxide semiconductor film 20 through the insulating film 23.

As the insulating film 23, a silicon oxide film, a silicon oxynitride film, or the like having a thickness greater than or equal to 5 nm and less than or equal to 150 nm, preferably greater than or equal to 5 nm and less than or equal to 50 nm, more preferably greater than or equal to 10 nm and less than or equal to 30 nm can be used.

Note that in the case where the oxide semiconductor film 20 is formed using a metal oxide containing indium, the insulating film 23 in some cases contains indium at a concentration of greater than or equal to $1 \times 10^{15}$ atoms/cm$^3$ and less than or equal to $5 \times 10^{17}$ atoms/cm$^3$. This occurs because indium contained in the oxide semiconductor film 20 is diffused into the insulating film 23 at the formation of the insulating film 23. Note that as a film formation temperature of the insulating film 23 gets higher (e.g., higher than or equal to 350° C.), the indium content of the insulating film 23 is increased.

Further, the insulating film 24 is formed to be in contact with the insulating film 23. The insulating film 24 is an oxide insulating film which contains oxygen at a higher proportion than the stoichiometric composition.

As the insulating film 24, a silicon oxide film, a silicon oxynitride film, or the like having a thickness greater than or equal to 30 nm and less than or equal to 500 nm, preferably greater than or equal to 150 nm and less than or equal to 400 nm can be used.

Part of oxygen is released by heat treatment from the oxide insulating film which contains oxygen at a higher proportion than the stoichiometric composition. Therefore, when the oxide insulating film from which part of oxygen is released by heat treatment is provided over the insulating film 23 as the insulating film 24, oxygen can be diffused into the oxide semiconductor film 20 and oxygen vacancies in the oxide semiconductor film 20 can be compensated. Alternatively, when the insulating film 24 is formed over the insulating film 23 during heat treatment, oxygen can be diffused into the oxide semiconductor film 20 and oxygen vacancies in the oxide semiconductor film 20 can be compensated. Still alternatively, when the insulating film 24 is formed over the insulating film 23 and is then subjected to heat treatment, oxygen can be diffused into the oxide semiconductor film 20 and oxygen vacancies in the oxide semiconductor film 20 can be compensated. Consequently, the amount of oxygen vacancies in the oxide semiconductor film can be reduced.

When the oxide insulating film which contains oxygen at a higher proportion than the stoichiometric composition is provided over a back channel of the oxide semiconductor film 20 (a surface of the oxide semiconductor film 20, which is opposite to a surface facing the gate electrode 15) through the oxide insulating film into which and from which oxygen is diffused, oxygen can be diffused on the back channel side of the oxide semiconductor film 20, and oxygen vacancies on the back channel side can be reduced. The transistor 50 having such a structure has the following electrical characteristics: the threshold voltage does not change or changes in a positive direction due to a BT stress test and a BT photostress test, and the amount of change (ΔVth) is less than or equal to 3.0 V, preferably less than or equal to 2.5 V, more preferably greater than or equal to 0 V and less than or equal to 1.5 V.

Further, it is possible to prevent outward diffusion of oxygen from the oxide semiconductor film 20 and entry of hydrogen, water, or the like into the oxide semiconductor film 20 from the outside by providing an insulating film having a blocking effect against oxygen, hydrogen, water, and the like over the insulating film 24. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

Here, electrical characteristics of a transistor having a small amount of change in threshold voltage in a BT stress test and a BT photostress test are described with reference to FIG. 1D.

The BT stress test is one kind of accelerated test and can evaluate, in a short time, change in characteristics (i.e., change over time) of transistors, which is caused by long-term use. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

Next, a specific method of the BT stress test is described. First, initial characteristics of the transistor are measured at an initial temperature. Next, the temperature of the substrate over which the transistor is formed (substrate temperature) is set at fixed temperature, the pair of electrodes serving as a source electrode and a drain electrode of the transistor are set at a same potential, and the gate electrode is supplied for a certain period with potential different from that of the pair of electrodes serving as a source electrode and a drain electrode. The substrate temperature may be determined as appropriate in accordance with the test purpose. Then, the substrate temperature is set at a temperature similar to that of the initial temperature, and electrical characteristics of the transistor are measured again. As a result, a difference between the threshold voltage in the initial characteristics and the threshold voltage in the electrical characteristics after the BT stress test can be obtained as the amount of change in the threshold voltage.

Note that the test in the case where the potential applied to the gate electrode is higher than the potentials of the source electrode and the drain electrode is referred to as a positive BT stress test, and the test in the case where the potential applied to the gate electrode is lower than the potential of the source electrode and the drain electrode is referred to as a negative BT stress test. A BT stress test with light irradiation is referred to as a BT photostress test. The test in the case where light irradiation is performed and the potential applied to the gate electrode is higher than the potential of the source electrode and the drain electrode is referred to as a positive BT photostress test, and the test in the case where light irradiation is performed and the potential applied to the gate electrode is lower than the potential of the source electrode and the drain electrode is referred to as a negative BT photostress test.

The stress conditions for the BT stress test can be determined by setting the substrate temperature, the electric field intensity applied to the gate insulating film, and the time period of application of an electric field. The intensity of the electric field applied to the gate insulating film is determined in accordance with a value obtained by dividing a potential difference between the gate electrode, and the source electrode and the drain electrode by the thickness of the gate insulating film. For example, in the case where the intensity of the electric field applied to the 100-nm-thick gate insulating film is to be 3 MV/cm, the potential difference between the gate electrode, and the source electrode and the drain electrode can be set to 30 V.

Figure 1D:
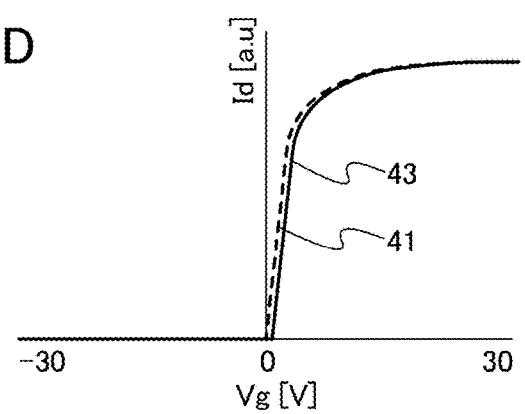

FIG. 1D shows electrical characteristics of the transistor, and the horizontal axis indicates the gate voltage and the vertical axis indicates the drain current. A dashed line 41 denotes the initial characteristics of the transistor, and a solid line 43 denotes the electrical characteristics of the transistor after the BT stress test. The transistor of this embodiment has the following electrical characteristics: the amount of change in the threshold voltage in the dashed line 41 and the solid line 43 is 0 V or the threshold voltage changes in a positive direction, and the amount of change is less than or equal to 3.0 V, preferably less than or equal to 2.5 V, more preferably less than or equal to 1.5 V, further preferably much less. Therefore, in the transistor of this embodiment, the threshold voltage is not shifted in the negative direction in the electrical characteristics after the BT stress test. That is, a transistor having normally-off characteristics does not become a transistor having normally-on characteristics by long-term usage. As a result, it is apparent that the transistor 50 of this embodiment has high reliability.

Note that a transistor including an oxide semiconductor film is an n-channel transistor; therefore, in this specification, a transistor which can be regarded as having no drain current flowing therein when a gate voltage is 0 V is defined as a transistor having normally-off characteristics. In contrast, a transistor which can be regarded as having a drain current flowing therein when a gate voltage is 0 V is defined as a transistor having normally-on characteristics.

Other details of the transistor 50 are described below.

There is no particular limitation on the property of a material and the like of the substrate 11 as long as the material has heat resistance enough to withstand at least later heat treatment. For example, a glass substrate, a ceramic substrate, a quartz substrate, a sapphire substrate, or the like may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 11. Furthermore, any of these substrates further provided with a semiconductor element may be used as the substrate 11.

Still alternatively, a flexible substrate may be used as the substrate 11, and the base insulating film 13 and the transistor 50 may be provided directly on the flexible substrate. Alternatively, a separation layer may be provided between the substrate 11 and the base insulating film 13. The separation layer can be used when part or the whole of a semiconductor device formed over the separation layer is separated from the substrate 11 and transferred onto another substrate. In such a case, the transistor 50 can be transferred to a substrate having low heat resistance or a flexible substrate as well.

As the base insulating film 13, a silicon oxide film, a silicon oxynitride film, a silicon nitride film, a silicon nitride oxide film, a gallium oxide film, a hafnium oxide film, an yttrium oxide film, an aluminum oxide film, an aluminum oxynitride film, and the like can be given as examples. Note that when a silicon nitride film, a gallium oxide film, a hafnium oxide film, an yttrium oxide film, an aluminum oxide film, or the like is used as the base insulating film 13, it is possible to suppress diffusion of impurities such as an alkali metal, water, and hydrogen into the oxide semiconductor film 20 from the substrate 11. Note that in this specification, a "silicon oxynitride film" refers to a film that includes more oxygen than nitrogen, and a "silicon nitride oxide film" refers to a film that includes more nitrogen than oxygen.

The gate electrode 15 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. Further, the gate electrode 15 may have a single-layer structure or a stacked-layer structure of two or more layers. A single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; and a three-layer structure in which a titanium film, an aluminum film, and a titanium film are stacked in this order can be given as examples. Alternatively, a film, an alloy film, or a nitride film which contains aluminum and one or more elements selected from titanium, tantalum, tungsten, molybdenum, chromium, neodymium, and scandium may be used.

The gate electrode 15 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like may be provided between the gate electrode 15 and the gate insulating film 18. These films each have a work function higher than or equal to 5 eV, preferably higher than or equal to 5.5 eV, which is higher than the electron affinity of an oxide semiconductor; thus, the threshold voltage of a transistor including the oxide semiconductor can be shifted in the positive direction. Accordingly, a switching element having what is called normally-off characteristics can be obtained. For example, in the case of using an In—Ga—Zn-based oxynitride semiconductor film, an In—Ga—Zn-based oxynitride semiconductor film having a higher nitrogen concentration than at least the oxide semiconductor film 20, specifically, an In—Ga—Zn-based oxynitride semiconductor film having a nitrogen concentration higher than or equal to 7 at. % is used.

The gate insulating film 18 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film. The gate insulating film 18 may be formed using an oxide insulator from which oxygen is released by heating. With the use of a film from which oxygen is released by heating as the gate insulating film 18, interface states at the interface between the oxide semiconductor film 20 and the gate insulating film 18 can be reduced; accordingly, a transistor with less deterioration in electrical characteristics can be obtained. Further, it is possible to prevent outward diffusion of oxygen from the oxide semiconductor film 20 and entry of hydrogen, water, or the like into the oxide semiconductor film 20 from the outside by providing an insulating film having a blocking effect against oxygen, hydrogen, water, and the like on the gate electrode 15 side of the gate insulating film 18. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The gate insulating film 18 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 18 is preferably greater than or equal to 5 nm and less than or equal to 400 nm, more preferably greater than or equal to 10 nm and less than or equal to 300 nm, still more preferably greater than or equal to 50 nm and less than or equal to 250 nm.

An oxide semiconductor included in the oxide semiconductor film 20 preferably contains at least indium (In) or zinc (Zn). Alternatively, the oxide semiconductor film 20 preferably contains both In and Zn. In order to reduce fluctuations in electrical characteristics of the transistors including the oxide semiconductor film, the oxide semiconductor preferably contains one or more of stabilizers in addition to In or Zn.

As for stabilizers, gallium (Ga), tin (Sn), hafnium (Hf), aluminum (Al), zirconium (Zr), and the like can be given as examples. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given as examples.

As the oxide semiconductor, for example, the following can be used: a single component metal oxide such as indium oxide, tin oxide, or zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, or an In—W-based metal oxide; a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide.

Note that, for example, an In—Ga—Zn-based metal oxide means an oxide containing In, Ga, and Zn as its main components and there is no particular limitation on the ratio of In, Ga, and Zn. The In—Ga—Zn-based metal oxide may contain a metal element other than In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, n is an integer) may be used.

For example, it is possible to use an In—Ga—Zn-based metal oxide containing In, Ga, and Zn at an atomic ratio of 1:1:1 (=1/3:1/3:1/3), 2:2:1 (=2/5:2/5:1/5), or 3:1:2 (=1/2:1/6:1/3), or any of oxides whose composition is in the neighborhood of the above compositions. Alternatively, an In—Sn—Zn-based metal oxide containing In, Sn, and Zn at an atomic ratio of 1:1:1 (=1/3:1/3:1/3), 2:1:3 (=1/3:1/6:1/2), or 2:1:5 (=1/4:1/8:5/8), or any of oxides whose composition is in the neighborhood of the above compositions may be used. Note that in the atomic ratio of each metal oxide, there is a margin of error of ±20% of the above atomic ratios.

However, the composition is not limited to those described above, and a material having the appropriate composition may be used depending on needed semiconductor characteristics and electrical characteristics (e.g., field-effect mobility and threshold voltage). In order to obtain needed semiconductor characteristics and electrical characteristics, it is preferred that the carrier density, the impurity concentration, the defect density, the atomic ratio of a metal element and oxygen, the interatomic distance, the density, and the like be set to be appropriate.

For example, a high mobility can be obtained relatively easily in the case where the In—Sn—Zn-based metal oxide is used. However, the mobility can be increased by reducing the defect density in the bulk also in the case where the In—Ga—Zn-based metal oxide is used.

Further, the energy gap of a metal oxide that can form the oxide semiconductor film 20 is greater than or equal to 2 eV, preferably greater than or equal to 2.5 eV, more preferably greater than or equal to 3 eV. In this manner, the off-state current of a transistor can be reduced by using an oxide semiconductor having a wide energy gap.

Note that the oxide semiconductor film 20 may have an amorphous structure, a single crystal structure, or a polycrystalline structure.

The oxide semiconductor film 20 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor). For example, the oxide semiconductor film 20 may include a CAAC-OS. In the CAAC-OS, for example, c-axes are aligned, and a-axes and/or b-axes are not macroscopically aligned.

For example, the oxide semiconductor film 20 may include microcrystal.

Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, the oxide semiconductor film 20 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film 20 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked-layer structure including a region of an amorphous oxide semiconductor, a region of a microcrystalline oxide semiconductor, and a region of a CAAC-OS, for example.

Note that the oxide semiconductor film 20 may be in a single-crystal state, for example.

An oxide semiconductor film is preferred to include a plurality of crystal parts. In each of the crystal parts, a c-axis is preferred to be aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

Here, the details of the CAAC-OS film are described. Note that in most cases, a crystal part in the CAAC-OS film fits inside a cube whose one side is less than 100 nm. In an image obtained with a transmission electron microscope (TEM), a boundary between the crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is in some cases higher than that in the vicinity of the surface where the oxide semiconductor film is formed. Further, when an impurity is added to the CAAC-OS film, crystallinity of the crystal part in a region to which the impurity is added is in some cases lowered.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electrical characteristics due to irradiation with visible light or ultraviolet light is small. Thus, the transistor has high reliability.

Alternatively, the oxide semiconductor film 20 may have a stacked-layer structure of a plurality of oxide semiconductor films. For example, the oxide semiconductor film 20 may have a stacked-layer structure of a first oxide semiconductor film and a second oxide semiconductor film which are formed using metal oxides with different compositions. Alternatively, for example, the first oxide semiconductor film may be formed using any of two-component metal oxide, a three-component metal oxide, and a four-component metal oxide, and the second oxide semiconductor film may be formed using any of these which is different from the oxide for the first oxide semiconductor film.

Further, the constituent elements of the first oxide semiconductor film and the second oxide semiconductor film may be made the same and the composition of the constituent elements of the first oxide semiconductor film and the second oxide semiconductor film may be made different. For example, the first oxide semiconductor film may contain In, Ga, and Zn at an atomic ratio of 1:1:1, and the second oxide semiconductor film may contain In, Ga, and Zn at an atomic ratio of 3:1:2. Alternatively, the first oxide semiconductor film may contain In, Ga, and Zn at an atomic ratio of 1:3:2, and the second oxide semiconductor film may contain In, Ga, and Zn at an atomic ratio of 2:1:3.

At this time, one of the first oxide semiconductor film and the second oxide semiconductor film, which is closer to the gate electrode (on the channel side), preferably contains In and Ga at a proportion of In>Ga. The other oxide semiconductor film, which is farther from the gate electrode (on the back channel side) preferably contains In and Ga at a proportion of In≤Ga.

Further, the oxide semiconductor film 20 may have a three-layer structure of a first oxide semiconductor film, a second oxide semiconductor film, and a third oxide semiconductor film, in which the constituent elements thereof is made the same and the composition of the constituent elements of the first oxide semiconductor film, the second oxide semiconductor film, and the third oxide semiconductor film is made different. For example, the first oxide semiconductor film may contain In, Ga, and Zn at an atomic ratio of 1:3:2, the second oxide semiconductor film may contain In, Ga, and Zn at an atomic ratio of 3:1:2, and the third oxide semiconductor film may contain In, Ga, and Zn at an atomic ratio of 1:1:1.

An oxide semiconductor film which contains less In than Ga and Zn at an atomic ratio, typically, the first oxide semiconductor film containing In, Ga, and Zn at an atomic ratio of 1:3:2, has a higher insulating property than an oxide semiconductor film containing more In than Ga and Zn at an atomic ratio, typically, the second oxide semiconductor film, and an oxide semiconductor film containing Ga, Zn, and In at the same atomic ratio, typically, the third oxide semiconductor film. Further, when the first oxide semiconductor film containing In, Ga, and Zn at an atomic ratio of 1:3:2 has an amorphous structure, the insulating property is further improved. Accordingly, the second oxide semiconductor film and the third oxide semiconductor film each serve as a channel region, and the first oxide semiconductor film serves as a gate insulating film.

Since the constituent elements of the first oxide semiconductor film, the second oxide semiconductor film, and the third oxide semiconductor film are the same, the first oxide semiconductor film has fewer trap levels at the interface with the second oxide semiconductor film. Therefore, when the oxide semiconductor film 20 has the above structure, the amount of change in the threshold voltage of the transistor due to a change over time or a BT photostress test can be reduced.

In an oxide semiconductor, the s orbital of heavy metal mainly contributes to carrier transfer, and when the In content in the oxide semiconductor is increased, overlap of the s orbitals is likely to be increased. Therefore, an oxide containing In and Ga at a proportion of In>Ga has higher mobility than an oxide containing In and Ga at a proportion of In≤Ga. Further, in Ga, the formation energy of an oxygen vacancy is larger and thus an oxygen vacancy is less likely to occur, than in In; therefore, the oxide containing In and Ga at a proportion of In≤Ga has more stable characteristics than the oxide containing In and Ga at a proportion of In>Ga.

An oxide semiconductor containing In and Ga at a proportion of In>Ga is used on the channel side, and an oxide semiconductor containing In and Ga at a proportion of In≤Ga is used on the back channel side; so that field-effect mobility and reliability of the transistor can be further improved.

Further, the first oxide semiconductor film, the second oxide semiconductor film, and the third oxide semiconductor film may be formed using oxide semiconductors having different crystallinity. That is, the oxide semiconductor film 20 may be formed using any of a single crystal oxide semiconductor, a polycrystalline oxide semiconductor, a microcrystalline oxide semiconductor, an amorphous oxide semiconductor, and a CAAC-OS, as appropriate. When an amorphous oxide semiconductor is applied to any of the first oxide semiconductor film, the second oxide semiconductor film, and the third oxide semiconductor film, internal stress or external stress of the oxide semiconductor film 20 is relieved, change in characteristics of the transistor is reduced, and reliability of the transistor can be further improved.

The thickness of the oxide semiconductor film 20 is preferably greater than or equal to 1 nm and less than or equal to 100 nm, more preferably greater than or equal to 1 nm and less than or equal to 50 nm, still more preferably greater than or equal to 1 nm and less than or equal to 30 nm, further preferably greater than or equal to 3 nm and less than or equal to 20 nm.

The concentration of alkali metals or alkaline earth metals in the oxide semiconductor film 20 is preferably lower than or equal to $1\times10^{18}$ atoms/cm$^3$, more preferably lower than or equal to $2\times10^{16}$ atoms/cm$^3$. This is because, when alkali metals or alkaline earth metals are bonded to an oxide semiconductor, some of the alkali metals or the alkaline earth metals generate carriers and cause an increase in the off-state current of the transistor.

The oxide semiconductor film 20 may contain nitrogen at a concentration lower than or equal to $5\times10^{18}$ atoms/cm$^3$.

The pair of electrodes 21 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. A single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; and a three-layer structure in which a molybdenum film or a molybdenum nitride film, an aluminum film or a copper film, and a molybdenum film or a molybdenum nitride film are stacked in this order can be given as examples. Note that a transparent conductive material containing indium oxide, tin oxide, or zinc oxide may be used.

Next, a method for manufacturing the transistor 50 illustrated in FIGS. 1A to 1D is described with reference to FIGS. 2A to 2D.

Figure 2A:
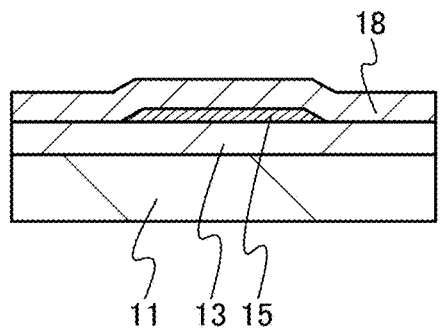
FIGS. 2A to 2D are cross-sectional views illustrating one embodiment of a method for manufacturing a transistor.

As illustrated in FIG. 2A, the base insulating film 13 and the gate electrode 15 are formed over the substrate 11, and the gate insulating film 18 is formed over the gate electrode 15.

The base insulating film 13 is formed by a sputtering method, a CVD method or the like. Here, a 100-nm-thick silicon oxynitride film is formed by a CVD method.

A formation method of the gate electrode 15 is described below. First, a conductive film is formed by a sputtering method, a CVD method, an evaporation method, or the like and then a mask is formed over the conductive film by a photolithography process. Then, part of the conductive film is etched using the mask to form the gate electrode 15. After that, the mask is removed.

Note that instead of the above formation method, the gate electrode 15 may be formed by an electrolytic plating method, a printing method, an ink-jet method, or the like.

Here, a 100-nm-thick tungsten film is formed by a sputtering method. Then, a mask is formed by a photolithography process and the tungsten film is dry-etched using the mask to form the gate electrode 15.

The gate insulating film 18 is formed by a sputtering method, a CVD method, an evaporation method, or the like.

In the case where the gate insulating film 18 is formed using a silicon oxide film, a silicon oxynitride film, or a silicon nitride oxide film, a deposition gas containing silicon and an oxidizing gas are preferred to be used as a source gas. As typical examples of the deposition gas containing silicon, silane, disilane, and trisilane can be cited. As the oxidizing gas, oxygen, ozone, dinitrogen monoxide, nitrogen dioxide, and the like can be given as examples.

In the case where a silicon nitride film is formed as the gate insulating film 18, it is preferred to use a two-step formation method. First, a first silicon nitride film with few defects is formed by a plasma CVD method in which a mixed gas of silane, nitrogen, and ammonia is used as a source gas. Then, a second silicon nitride film in which the hydrogen concentration is low and hydrogen can be blocked is formed by switching the source gas to a mixed gas of silane and nitrogen. With such a formation method, a silicon nitride film having few defects and a blocking property against hydrogen can be formed as the gate insulating film 18.

Moreover, in the case where a gallium oxide film is formed as the gate insulating film 18, a metal organic chemical vapor deposition (MOCVD) method can be used.

Figure 2B:
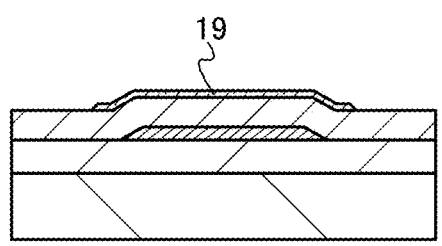

Next, as illustrated in FIG. 2B, an oxide semiconductor film 19 is formed over the gate insulating film 18.

A formation method of the oxide semiconductor film 19 is described below. An oxide semiconductor film is formed over the gate insulating film 18 by a sputtering method, a coating method, a pulsed laser deposition method, a laser ablation method, or the like. Then, after a mask is formed over the oxide semiconductor film by a photolithography process, the oxide semiconductor film is partly etched using the mask. Accordingly, the oxide semiconductor film 19 which is over the gate insulating film 18 and subjected to element isolation so as to partly overlap with the gate electrode 15 is formed as illustrated in FIG. 2B. After that, the mask is removed.

A CAAC-OS film is formed by, for example, a sputtering method using a polycrystalline oxide semiconductor sputtering target. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining their crystal state, whereby the CAAC-OS film can be deposited.

For the deposition of the CAAC-OS film, the following conditions are preferred to be used.

By reducing the amount of impurities entering the CAAC-OS film during the deposition, the crystal state can be prevented from being broken by the impurities. For example, reducing the concentration of impurities (e.g., hydrogen, water, carbon dioxide, and nitrogen) which exist in the deposition chamber is favorable. Furthermore, the concentration of impurities in a deposition gas can be reduced. Specifically, a deposition gas whose dew point is lower than or equal to −80° C., preferably lower than or equal to −100° C., can be used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferred that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Alternatively, by using a printing method for forming the oxide semiconductor film 19, the oxide semiconductor film 19 subjected to element isolation can be formed directly.

As a power supply device for generating plasma in the case where the oxide semiconductor film is formed by a sputtering method, an RF power supply device, an AC power supply device, a DC power supply device, or the like can be used as appropriate.

As a sputtering gas, an atmosphere of a rare gas (typically argon), an oxygen gas, or a mixed gas of a rare gas and oxygen is used as appropriate. In the case where the mixed atmosphere of a rare gas and oxygen is used, the proportion of oxygen is preferred to be higher than that of a rare gas.

Note that the target may be selected as appropriate depending on the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

Here, a 35-nm-thick oxide semiconductor film is formed by a sputtering method, a mask is formed over the oxide semiconductor film, and then part of the oxide semiconductor film is selectively etched. Accordingly, the oxide semiconductor film 19 is formed. After that, the mask is removed.

Figure 2C:
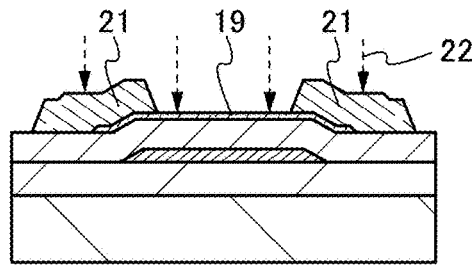

Next, as illustrated in FIG. 2C, the pair of electrodes 21 is formed.

A formation method of the pair of electrodes 21 is described below. First, a conductive film is formed by a sputtering method, a CVD method, an evaporation method, or the like. Then, a mask is formed over the conductive film by a photolithography process. After that, part of the conductive film is etched using the mask to form the pair of electrodes 21. Then, the mask is removed.

Here, a 50-nm-thick tungsten film, a 400-nm-thick aluminum film, and a 100-nm-thick titanium film are sequentially stacked by a sputtering method. Then, a mask is formed over the titanium film by a photolithography process and the tungsten film, the aluminum film, and the titanium film are dry-etched using the mask to form the pair of electrodes 21.

After the pair of electrodes 21 is formed, cleaning treatment is preferred to be performed to remove an etching residue. A short circuit of the pair of electrodes 21 can be suppressed by this cleaning treatment. The cleaning treatment can be performed using an alkaline solution such as a tetramethylammonium hydroxide (TMAH) solution; an acidic solution such as a diluted hydrofluoric acid solution, an oxalic acid solution, or a phosphoric acid solution; or water.

Figure 2D:
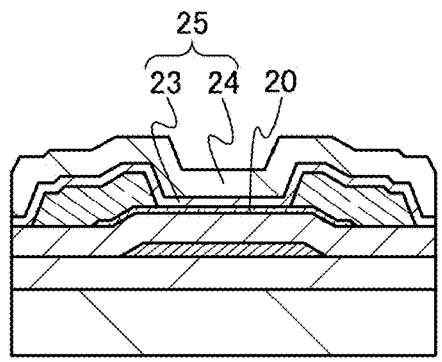

Next, the oxide semiconductor film 20 illustrated in FIG. 2D may be formed in such a manner that the oxide semiconductor film 19 is exposed to plasma generated in an oxidizing atmosphere to be supplied with oxygen 22 as illustrated in FIG. 2C. As an oxidizing atmosphere, atmospheres of oxygen, ozone, dinitrogen monoxide, nitrogen dioxide, and the like can be given as examples. Further, in the plasma treatment, the oxide semiconductor film 19 is preferred to be exposed to plasma generated with no bias applied to a lower electrode on which the substrate 11 is mounted. Consequently, the oxide semiconductor film 19 can be supplied with oxygen without being damaged; accordingly, the amount of oxygen vacancies in the oxide semiconductor film 20 can be reduced.

Here, the oxide semiconductor film 20 is formed by exposing the oxide semiconductor film 19 to oxygen plasma which is generated in such a manner that dinitrogen monoxide is introduced into a treatment chamber of a plasma CVD apparatus, and an upper electrode provided in the treatment chamber is supplied with high-frequency power of 150 W with the use of a 27.12 MHz high-frequency power source.

The surface of the oxide semiconductor film 19 is exposed to plasma generated in an oxidizing atmosphere to be able to be supply oxygen to the oxide semiconductor film 19, whereby the amount of oxygen vacancies in the oxide semiconductor film can be reduced. Moreover, impurities remaining on the surface of the oxide semiconductor film 19 due to the etching treatment, for example, a halogen such as fluorine or chlorine, can be removed.

Next, the insulating film 23 is formed over the oxide semiconductor film 20 and the pair of electrodes 21. Then, the insulating film 24 is formed over the insulating film 23. At this time, the insulating film 23 is formed without exposure to the atmosphere after the oxide semiconductor film 20 is formed by the above plasma treatment, whereby the concentration of impurities at the interface between the oxide semiconductor film 20 and the insulating film 23 can be reduced.

Further, it is preferred to form the insulating film 24 without exposure to the atmosphere, directly after the insulating film 23 is formed. After the insulating film 23 is formed, the insulating film 24 is formed directly by adjusting at least one of the flow rate of the source gas, the pressure, the high-frequency power, and the substrate temperature without exposure to the atmosphere, whereby the concentration of impurities attributed to the atmosphere at the interface between the insulating film 23 and the insulating film 24 can be reduced and further oxygen contained in the insulating film 24 can be diffused into the oxide semiconductor film 20; accordingly, the amount of oxygen vacancies in the oxide semiconductor film 20 can be reduced.

As the insulating film 23, a silicon oxide film or a silicon oxynitride film is formed under the following conditions: the substrate placed in a treatment chamber of the plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 30 Pa and less than or equal to 250 Pa, preferably greater than or equal to 40 Pa and less than or equal to 250 Pa, more preferably greater than or equal to 100 Pa and less than or equal to 250 Pa with introduction of a source gas into the treatment chamber, and high-frequency power is supplied to an electrode provided in the treatment chamber.

A deposition gas containing silicon and an oxidizing gas are preferred to be used as the source gas of the insulating film 23. As typical examples of the deposition gas containing silicon, silane, disilane, and trisilane can be cited. As the oxidizing gas, oxygen, ozone, dinitrogen monoxide, nitrogen dioxide, and the like can be given as examples.

Under the above conditions, the oxide insulating film into which and from which oxygen is diffused can be formed as the insulating film 23. With the insulating film 23, damage to the oxide semiconductor film 20 can be reduced during a later formation process of the insulating film 24. Further, when the pressure in the treatment chamber, which is one of the film formation conditions of the insulating film 23, is greater than or equal to 100 Pa and less than or equal to 250 Pa, damage to the oxide semiconductor film 20 can be reduced.

Note that when the ratio of the amount of the oxidizing gas to the amount of the deposition gas containing silicon is 100 or higher, the hydrogen content in the insulating film 23 can be reduced. Consequently, the amount of hydrogen entering the oxide semiconductor film 20 can be reduced; thus, the negative shift in the threshold voltage of the transistor can be suppressed.

Further, as the insulating film 23, a silicon oxide film or a silicon oxynitride film can be formed under the following conditions: the substrate placed in a treatment chamber of the plasma CVD apparatus, which is vacuum-evacuated, is held at a temperature higher than or equal to 300° C. and lower than or equal to 400° C., preferably higher than or equal to 320° C. and lower than or equal to 370° C., the pressure is greater than or equal to 100 Pa and less than or equal to 250 Pa, preferably greater than or equal to 100 Pa and less than or equal to 200 Pa with introduction of the source gas into the treatment chamber, and high-frequency power is supplied to an electrode provided in the treatment chamber.

Under the above film formation conditions, the bonding strength of silicon and oxygen becomes strong in the above substrate temperature range. Consequently, as the insulating film 23, a dense and hard oxide insulating film into which and from which oxygen is diffused, typically, a silicon oxide film or a silicon oxynitride film having an etching rate lower than or equal to 10 nm/min, preferably lower than or equal to 8 nm/min when etching is performed at 25° C. with 0.5 weight % of hydrofluoric acid can be formed.

Here, as the insulating film 23, a 10-nm-thick silicon oxynitride film is formed by a plasma CVD method under the following conditions: silane with a flow rate of 20 sccm and dinitrogen monoxide with a flow rate of 3000 sccm are used as the source gas, the pressure in the treatment chamber is 200 Pa, the substrate temperature is 220° C., and the high-frequency power of 100 W is supplied to an upper electrode of parallel plate electrodes with the use of a 27.12 MHz high-frequency power source. Under the above conditions, a silicon oxynitride film into which and from which oxygen is diffused can be formed.

As the insulating film 24, a silicon oxide film or a silicon oxynitride film is formed under the following conditions: the substrate placed in a treatment chamber of the plasma CVD apparatus, which is vacuum-evacuated, is held at a temperature higher than or equal to 180° C. and lower than or equal to 260° C., preferably higher than or equal to 180° C. and lower than or equal to 250° C., more preferably higher than or equal to 180° C. and lower than or equal to 230° C., the pressure is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.26 W/cm$^2$ and lower than or equal to 0.35 W/cm$^2$, more preferably higher than or equal to 0.25 W/cm$^2$ and lower than or equal to 0.40 W/cm$^2$ is supplied to an electrode provided in the treatment chamber.

As the film formation conditions of the insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content of the insulating film 24 becomes higher than that in the stoichiometric composition. However, the bonding strength of silicon and oxygen is weak in the above substrate temperature range; therefore, part of oxygen is released by heating. Thus, it is possible to form an oxide insulating film which contains oxygen at a higher proportion than the stoichiometric composition and from which part of oxygen is released by heating. Moreover, the insulating film 23 is provided over the oxide semiconductor film 20. Accordingly, in the process for forming the insulating film 24, the insulating film 23 serves as a protective film of the oxide semiconductor film 20. Consequently, the insulating film 24 can be formed using the high-frequency power having a high power density while damage to the oxide semiconductor film 20 is reduced.

Here, as the insulating film 24, a 400-nm-thick silicon oxynitride film is formed by a plasma CVD method under the following conditions: silane with a flow rate of 160 sccm and dinitrogen monoxide with a flow rate of 4000 sccm are used as the source gas, the pressure in the treatment chamber is 200 Pa, the substrate temperature is 220° C., and the high-frequency power of 1500 W is supplied to an upper electrode of parallel plate electrodes with the use of a 27.12

MHz high-frequency power source. Note that the plasma CVD apparatus used in this embodiment is a parallel plate plasma CVD apparatus in which the electrode area is 6000 cm$^2$, and the power per unit area (power density) into which the supplied power is converted is 0.25 W/cm$^2$.

As described in this embodiment, the surface of the oxide semiconductor film 19 is exposed to plasma generated in an oxidizing atmosphere to be able to supply oxygen to the oxide semiconductor film 19, whereby the amount of oxygen vacancies in the oxide semiconductor film can be reduced. Moreover, impurities remaining on the surface of the oxide semiconductor film 19 due to the etching treatment, for example, a halogen such as fluorine or chlorine can be removed. Further, when the substrate is carried out from the treatment chamber, impurities contained in the atmosphere, for example, boron is attached to the surface of the oxide semiconductor film. However, in the plasma CVD apparatus, after the surface of the oxide semiconductor film 19 is exposed to plasma generated in an oxidizing atmosphere, the insulating film 23 is formed in succession by introducing the source gas of the insulating film 23 into the treatment chamber and adjusting the pressure, the high-frequency power, and the substrate temperature without exposure to the atmosphere, whereby the concentration of impurities at the interface between the oxide semiconductor film 20 and the insulating film 23 can be reduced. Consequently, change in electrical characteristics of the transistor can be reduced. Further, after the insulating film 23 is formed, the insulating film 24 is formed in succession by adjusting the flow rate of the source gas, the pressure, the high-frequency power, and the substrate temperature without exposure to the atmosphere, whereby the concentration of impurities at the interface between the insulating film 23 and the insulating film 24 can be reduced.

Next, heat treatment is performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

An electric furnace, an RTA apparatus, or the like can be used for the heat treatment. With the use of the RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is less than or equal to 20 ppm, preferably less than or equal to 1 ppm, more preferably less than or equal to 10 ppb), or a rare gas (e.g., argon or helium). The atmosphere of nitrogen, oxygen, ultra-dry air, or a rare gas is preferred not to contain hydrogen, water, and the like.

Here, the heat treatment is performed at 250° C. under a mixed atmosphere of nitrogen and oxygen for one hour.

The heat treatment is performed, whereby oxygen contained in the insulating film 24 is diffused into the oxide semiconductor film 20 to compensate oxygen vacancies in the oxide semiconductor film 20. Thus, the amount of oxygen vacancies in the oxide semiconductor film 20 can be reduced.

Note that when the temperature in the heat treatment is higher than the film formation temperature of the insulating film 23, more oxygen contained in the insulating film 23 can be diffused into the oxide semiconductor film 20; thus, oxygen vacancies in the oxide semiconductor film 20 can be compensated more. The temperature of the heat treatment at this time can be higher than or equal to 250° C. and lower than the strain point of the substrate, preferably higher than or equal to 250° C. and lower than or equal to 450° C., more preferably higher than or equal to 300° C. and lower than or equal to 450° C.

Through the above process, a transistor having excellent electrical characteristics in which the negative shift in the threshold voltage can be suppressed can be manufactured. Moreover, a highly reliable transistor having the following electrical characteristics can be manufactured: the amount of change in electrical characteristics due to change over time or a BT photostress test is small, typically the threshold voltage does not change or changes in a positive direction, and the amount of change is less than or equal to 3.0 V, preferably less than or equal to 2.5 V.

Note that the structures, methods, and the like described in this embodiment can be used as appropriate in combination with any of the structures, methods, and the like described in the other embodiments and examples.

Embodiment 2

In this embodiment, a structure and a method for manufacturing a transistor whose gate insulating film is different from that of the transistor shown in Embodiment 1 will be described with reference to FIGS. 1A to 1C and FIG. 3.

As the gate insulating film 18 illustrated in FIGS. 1A to 1C, in a transistor of this embodiment, a dense and hard oxide insulating film into which and from which oxygen is diffused, typically, a silicon oxide film or a silicon oxynitride film having an etching rate lower than or equal to 10 nm/min, preferably lower than or equal to 8 nm/min when etching is performed at 25° C. with 0.5 weight % of hydrofluoric acid is formed.

Note that in the case where the dense and hard oxide insulating film into which and from which oxygen is diffused is formed as the gate insulating film 18, a silicon oxide film or a silicon oxynitride film is formed under the following conditions in a manner similar to that of the insulating film 23 of Embodiment 1: the substrate placed in a treatment chamber of a plasma CVD apparatus, which is vacuum-evacuated, is held at a temperature higher than or equal to 180° C. and lower than or equal to 400° C., preferably higher than or equal to 300° C. and lower than or equal to 400° C., more preferably higher than or equal to 320° C. and lower than or equal to 370° C., the pressure is greater than or equal to 30 Pa and less than or equal to 250 Pa, preferably greater than or equal to 40 Pa and less than or equal to 250 Pa with introduction of a source gas into the treatment chamber, and high-frequency power is supplied to an electrode provided in the treatment chamber.

Note that when the ratio of the amount of the oxidizing gas to the amount of the deposition gas containing silicon is 100 or higher, the hydrogen content in the gate insulating film 18 can be reduced. Consequently, the amount of hydrogen entering the oxide semiconductor film 20 can be reduced; thus, the negative shift in the threshold voltage of the transistor can be suppressed.

Under the film formation conditions of the gate insulating film 18, the bonding strength of silicon and oxygen becomes strong in the above substrate temperature range. Consequently, the dense and hard oxide insulating film can be formed as the gate insulating film 18. Moreover, when the film formation pressure is made lower than the above range, the amount of defects, typically, dangling bonds of silicon in the gate insulating film 18 can be reduced. Consequently, a transistor in which the amount of change in threshold voltage is small and whose electrical characteristics are excellent can be manufactured.

Here, as the gate insulating film 18, a 100-nm-thick silicon oxynitride film is formed by a plasma CVD method under the following conditions: silane with a flow rate of 20 sccm and dinitrogen monoxide with a flow rate of 3000 sccm are used as the source gas, the pressure in the treatment chamber is 40 Pa, the substrate temperature is 350° C., and the high-frequency power of 100 W is supplied to an upper electrode of parallel plate electrodes with the use of a 27.12 MHz high-frequency power source. Under the above conditions, a dense and hard silicon oxynitride film into which and from which oxygen is diffused can be formed.

A transistor in which negative shift in the threshold voltage is suppressed and whose electrical characteristics are excellent can be manufactured in such a manner that the other components of the transistor are formed by using structures and formation methods similar to those of the transistor 50 illustrated in FIGS. 1A to 1C. Moreover, a highly reliable transistor having the following electrical characteristics can be manufactured: the amount of change in electrical characteristics due to change over time or a BT photostress test is small, typically the threshold voltage does not change or changes in a positive direction, and the amount of change is less than or equal to 3.0 V, preferably less than or equal to 2.5 V.

Figure 3:
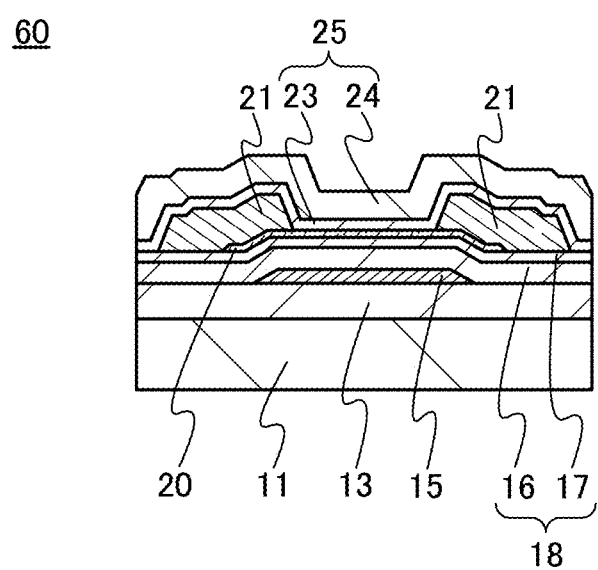
FIG. 3 is a cross-sectional view illustrating one embodiment of a transistor.

Further, as in a transistor 60 illustrated in FIG. 3, the gate insulating film 18 may have a two-layer structure of an insulating film 16 in contact with the gate electrode 15 and an insulating film 17 which is formed over the insulating film 16 and is in contact with the oxide semiconductor film 20.

In that case, the insulating film 16 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film. Further, it is possible to prevent outward diffusion of oxygen from the oxide semiconductor film 20 and entry of oxygen into the oxide semiconductor film 20 from the outside by providing an insulating film having a blocking effect against oxygen, hydrogen, water, and the like as the insulating film 16. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The insulating film 16 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

As the insulating film 17, an oxide insulating film into which and from which oxygen is diffused can be used in a manner similar to that of the insulating film 23 of Embodiment 1. Alternatively, a dense and hard oxide insulating film into which and from which oxygen is diffused, typically, a silicon oxide film or a silicon oxynitride film having an etching rate lower than or equal to 10 nm/min, preferably lower than or equal to 8 nm/min, and lower than an etching rate of the insulating film 24 when etching is performed at 25° C. with 0.5 weight % of hydrofluoric acid can be formed.

The thickness of each of the insulating films 16 and 17 is greater than or equal to 5 nm and less than or equal to 400 nm. Note that the thicknesses of the insulating film 16 and the insulating film 17 may be determined so that the sum of the thicknesses of the two insulating films is within the range of the thickness of the gate insulating film 18 of the transistor 50 illustrated in FIGS. 1A to 1C.

The gate insulating film 18 is formed here to have a large thickness and is preferred to have a stacked-layer structure of a silicon nitride film with resistivity higher than or equal to $5 \times 10^{13}$ Ω·cm and lower than or equal to $1 \times 10^{15}$ Ω·cm and a silicon oxynitride film, whereby in a transistor formed later, electrostatic breakdown caused between the gate electrode 15 and the oxide semiconductor film 20 or between the gate electrode 15 and the pair of electrodes 21 can be suppressed.

Here, as the insulating film 16, a 50-nm-thick silicon nitride film is formed by a plasma CVD method under the following conditions: silane with a flow rate of 50 sccm and nitrogen with a flow rate of 5000 sccm are used as a source gas, the pressure in a treatment chamber is 60 Pa, the substrate temperature is 350° C., and the high-frequency power of 1500 W is supplied to an upper electrode of parallel plate electrodes.

Here, as the insulating film 17, a 200-nm-thick silicon oxide film is formed by a plasma CVD method under the following conditions: silane with a flow rate of 20 sccm and dinitrogen monoxide with a flow rate of 3000 sccm are used as a source gas, the pressure in a treatment chamber is 40 Pa, the substrate temperature is 350° C., and the high-frequency power of 100 W is supplied to an upper electrode of parallel plate electrodes. Under the above conditions, a dense and hard silicon oxide film into which and from which oxygen is diffused can be formed.

Through the above process, a transistor in which negative shift in the threshold voltage is suppressed and whose electrical characteristics are excellent can be manufactured in such a manner that a gate insulating film is partly or entirely formed by using a dense and hard oxide insulating film into which and from which oxygen is diffused. Moreover, a highly reliable transistor having the following electrical characteristics can be manufactured: the amount of change in electrical characteristics due to change over time or a BT photostress test is small, typically the threshold voltage does not change or changes in a positive direction, and the amount of change is less than or equal to 3.0 V, preferably less than or equal to 2.5 V.

Embodiment 3

In this embodiment, a transistor having a structure different from that of Embodiment 1 and Embodiment 2 will be described with reference to FIG. 4. A transistor 70 of this embodiment includes a plurality of gate electrodes facing each other with an oxide semiconductor film provided therebetween.

Figure 4:
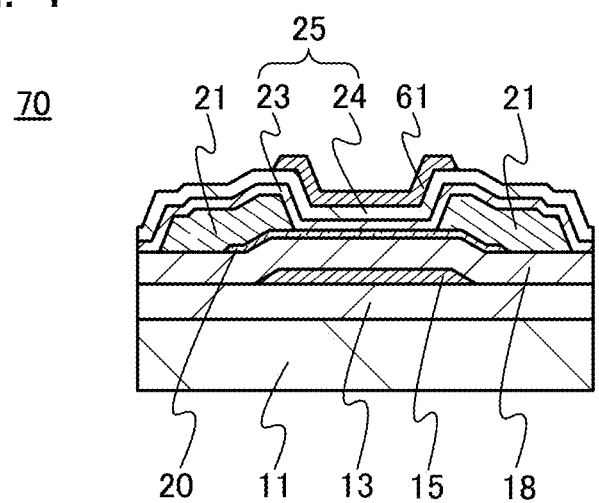
FIG. 4 is a cross-sectional view illustrating one embodiment of a transistor.

A transistor 70 illustrated in FIG. 4 includes the base insulating film 13 over the substrate 11 and the gate electrode 15 over the base insulating film 13. Moreover, the gate insulating film 18 over the base insulating film 13 and the gate electrode 15, the oxide semiconductor film 20 overlapping with the gate electrode 15 with the gate insulating film 18 provided therebetween, and the pair of electrodes 21 in contact with the oxide semiconductor film 20 are included. The protective film 25 including the insulating film 23 and the insulating film 24 is over the gate insulating film 18, the oxide semiconductor film 20, and the pair of electrodes 21.

Further, a gate electrode 61 overlapping with the oxide semiconductor film 20 with the protective insulating film 25 provided therebetween is included.

The gate electrode 61 can be formed in a manner similar to that of the gate electrode 15 of Embodiment 1.

The transistor 70 of this embodiment has the gate electrode 15 and the gate electrode 61 facing each other with the oxide semiconductor film 20 provided therebetween. By application of different potentials to the gate electrode 15 and the gate electrode 61, the threshold voltage of the transistor 70 can be controlled, in a preferable manner, the negative shift in the threshold voltage can be suppressed. Moreover, the oxide semiconductor film 20 whose surface is exposed to plasma generated in an oxidizing atmosphere and the insulating film 23 which is formed in succession after the plasma treatment are included, whereby impurities between the oxide semiconductor film 20 and the gate electrode 61 can be reduced, and change in the threshold voltage of the transistor 70 can be reduced. Further, with the use of the oxide semiconductor film 20 in which the amount of oxygen vacancies is reduced, the negative shift in the threshold voltage of the transistor 70 can be suppressed. Further, the transistor 70 has the following excellent electrical characteristics: the amount of change in the threshold voltage due to change over time or a BT photostress test is small, typically the threshold voltage does not change or changes in a positive direction, and the amount of change is less than or equal to 3.0 V, preferably less than or equal to 2.5 V.

Embodiment 4

In this embodiment, a method for manufacturing a transistor in which the concentration of hydrogen in an oxide semiconductor film is reduced will be described. Such a transistor is any of the transistors described in Embodiments 1 to 3. Note that at least one of steps described in this embodiment may be combined with the process of manufacturing the transistor described in any of Embodiments 1 to 3; it is not necessary to combine all steps therewith.

The concentration of hydrogen in the oxide semiconductor film 20 of Embodiment 1 is preferably lower than $5\times10^{19}$ atoms/cm$^3$, more preferably lower than $5\times10^{18}$ atoms/cm$^3$, still more preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

Hydrogen contained in the oxide semiconductor film 20 reacts with oxygen bonded to a metal atom to produce water, and a defect is formed in a lattice from which oxygen is released (or a portion from which oxygen is removed). In addition, a bond of hydrogen and oxygen causes generation of electrons serving as carriers. Thus, the impurities containing hydrogen are reduced as much as possible in the formation process of the oxide semiconductor film, whereby the concentration of hydrogen in the oxide semiconductor film can be reduced. Therefore, when a channel region is formed in an oxide semiconductor film that is highly purified by removing hydrogen as much as possible, the negative shift in the threshold voltage can be reduced and leakage current between a source electrode and a drain electrode of a transistor, typically, the off-state current per channel width can be reduced to several yA/μm to several zA/μm; thus, electrical characteristics of the transistor can be improved.

As a first method for reducing the concentration of hydrogen in the oxide semiconductor film 20, there is a method in which hydrogen or water contained in the substrate 11, the base insulating film 13, the gate electrode 15, and the gate insulating film 18 is released by heat treatment or plasma treatment before the oxide semiconductor film 20 is formed. This method allows hydrogen or water attached to the substrate 11, the base insulating film 13, the gate electrode 15, and the gate insulating film 18 to be prevented from diffusing into the oxide semiconductor film 20 in later heat treatment. The heat treatment is performed at a temperature higher than or equal to 100° C. and lower than the strain point of the substrate under an inert atmosphere, a reduced-pressure atmosphere, or a dry air atmosphere. Further, for the plasma treatment, rare gas, oxygen, nitrogen, or nitrogen oxide (e.g., nitrous oxide, nitrogen monoxide, or nitrogen dioxide) is used.

As a second method for reducing the concentration of hydrogen in the oxide semiconductor film 20, there is a method in which before the oxide semiconductor film is formed by a sputtering apparatus, a dummy substrate is put into the sputtering apparatus, and an oxide semiconductor film is formed over the dummy substrate, so that hydrogen, water, or the like attached to the target surface or a deposition shield are removed. This method allows reduction of entry of hydrogen, water, or the like into the oxide semiconductor film.

As a third method for reducing the concentration of hydrogen in the oxide semiconductor film 20, for example, in the case where a sputtering method is employed in the formation of the oxide semiconductor film, there is a method in which the substrate temperature is set to higher than or equal to 150° C. and lower than or equal to 750° C., preferably higher than or equal to 150° C. and lower than or equal to 450° C., further preferably higher than or equal to 200° C. and lower than or equal to 350° C. and the oxide semiconductor film is formed. By this method, entry of hydrogen, water, or the like into the oxide semiconductor film can be reduced.

Here, a sputtering apparatus which can reduce the concentration of hydrogen in the oxide semiconductor film 20 is described in detail below.

The leakage rate of a treatment chamber in which the oxide semiconductor film is formed is preferred to be lower than or equal to $1\times10^{-10}$ Pa·m$^3$/sec., whereby entry of impurities such as hydrogen or water into the film formed by a sputtering method can be reduced.

Evacuation of a treatment chamber in a sputtering apparatus is preferred to be performed with a rough vacuum pump such as a dry pump and a high vacuum pump such as a sputter ion pump, a turbo molecular pump, or a cryopump in appropriate combination. The turbo molecular pump has an outstanding capability in evacuating a large-sized molecule, whereas it has a low capability in evacuating hydrogen and water. Further, a combination with a sputter ion pump having a high capability in evacuating hydrogen or a cryopump having a high capability in evacuating water is effective.

An adsorbate present at the inner wall of the treatment chamber does not affect the pressure in the treatment chamber because it is adsorbed on the inner wall, but the adsorbate leads to release of a gas at the time of the evacuation of the treatment chamber. Therefore, although the leakage rate and the evacuation rate do not have a correlation, it is important that the adsorbate present in the treatment chamber be desorbed as much as possible and evacuation be performed in advance with the use of a pump having high evacuation capability. Note that the treatment chamber may be subjected to baking for promotion of desorption of the adsorbate. By the baking, the rate of desorption of the adsorbate can be increased about tenfold.

The baking should be performed at a temperature higher than or equal to 100° C. and lower than or equal to 450° C. At this time, when the adsorbate is removed while an inert gas is introduced, the rate of desorption of water or the like, which is difficult to be desorbed only by evacuation, can be further increased.

As described above, in the process for forming the oxide semiconductor film, entry of impurities is suppressed as much as possible through control of the pressure in the treatment chamber, leakage rate of the treatment chamber, and the like, whereby entry of hydrogen, water, or the like into the oxide semiconductor film can be reduced.

As a fourth method for reducing the concentration of hydrogen in the oxide semiconductor film 20, there is a method in which a high-purity gas which is a source gas from which impurities containing hydrogen are removed is used. This method allows reduction of entry of hydrogen, water, or the like into the oxide semiconductor film.

As a fifth method for reducing the concentration of hydrogen in the oxide semiconductor film 20, there is a method in which the oxide semiconductor film is formed and is then subjected to heat treatment. By the heat treatment, the oxide semiconductor film can be dehydrated or dehydrogenated.

The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under atmosphere of an inert gas including nitrogen or a rare gas such as helium, neon, argon, xenon, or krypton. Alternatively, the heat treatment may be performed under an atmosphere of an inert gas first, and then under an oxygen atmosphere. It is preferred that the above atmosphere of an inert gas and oxygen atmosphere do not contain hydrogen, water, and the like. The treatment time is 3 minutes to 24 hours.

Note that as illustrated in FIG. 2B, the oxide semiconductor film 20 that is subjected to element isolation is formed and then the heat treatment for dehydration or dehydrogenation may be performed. Through the above process, hydrogen, water, or the like contained in the gate insulating film 18 can be efficiently released in the heat treatment for dehydration or dehydrogenation.

The heat treatment for dehydration or dehydrogenation may be performed more than once, and may also serve as another heat treatment.

As the fifth method for reducing the concentration of hydrogen in the oxide semiconductor film 20, the substrate is preferred to be heated in a heating chamber of a plasma CVD apparatus before the oxide semiconductor film 19 is exposed to plasma in an oxidizing atmosphere illustrated in FIG. 2C of Embodiment 3. After the heat treatment, the oxide semiconductor film 19 is exposed to plasma in an oxidizing atmosphere of the treatment chamber of the plasma CVD apparatus in succession without exposure to the atmosphere and further the insulating film 23 is formed in succession without exposure to the atmosphere, whereby the amount of impurities such as boron at the interface between the oxide semiconductor film 20 and the insulating film 23 can be reduced while impurities such as hydrogen and water are released from the oxide semiconductor film 20.

By combination of at least one of the first to fifth methods for reducing the concentration of hydrogen in the oxide semiconductor film and any of the methods for manufacturing a transistor, which are described in Embodiments 1 to 3, a transistor whose channel region is formed in an oxide semiconductor film which is highly purified by removing hydrogen, water, or the like as much as possible can be manufactured. Thus, the negative shift in the threshold voltage can be reduced and leakage current between a source electrode and a drain electrode of a transistor, typically, the off-state current per channel width can be reduced to several yA/μm to several zA/μm; thus, electrical characteristics of the transistor can be improved. From the above, according to this embodiment, a transistor in which the negative shift in the threshold voltage is reduced and the leakage current is reduced, and whose electrical characteristics are excellent can be manufactured.

Embodiment 5

A semiconductor device (also referred to as a display device) having a display function can be manufactured using the transistor examples of which are shown in the above embodiments. Moreover, some or all of the driver circuits which include the transistor can be formed over a substrate where the pixel portion is formed, whereby a system-on-panel can be obtained. In this embodiment, an example of a display device using the transistor examples of which are shown in the above embodiments is described with reference to FIGS. 5A to 5C and FIGS. 6A and 6B. FIGS. 6A and 6B are cross-sectional views illustrating cross-sectional structures taken along chain line M-N in FIG. 5B.

Figure 5A:
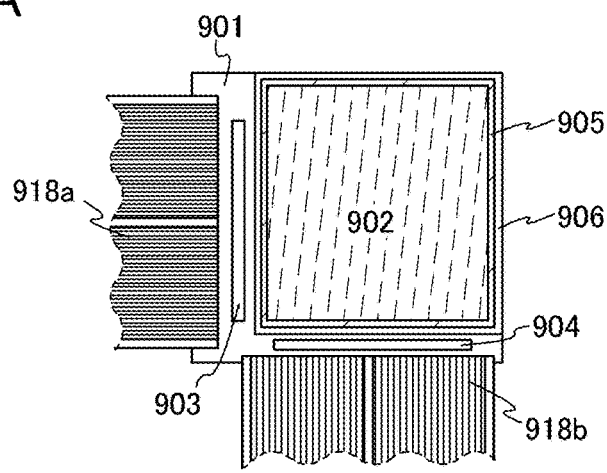
FIGS. 5A to 5C are each a cross-sectional view illustrating one embodiment of a display device.
Figure 6A:
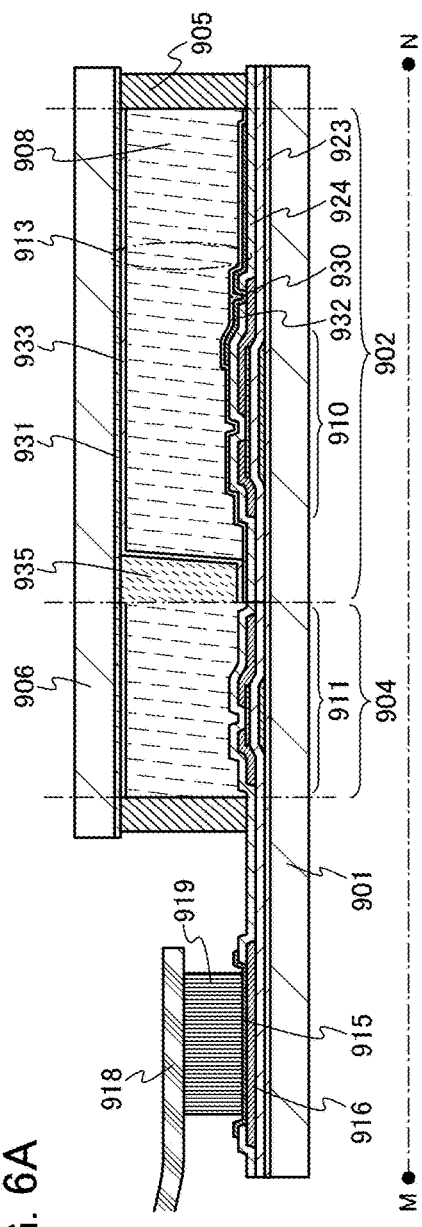
FIGS. 6A and 6B are cross-sectional views each illustrating one embodiment of a display device.
Figure 6B:
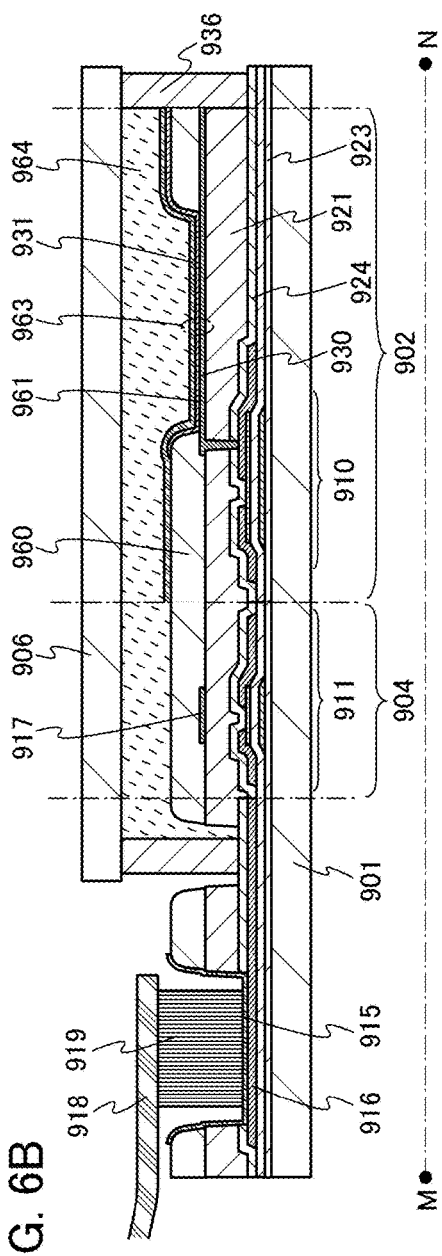

In FIG. 5A, a sealant 905 is provided so as to surround a pixel portion 902 provided over a first substrate 901, and the pixel portion 902 is sealed with a second substrate 906. In FIG. 5A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

Figure 5B:
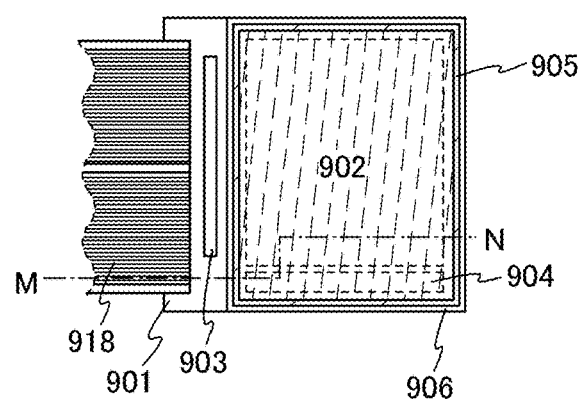
Figure 5C:
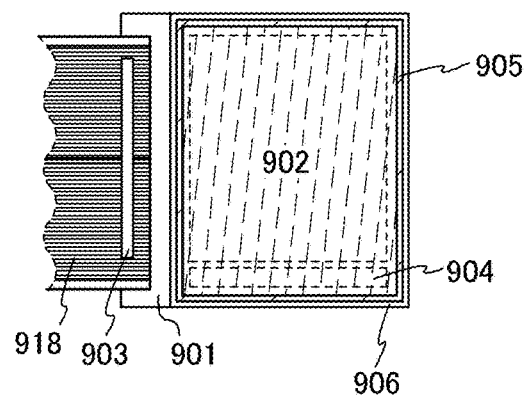

In FIGS. 5B and 5C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 5B and 5C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 5B and 5C, various signals and potentials are supplied to the signal line driver circuit 903 which is separately formed, the scan line driver circuit 904, and the pixel portion 902 from an FPC 918.

Although FIGS. 5B and 5C each show an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 5A shows an example in which the signal line driver circuit 903 and the scan line driver circuit 904 are mounted by a COG method. FIG. 5B shows an example in which the signal line driver circuit 903 is mounted by a COG method. FIG. 5C shows an example in which the signal line driver circuit 903 is mounted by a TAB method.

The display device includes in its category a panel in which a display element is sealed and a module in which an IC including a controller or the like is mounted on the panel.

A display device in this specification refers to an image display device, a display device, or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be used.

As the display element provided in the display device, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used.

As illustrated in FIGS. 6A and 6B, the semiconductor device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a pair of electrodes in each of a transistor 910 and a transistor 911.

Each of the pixel portion 902 and the scan line driver circuit 904 which are provided over the first substrate 901 includes a plurality of transistors. FIGS. 6A and 6B illustrate the transistor 910 included in the pixel portion 902 and the transistor 911 included in the scan line driver circuit 904. In FIG. 6A, the protective film 25 described in any of Embodiments 1 to 3 or an insulating film 924 corresponding to a stacked film of the protective film 25 and a silicon nitride film is provided over the transistor 910 and the transistor 911. In FIG. 6B, a planarization film 921 is further provided over the insulating film 924. Note that an insulating film 923 serves as a base film.

In this embodiment, any of the transistors described in the above embodiments can be used as the transistor 910 and the transistor 911.

Moreover, FIG. 6B shows an example in which a conductive film 917 is provided over the insulating film 924 so as to overlap with a channel region of the oxide semiconductor film of the transistor 911 for the driver circuit. In this embodiment, the conductive film 917 is formed using the same conductive film as the first electrode 930. By providing the conductive film 917 so as to overlap with the channel region of the oxide semiconductor film, the amount of change in the threshold voltage of the transistor 911 between before and after a BT stress test can be further reduced. The conductive film 917 may have the same potential as or a potential different from that of the gate electrode of the transistor 911, and the conductive film 917 can serve as a second gate electrode. The potential of the conductive film 917 may be GND, 0 V or in a floating state.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent change in electrical characteristics of the transistor due to the influence of an external electric field such as static electricity. The conductive film 917 can be used for any of the transistors described in the above embodiments.

In the display panel, the transistor 910 included in the pixel portion 902 is electrically connected to a display element. There is no particular limitation on the kind of the display element as long as display can be performed, and various kinds of display elements can be used.

An example of a liquid crystal display device using a liquid crystal element as the display element is shown in FIG. 6A. In FIG. 6A, a liquid crystal element 913 which is a display element includes the first electrode 930, a second electrode 931, and a liquid crystal layer 908. Note that an insulating film 932 and an insulating film 933 which serve as alignment films are provided so that the liquid crystal layer 908 is provided therebetween. The second electrode 931 is provided on the second substrate 906 side. The second electrode 931 overlaps with the first electrode 930 with the liquid crystal layer 908 provided therebetween.

The first electrode 930 and the second electrode 931 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the first electrode 930 and the second electrode 931 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

The first electrode 930 and the second electrode 931 can be formed using a conductive composition including a conductive macromolecule (also referred to as a conductive polymer). The conductive macromolecule, known as a π-electron conjugated conductive macromolecule, can be used. Polyaniline or a derivative thereof, polypyrrole or a derivative thereof, polythiophene or a derivative thereof, a copolymer of two or more of aniline, pyrrole, and thiophene or a derivative thereof can be given as examples.

A spacer 935 is a columnar spacer obtained by selective etching of an insulating film and is provided in order to control the distance between the first electrode 930 and the second electrode 931 (a cell gap). Alternatively, a spherical spacer may be used.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used for the liquid crystal layer in order to improve the temperature range. The liquid crystal composition which includes a liquid crystal showing a blue phase and a chiral agent has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, the productivity of the liquid crystal display device can be increased.

The first substrate 901 and the second substrate 906 are fixed in place by the sealant 905. As the sealant 905, an organic resin such as a thermosetting resin or a photocurable resin can be used.

The amount of change in the threshold voltage of any of the transistor including an oxide semiconductor film used in the above embodiments is small. Moreover, such a transistor can operate at a high speed because a relatively high field-effect mobility can be obtained. Thus, when the above transistor is used in a pixel portion of a semiconductor device having a display function, high-quality images can be obtained. Since a driver circuit portion and the pixel portion can be formed separately over one substrate, the number of components of the semiconductor device can be reduced.

The size of storage capacitor formed in the liquid crystal display device is set considering the leakage current of the transistor provided in the pixel portion or the like so that charge can be held for a predetermined period. By using the transistor including the highly-purified oxide semiconductor film, it is enough to provide a storage capacitor having a capacitance that is $\frac{1}{3}$ or less, preferably $\frac{1}{5}$ or less of a liquid crystal capacitance of each pixel; therefore, the aperture ratio of a pixel can be increased.

In the display device, a black matrix (a light-blocking film), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be used. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. The present invention is not limited to the application to a display device for color display but can also be applied to a display device for monochrome display.

Here, a structure of a periphery portion of the liquid crystal display device is described with reference to FIGS. 7A and 7B, FIGS. 8A and 8B, and FIGS. 9A and 9B.

In the liquid crystal display device, a liquid crystal element can be an element in which a liquid crystal is provided between a counter electrode and a pixel electrode electrically connected to a switching element. In many cases, the counter electrodes have the same potential in the entire pixel portion. Therefore, the counter electrode is also referred to as a connection terminal or a common electrode. Note that the potential of the counter electrode is controlled by a peripheral circuit such as a driver circuit. The potential of the counter electrode is adjusted in accordance with a potential of a signal line which is actually applied to the pixel electrode. When the potential of the signal line which is actually applied to the pixel electrode is changed, a defect might occur in a display screen; therefore, the potential of the counter electrode is preferred to be optimized so as to correspond to the center of potential amplitude of the pixel electrode. Next, a liquid crystal display device including a first counter electrode provided in a driver circuit portion (a scan line driver circuit and a signal line driver circuit) and a second counter electrode provided in a pixel portion, which can be supplied with different potentials, is described.

Figure 7A:
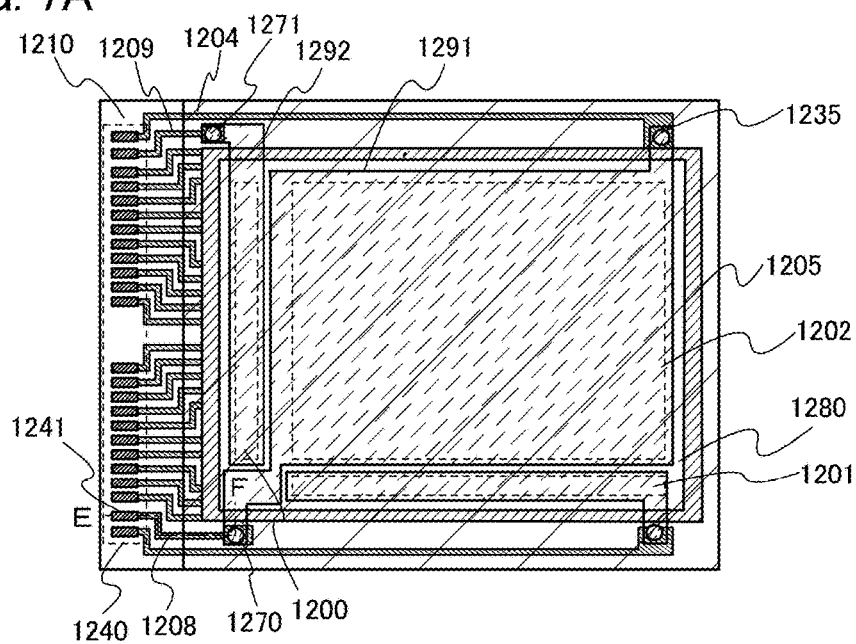
FIGS. 7A and 7B are a top view and a cross-sectional view illustrating one embodiment of a display device.
Figure 7B:
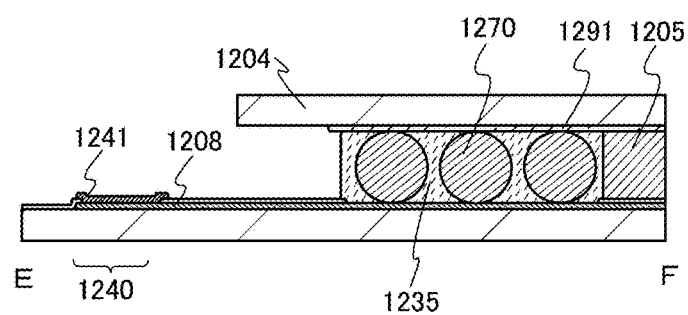

FIG. 7A is a top view of the liquid crystal display device. The top view of FIG. 7A illustrates any of the display devices illustrated in FIGS. 5A to 5C in which an FPC has not been attached to a first substrate 1210. FIG. 7B is a cross-sectional view taken along chain line E-F of FIG. 7A, which illustrates a connection region of a conductive particle and a connection wiring.

In the liquid crystal display device, the first substrate 1210 which is provided with pixel electrodes each electrically connected to a switching element, and a second substrate 1204 provided with a first counter electrode 1291 and a second counter electrode 1292 are attached to each other with a sealant 1205, and the interior space surrounded by the sealant 1205 is filled with a liquid crystal 1280. A signal line driver circuit 1200, a scan line driver circuit 1201, and a pixel portion 1202 in which the pixel electrodes are formed in a matrix form are provided over the first substrate 1210.

The second counter electrode 1292 provided over the driver circuit portion has a potential which is different from that of the first counter electrode 1291. Different potentials can be supplied to the first counter electrode 1291 provided in the pixel portion 1202 and the second counter electrode 1292 provided in the driver circuit portion.

A potential difference (voltage) is applied to the pixel electrode through the switching element. Therefore, there is a possibility that the voltage applied to the pixel electrode is smaller by the voltage which is actually applied to a wiring connected to the switching element several volts, which is several volts. Thus, it is preferred that a potential difference (voltage) applied to the first counter electrode 1291 be set in consideration of the difference.

The second counter electrode 1292 provided in the driver circuit portion has a flat shape and may be processed into a pattern having an opening. By processing the second counter electrode 1292 into the pattern having an opening, parasitic capacitance formed between the second counter electrode 1292 and a conductive film included in a transistor provided in the driver circuit portion can be reduced. Accordingly, low power consumption of the liquid crystal display device can be achieved.

In this specification, a pattern having an opening (a slit) of the second counter electrode 1292 in the driver circuit portion includes patterns which are partly opened, such as a bend portion and a branching comb-like portion as well as a pattern which is opened in a closed space.

Further, a terminal portion 1240 is formed in an edge portion of the first substrate 1210. FIG. 7B shows an example of a cross-sectional structure of the terminal portion 1240.

FIG. 7B is a cross-sectional view of a region where an upper wiring and a lower wiring are electrically connected to each other with conductive particles 1270 contained in a resin layer 1235. A connection wiring 1208 is formed over the first substrate 1210. A connection terminal 1241 which is formed at the same time as the pixel electrode is formed over the connection wiring 1208. The connection terminal 1241 is electrically connected to the first counter electrode 1291 through the connection wiring 1208 and the conductive particles 1270. Further, the connection terminal 1241 is connected to an FPC (not illustrated). Note that in FIG. 7B, the conductive particles 1270 are fixed by the resin layer 1235. The resin layer 1235 can be formed using an organic resin or a fitted glass like that used for the sealant 1205.

As the conductive particle 1270, a conductive particle in which an insulating sphere is covered with a thin metal film can be used. The insulating sphere is formed using silica glass, hard resin, or the like. The thin metal film can be formed to have a single-layer structure or a stacked-layer structure using one or more of gold, silver, palladium, nickel, indium tin oxide, and indium zinc oxide. For example, as each metal thin film, a gold thin film, a stack of a nickel thin film and a gold thin film, or the like can be used. By using the conductive particle 1270 in which the insulating sphere is contained at the center, elasticity can be improved so that destruction due to external pressure can be reduced.

The space around the conductive particles 1270 may be provided with a conductive resin layer formed with a conductive polymer instead of an insulating resin layer. As typical examples of the conductive polymer, conductive polyaniline, conductive polypyrrole, conductive polythiophene, a complex of polyethylenedioxythiophene (PEDOT) and poly(styrenesulfonic acid) (PSS), and the like can be cited. That is, when the conductive polymer is in contact with the counter electrode or the connection wiring, the conductive particle 1270 and the conductive polymer are in contact with the counter electrode and the connection wiring, so that connection resistance between the counter electrode and the connection wiring can be reduced.

Note that the connection wiring 1208 and the first counter electrode 1291 formed on the second substrate 1204 are electrically connected to each other through the conductive particles 1270. Further, a connection wiring 1209 and the second counter electrode 1292 formed on the second substrate 1204 are electrically connected to each other through a conductive particle 1271 (see FIG. 7A). The connection wiring 1209 and the connection wiring 1208 have different potentials.

Here, cross-sectional views of a common connection portion (also referred to as a common contact portion) for electrically connecting the counter electrodes (the first counter electrode 1291 and the second counter electrode 1292) provided on the second substrate 1204 to the terminal portion 1240 and top views of the common connection portion are shown in FIGS. 8A and 8B and FIGS. 9A and 9B. Note that an example in which the common connection portion is formed over the first substrate 1210 is shown. In FIGS. 8A and 8B and FIGS. 9A and 9B, a transistor 1211 included in the pixel portion 1202 is formed over the first substrate 1210, in addition to the common connection portion. The common connection portion is formed through the same process as the transistor 1211 of the pixel portion 1202, whereby the common connection portion can be formed without complicating the process. Moreover, over the first substrate 1210, not only the pixel portion 1202 but also a driver circuit (the scan line driver circuit 1201) may be formed in addition to the common connection portion, or the common connection portion may be formed through the same process as the transistors 910 and 911 included in the driver circuit (the scan line driver circuit 1201) (see FIG. 6A).

In this embodiment, the common connection portion is provided in a position which does not overlap with the sealant (except for the pixel portion) and a paste including conductive particles is provided separately from the sealant so as to overlap with the common connection portion, whereby the common connection portion can be electrically connected to the counter electrodes. Note that the common connection portion is provided in a position overlapping with the sealant 1205 for bonding the first substrate 1210 and the second substrate 1204 and may be electrically connected to the counter electrodes through the conductive particles 1270 contained in the sealant 1205.

Figure 8A:
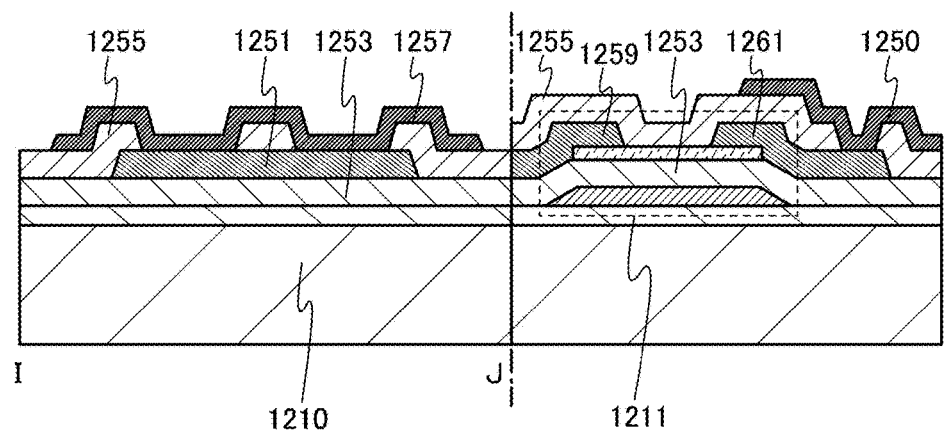
FIGS. 8A and 8B are a cross-sectional view and a top view illustrating a common connection portion of a display device.
Figure 8B:
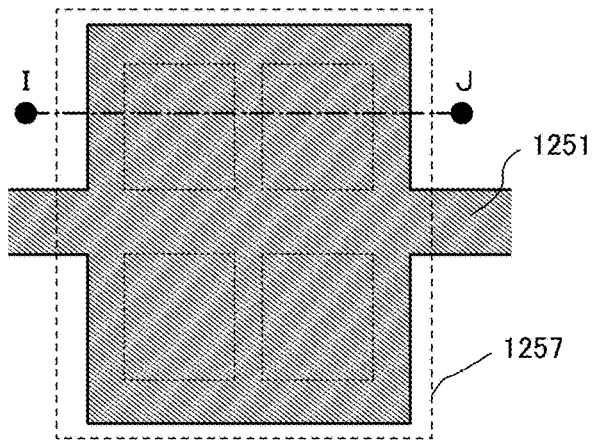

In FIGS. 8A and 8B, a common connection portion in which a connection wiring 1251 is formed with a wiring formed using the same material and through the same process as a wiring (gate wiring) processed into a gate electrode is illustrated.

In FIG. 8A, the transistor 1211 which is electrically connected to a pixel electrode 1250 is a channel-etched transistor. Any of the transistors described in the above embodiments can be used as appropriate as the transistor 1211.

FIG. 8B shows an example of the top view of the common connection portion, and chain line I-J in FIG. 8B corresponds to a cross section of the common connection portion of FIG. 8A. Note that in FIG. 8B, portions the same as those in FIG. 8A are denoted by the same reference numerals. Here, the connection terminal 1241 is not illustrated in a hatching pattern but indicated by a broken line in order to avoid complexity of the drawing.

The connection wiring 1251 is provided over a gate insulating film 1253 and is formed using the same material and through the same process as a source electrode 1259 and a drain electrode 1261 of the transistor 1211.

The connection wiring 1251 is covered with a protective film 1255. The protective film 1255 has a plurality of openings in positions overlapping with the connection wiring 1251. These openings are formed through the same process as a contact hole that connects the drain electrode 1261 of the transistor 1211 and the pixel electrode 1250.

Note that the contact hole in the pixel portion and the openings in the common connection portion are distinctively described because their sizes differ considerably. In FIG. 8A, the pixel portion 1202 and the common connection portion are not illustrated on the same scale. For example, the length of the chain line I-J in the common connection portion is about 500 μm, whereas the size of the transistor of the pixel portion 1202 is less than 50 μm; thus, the area of the common connection portion is ten times or more as large as that of the transistor. However, the scales of the pixel portion 1202 and the common connection portion are changed in FIG. 8A for simplification.

Moreover, the connection terminal 1241 is provided over the protective film 1255 and is formed using the same material and through the same process as the pixel electrode 1250 in the pixel portion 1202.

In this manner, the common connection portion is manufactured through the same process as the transistor 1211 in the pixel portion 1202. The connection wiring 1251 is preferred to have a structure with which wiring resistance as a metal wiring can be reduced.

Then, the first substrate 1210 provided with the pixel portion 1202 and the common connection portion is fixed to the second substrate 1204 provided with the counter electrodes with the sealant 1205.

Note that the connection terminal 1241 is electrically connected to the counter electrodes on the second substrate 1204 through the conductive particles 1270 illustrated in FIG. 7B.

Figure 9A:
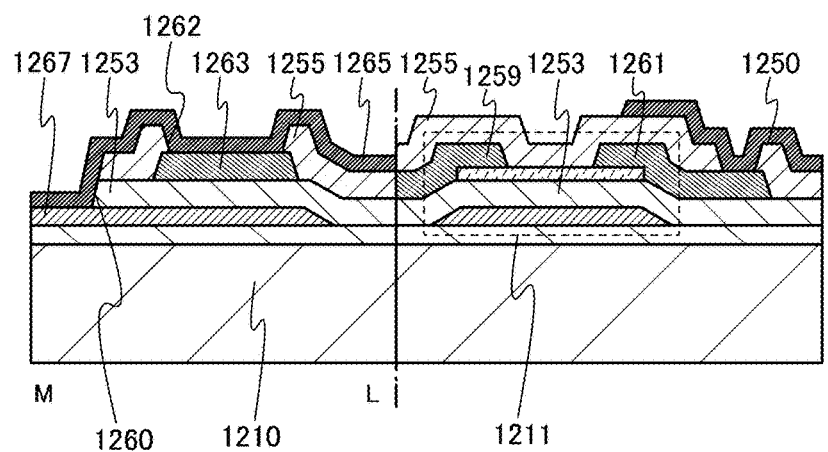
FIGS. 9A and 9B are a cross-sectional view and a top view illustrating a common connection portion of a display device.
Figure 9B:
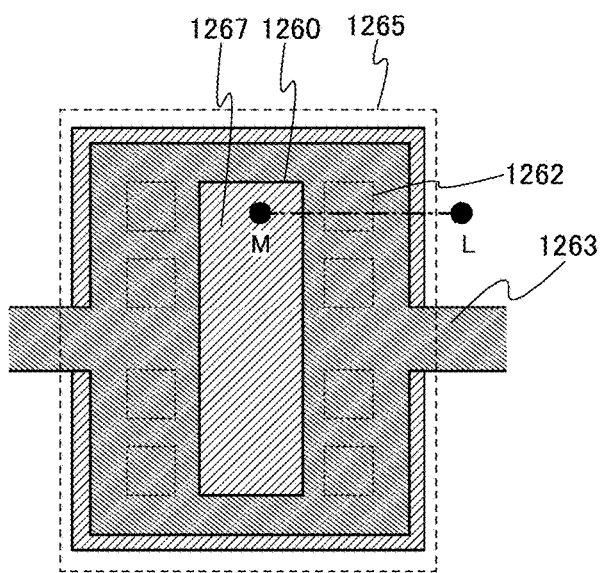

Next, a common connection portion whose structure is partly different from that of the common connection portion illustrated in FIGS. 8A and 8B will be described with reference to FIGS. 9A and 9B. In FIGS. 9A and 9B, a common connection portion in which a connection electrode 1267 formed using the same material and through the same process as a gate wiring is provided, and in which a wiring formed using the same material and through the same process as the source electrode 1259 and the drain electrode 1261 (a source wiring and a drain wiring) is provided as a connection wiring 1263 connected to the connection electrode 1267 will be illustrated in FIGS. 9A and 9B.

FIG. 9B shows an example of the top view of the common connection portion, and chain line L-M in FIG. 9B corresponds to a cross section of the common connection portion of FIG. 9A. Here, a connection terminal 1265 is not illustrated in a hatching pattern but indicated by a broken line in order to avoid complexity of the drawing.

The connection electrode 1267 is provided over the first substrate 1210 and is formed using the same material and through the same process as the gate electrode of the transistor 1211.

The connection electrode 1267 is covered with the gate insulating film 1253 and the protective film 1255. The gate insulating film 1253 and the protective film 1255 have an opening 1260 at a position overlapping with the connection electrode 1267. Note that this opening 1260 is formed by etching through the same process as the contact hole that connects the drain electrode 1261 and the pixel electrode 1250, and then further by etching the gate insulating film 1253 selectively.

A connection wiring 1263 is provided over the gate insulating film 1253 and is formed using the same material and through the same process as the source electrode 1259 and the drain electrode 1261.

The connection wiring 1263 is covered with the protective film 1255. The protective film 1255 has a plurality of openings 1262 in positions overlapping with the connection wiring 1263. These openings 1262 are formed through the same process as the contact hole that connects the drain electrode 1261 and the pixel electrode 1250.

Moreover, the connection terminal 1265 is provided over the protective film 1255 and is formed using the same material and through the same process as the pixel electrode 1250 in the pixel portion 1202.

In this manner, the common connection portion is formed through the same process as the transistor 1211 of the pixel portion 1202.

Further, in the common connection portion illustrated in FIGS. 9A and 9B, a plurality of conductive particles are selectively disposed only in the opening 1260 of the gate insulating film 1253. That is, the plurality of conductive particles are disposed in a region where the connection terminal 1265 and the connection electrode 1267 are in contact with each other. The connection terminal 1265 in contact with both the connection electrode 1267 and the connection wiring 1263 is an electrode which is in contact with the conductive particles and is electrically connected to the counter electrodes of the second substrate 1204.

Although an example of the common connection portion electrically connected to the counter electrodes is shown here, such a common connection portion can be used as a connection portion connected to another wiring or a connection portion connected to an external connection terminal or the like without being limited to the above example. Note that the structure of the common connection portion illustrated in FIGS. 8A and 8B and the structure of the common connection portion illustrated in FIGS. 9A and 9B can be combined freely.

Next, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device using a light-emitting element as the display element is shown in FIG. 6B. A light-emitting element 963 which is a display element is electrically connected to the transistor 910 provided in the pixel portion 902. Note that although the structure of the light-emitting element 963 is a stacked-layer structure of the first electrode 930, a light-emitting layer 961, and the second electrode 931, the structure is not limited thereto. The structure of the light-emitting element 963 can be changed as appropriate depending on the direction in which light is extracted from the light-emitting element 963, or the like.

A partition wall 960 can be formed using an organic insulating material or an inorganic insulating material. It is particularly preferred that the partition wall 960 be formed using a photosensitive resin material to have an opening over the first electrode 930 so that a sidewall of the opening has an inclined surface with a continuous curvature.

The light-emitting layer 961 may be formed to have a single-layer structure or a stacked-layer structure including a plurality of layers.

A protective layer may be formed over the second electrode 931 and the partition wall 960 in order to prevent oxygen, hydrogen, moisture, carbon dioxide, or the like from entering the light-emitting element 963. As the protective layer, a silicon nitride film, a silicon nitride oxide film, an aluminum oxide film, an aluminum nitride film, an aluminum oxynitride film, an aluminum nitride oxide film, a DLC film, or the like can be formed. In addition, in a space which is sealed with the first substrate 901, the second substrate 906, and a sealant 936, a filler 964 is provided and sealed. It is preferred that, in this manner, the light-emitting element be packaged (sealed) with a protective film (such as a laminate film or an ultraviolet curable resin film) or a cover material with high air-tightness and little degasification so that the panel is not exposed to the outside air.

As the sealant 936, an organic resin such as a thermosetting resin or a photocurable resin, fritted glass including low-melting glass, or the like can be used. The fritted glass is preferred because of its high barrier property against impurities such as water and oxygen. When the fitted glass is used for the sealant 936, the fritted glass is preferred to be provided over the insulating film 924 as illustrated in FIG. 6B. Since the insulating film 924 is any of the protective films 25 described in Embodiments 1 to 3 or an inorganic insulating film corresponding to a stacked film of the protective film 25 and a silicon nitride film, the insulating film 924 can have higher adhesion to the fritted glass.

As the filler 964, as well as an inert gas such as nitrogen or argon, an ultraviolet curable resin or a thermosetting resin can be used: polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

The first electrode and the second electrode (each of which are also referred to as a pixel electrode, a connection terminal, a counter electrode layer, or the like) for applying voltage to the display element can have light-transmitting properties or light-reflecting properties, which depends on the direction in which light is extracted, the position where the electrodes are provided, and the pattern structure of the electrodes.

Since the transistor is easily broken owing to static electricity or the like, a protective circuit for protecting the driver circuit is preferred to be provided. The protection circuit is preferred to be formed using a nonlinear element.

As described above, by using any of the transistors described in the above embodiments, a highly reliable semiconductor device having a display function can be provided.

This embodiment can be implemented in appropriate combination with the structures described in the other embodiments.

Embodiment 6

A semiconductor device disclosed in this specification can be applied to a variety of electronic devices (including game machines). Examples of the electronic devices include television sets (also referred to as televisions or television receivers), monitors of computers or the like, cameras such as digital cameras or digital video cameras, digital photo frames, cellular phones (also referred to as mobile phones or cellular phone sets), portable game consoles, portable information terminals, audio reproducing devices, large-sized game machines such as pachinko machines, electronic paper, and the like. The electronic paper can be used for electronic devices for displaying information in a variety of fields. For example, the electronic paper can be applied to an electronic book (e-book) reader, a poster, an advertisement in a vehicle such as a train, a digital signage, a public information display (PID), displays of various cards such as a credit card, and the like. The portable information terminal which is an example of electronic devices is described with reference to FIGS. 10A to 10C.

Figure 10A:
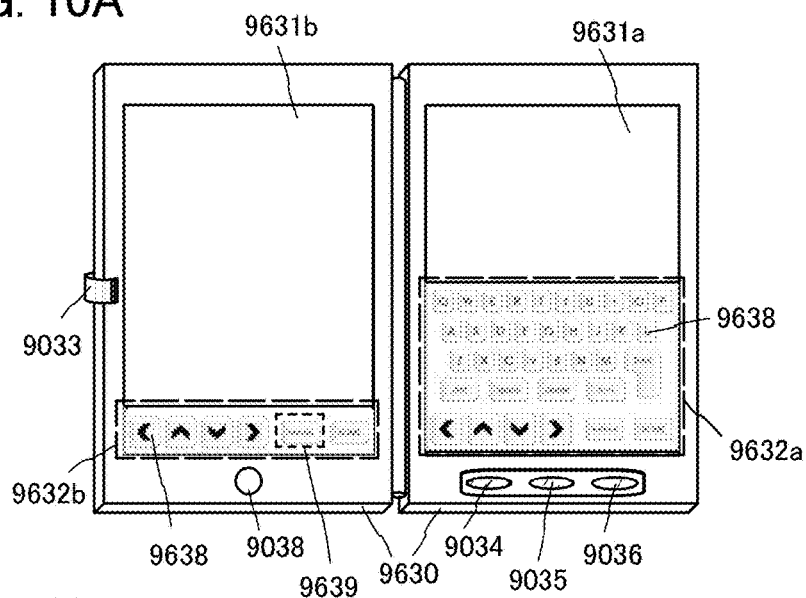
FIGS. 10A to 10C each illustrate one embodiment of an electronic device.
Figure 10B:
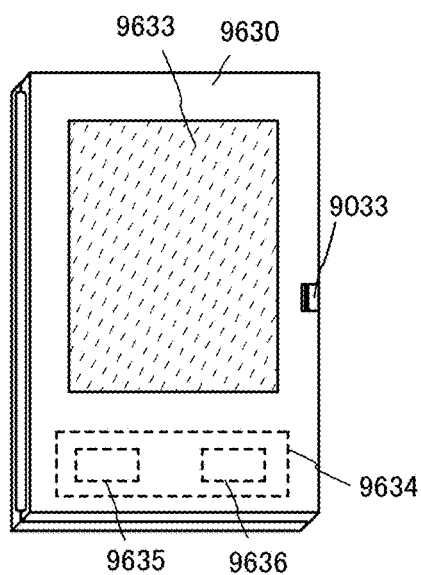

FIGS. 10A and 10B illustrate a foldable tablet terminal. FIG. 10A illustrates the tablet terminal which is unfolded. The tablet terminal includes a housing 9630, a display portion 9631a, a display portion 9631b, a display mode switch 9034, a power switch 9035, a power-saving mode switch 9036, a clasp 9033, and an operation switch 9038.

Part of the display portion 9631a can be a touch panel region 9632a, and data can be input by touching operation keys 9638 that are displayed. Although a structure in which a half region in the display portion 9631a has only a display function and the other half region has a touch panel function is shown as an example, the display portion 9631a is not limited to this structure. The whole region in the display portion 9631a may have a touch panel function. For example, the display portion 9631a can display keyboard buttons in the whole region to be a touch panel, and the display portion 9631b can be used as a display screen.

In a manner similar to that of the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between a portrait mode and a landscape mode, and between monochrome display and color display, for example. The power-saving mode switch 9036 can control display luminance to be optimal in accordance with the amount of external light in use of the tablet terminal which is detected by an optical sensor incorporated in the tablet terminal. Another detection device including a sensor for detecting inclination, such as a gyroscope or an acceleration sensor, may be incorporated in the tablet terminal, in addition to the optical sensor.

Although the display portion 9631a and the display portion 9631b have the same display area in FIG. 10A as an example, one embodiment of the present invention is not particularly limited to this example. The display portion 9631a and the display portion 9631b may have different areas or different display quality. For example, higher definition images may be displayed on one of the display portion 9631a and the display portion 9631b.

FIG. 10B illustrates the tablet terminal which is folded. The tablet terminal includes the housing 9630, a solar battery 9633, a charge and discharge control circuit 9634, a battery 9635, and a DC-DC converter 9636. As an example, FIG. 10B illustrates the charge and discharge control circuit 9634 including the battery 9635 and the DC-DC converter 9636.

Since the tablet terminal can be folded, the housing 9630 can be closed when not in use. Thus, the display portion 9631a and the display portion 9631b can be protected, which makes it possible to provide a tablet terminal with high durability and improved reliability for long-term use.

The tablet terminal illustrated in FIGS. 10A and 10B can also have a function of displaying various kinds of data (e.g., a still image, a moving image, and a text image), a function of displaying a calendar, the date, the time, or the like on the display portion, a touch-input function of operating or editing data displayed on the display portion by touch input, a function of controlling processing by various kinds of software (programs), and the like.

The solar battery 9633, which is attached on a surface of the tablet terminal, can supply electric power to a touch panel, a display portion, an image signal processor, and the like. Note that the solar battery 9633 can be provided on one or both surfaces of the housing 9630, so that the battery 9635 can be charged efficiently.

Figure 10C:
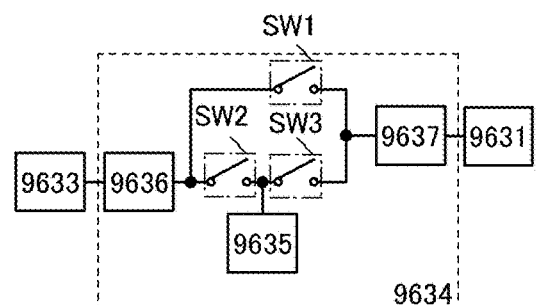

The structure and operation of the charge and discharge control circuit 9634 illustrated in FIG. 10B is described with reference to a block diagram in FIG. 10C. FIG. 10C illustrates the solar battery 9633, the battery 9635, the DC-DC converter 9636, a converter 9637, switches SW1 to SW3, and the display portion 9631. The battery 9635, the DC-DC converter 9636, the converter 9637, and the switches SW1 to SW3 correspond to the charge and discharge control circuit 9634 illustrated in FIG. 10B.

First, an example of operation in the case where power is generated by the solar battery 9633 using external light is described. The voltage of power generated by the solar battery 9633 is raised or lowered by the DC-DC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that charge of the battery 9635 may be performed.

Although the solar battery 9633 is shown as an example of a power generation means, there is no particular limitation on the power generation means and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

This embodiment can be implemented in appropriate combination with the structures described in the other embodiments.

Example 1

In this example, measurement results of a BT stress test and a BT photostress test of a transistor included in a semiconductor device of one embodiment of the present invention will be described. Specifically, the amounts of change in the threshold voltage and shift value of the transistor of one embodiment of the present invention will be described.

First of all, a manufacturing process of a transistor included in each of a sample A1, a sample A2, a sample A3, and a sample A4 is described. Description in this example is made with reference to FIGS. 2A to 2D and FIG. 3.

First, a glass substrate was used as the substrate 11, and the gate electrode 15 was formed over the substrate 11.

The gate electrode 15 was formed as follows: a 100-nm-thick tungsten film was formed by a sputtering method, a mask was formed over the tungsten film by a photolithography process, and the tungsten film was partly etched using the mask.

Next, the gate insulating film 18 including the insulating film 16 and the insulating film 17 (see FIG. 3) was formed over the gate electrode 15.

A 50-nm-thick silicon nitride film was formed as the insulating film 16, and a 200-nm-thick silicon oxynitride film was formed as the insulating film 17. The silicon nitride film was formed under the following conditions: silane with a flow rate of 50 sccm and nitrogen with a flow rate of 5000 sccm were supplied to a treatment chamber of a plasma CVD apparatus, the pressure in the treatment chamber was controlled to 60 Pa, and the power of 150 W was supplied with the use of a 27.12 MHz high-frequency power source. The silicon oxynitride film was formed under the following conditions: silane with a flow rate of 20 sccm and dinitrogen monoxide with a flow rate of 3000 sccm were supplied to a treatment chamber of the plasma CVD apparatus, the pressure in the treatment chamber was controlled to 40 Pa, and the power of 100 W was supplied with the use of a 27.12 MHz high-frequency power source. Note that each of the silicon nitride film and the silicon oxynitride film was formed at a substrate temperature of 350° C.

FIG. 2A can be referred to for the structure obtained through the steps up to here. Note that although the base insulating film 13 is illustrated in FIG. 2A, the base insulating film 13 was not formed in this example.

Next, the oxide semiconductor film 19 overlapping with the gate electrode 15 with the gate insulating film 18 provided therebetween was formed.

Here, an IGZO film which was a CAAC-OS film was formed over the gate insulating film 18 by a sputtering method, a mask is formed over the IGZO film by a photolithography process, and the IGZO film was partly etched using the mask. Then, the etched IGZO film was subjected to heat treatment, so that the oxide semiconductor film 19 was formed. In this example, a 35-nm-thick IGZO film was formed.

The IGZO film was formed under the following conditions: a sputtering target containing In, Ga, and Zn at an atomic ratio of 1:1:1 was used, argon with a flow rate of 50 sccm and oxygen with a flow rate of 50 sccm were supplied as a sputtering gas to a treatment chamber of a sputtering apparatus, the pressure in the treatment chamber was controlled to be 0.6 Pa, and the direct current power of 5 kW was supplied. Note that the IGZO film was formed at a substrate temperature of 170° C.

As the heat treatment, heat treatment at 450° C. under a nitrogen atmosphere for one hour and then heat treatment at 450° C. under a mixed atmosphere of nitrogen and oxygen for one hour were performed.

FIG. 2B can be referred to for the structure obtained through the steps up to here.

Next, the pair of electrodes 21 which was in contact with the oxide semiconductor film 19 was formed.

A conductive film was formed over the gate insulating film 18 and the oxide semiconductor film 19, a mask was formed over the conductive film by a photolithography process, and the conductive film was partly etched using the mask, so that the pair of electrodes 21 was formed. Note that as the conductive film, a 400-nm-thick aluminum film was formed over a 50-nm-thick tungsten film, and a 100-nm-thick titanium film was formed over the aluminum film.

Next, the substrate was moved to a treatment chamber filled with dinitrogen monoxide. Then, the oxide semiconductor film 20 illustrated in FIG. 2D was formed by exposing the oxide semiconductor film 19 to oxygen plasma which was generated in such a manner that an upper electrode provided in the treatment chamber was supplied with high-frequency power of 150 W with the use of a 27.12 MHz high-frequency power source.

Next, the insulating film 23 was formed in succession over the oxide semiconductor film 20 and the pair of electrodes 21 without exposure to the atmosphere after the above plasma treatment. As the insulating film 23, a silicon oxynitride film was formed by a plasma CVD method under the following conditions: silane with a flow rate of 30 sccm and dinitrogen monoxide with a flow rate of 4000 sccm were used as a source gas, the pressure in a treatment chamber was 40 Pa, the substrate temperature was 220° C., and the high-frequency power of 150 W was supplied to an upper electrode of parallel plate electrodes. A sample in which the thickness of the insulating film 23 is 20 nm is referred to as the sample A1, a sample in which the thickness of the insulating film 23 is 50 nm is referred to as the sample A2, and a sample in which the thickness of the insulating film 23 is 100 nm is referred to as the sample A3. Note that since the substrate temperature in this process is 220° C. which is relatively low, the silicon oxynitride film in some cases resulted in a silicon oxide film not containing nitrogen. Moreover since the substrate temperature in this process is 220° C. which is relatively low, the amount of released hydrogen in the film formation process is small compared with that in the film formation process at 350° C.; therefore, the silicon oxynitride film (silicon oxide film) contain hydrogen in some cases.

Next, the insulating film 24 was formed over the insulating film 23. As the insulating film 24, a 400-nm-thick silicon oxynitride film was formed by a plasma CVD method under the following conditions: silane with a flow rate of 160 sccm and dinitrogen monoxide with a flow rate of 4000 sccm were used as a source gas, the pressure in a treatment chamber was 200 Pa, the substrate temperature was 220° C., and the high-frequency power of 1500 W was supplied to an upper electrode of parallel plate electrodes. Under the above conditions, it is possible to form a silicon oxynitride film which contains oxygen at a higher proportion than the stoichiometric composition. In other words, a silicon oxynitride film from which part of oxygen is released by heating can be formed.

Next, heat treatment was performed. The heat treatment was performed at 350° C. under a mixed atmosphere of oxygen and nitrogen for one hour.

Next, an insulating film was formed over the insulating film 24. Here, a 1.5-μm-thick acrylic resin was formed as the insulating film. After that, heat treatment was performed. The heat treatment was performed at 250° C. under an atmosphere of nitrogen for one hour.

Through the above process, the transistor included in each of the samples A1 to A3 was manufactured.

Note that a sample in which insulating films are formed under the following conditions instead of the insulating film 23 and the insulating film 24 of the samples A1 to A3 is referred to as the sample A4. A formation method of the insulating film 23 and the insulating film 24 of the sample A4 is described below.

The insulating film 23 was formed in succession over the oxide semiconductor film 20 and the pair of electrodes 21 without exposure to the atmosphere after the above plasma treatment. As the insulating film 23, a 20-nm-thick silicon oxynitride film was formed by a plasma CVD method under the following conditions: silane with a flow rate of 20 sccm and dinitrogen monoxide with a flow rate of 3000 sccm were used as a source gas, the pressure in the treatment chamber was 200 Pa, the substrate temperature was 350° C., and the high-frequency power of 100 W was supplied to an upper electrode of parallel plate electrodes.

Next, the insulating film 24 was formed over the insulating film 23. As the insulating film 24, a 380-nm-thick silicon oxynitride film was formed under the conditions similar to those of the insulating film 24 of the samples A1 to A3.

The other processes were performed in a manner similar to that of the processes in the samples A1 to A3, whereby the transistor included in the sample A4 was manufactured.

A sample which was formed as follows is referred to as a sample A5: after the insulating film 24 was formed under the same conditions as the sample A2, a silicon nitride film was formed in succession without the above heat treatment at 350° C. for one hour and was then subjected to heat treatment at 350° C. under a mixed atmosphere of nitrogen and oxygen, and after that, an acrylic resin was formed over the silicon nitride film.

Further, a sample which was formed as follows is referred to as a sample A6: after the insulating film 24 was formed under the same conditions as the sample A2 and the above heat treatment at 350° C. for one hour was performed, a silicon nitride film was formed and was then subjected to heat treatment at 300° C. under a mixed atmosphere of nitrogen and oxygen, and after that, an acrylic resin was formed over the silicon nitride film.

As the silicon nitride film of each of the sample A5 and the sample A6, the 50-nm-thick silicon nitride film was formed by a plasma CVD method under the following conditions: silane with a flow rate of 50 sccm, nitrogen with a flow rate of 5000 sccm, and ammonia with a flow rate of 100 sccm were used as a source gas, the pressure in the treatment chamber was 200 Pa, the substrate temperature was 220° C., and the high-frequency power of 1000 W was supplied to an upper electrode of parallel plate electrodes.

In addition, a manufacturing process of a transistor included in a comparative sample A1 is described. The structure and the method for manufacturing the transistor included in the comparative sample A1 are similar to those of the samples A1 to A3 except that the insulating film 23 is not formed.

Next, a BT stress test and a BT photostress test were performed on each of the samples A1 to A6 and the comparative sample A1. Here, the BT stress test in which voltage was applied to the gate electrode was performed under the following conditions: the substrate temperature was 80° C., the intensity of an electric field applied to the gate insulating film was 1.28 MV/cm, and the application time was 2000 seconds.

Under conditions similar to those of the above BT stress test, the BT photostress test in which the transistor is irradiated with white LED light of 3000 lx to apply voltage to the gate electrode was performed.

Here, a measurement method of the BT stress test is described. To measure initial characteristics of the transistor subjected to the BT stress test, a change in characteristics of current flowing between the source and the drain electrode (hereinafter referred to as the drain current), that is, Vg-Id characteristics were measured under the following conditions: the substrate temperature was 25° C., the voltage between the source electrode and the drain electrode (hereinafter the drain voltage) was 1 V or 10 V, and the voltages between the source electrode and the gate electrode (hereinafter the gate voltage) was changed from −30 V to +30 V.

Next, the substrate temperature was raised to 80° C., and then, the potentials of the source electrode and the drain electrode of the transistor were set to 0 V. Then, voltage was kept being applied to the gate electrode for 2000 seconds so that the intensity of the electric field applied to the gate insulating film was 1.28 MV/cm.

Note that in a negative BT stress test, a voltage of −30 V was applied to the gate electrode, and in a positive BT stress test, a voltage of 30 V was applied to the gate electrode. In a negative BT photostress test, a voltage of −30 V was applied to the gate electrode while irradiation with white LED light of 3000 lx was performed, and in a positive BT photostress test, a voltage of 30 V was applied to the gate electrode while irradiation with white LED light of 3000 lx was performed.

Next, the substrate temperature was lowered to 25° C. while voltage was continuously applied to the gate electrode, and the source electrode and the drain electrode. After the substrate temperature was reached to 25° C., the application of voltage to the gate electrode, and the source electrode and the drain electrode was stopped.

Figure 11:
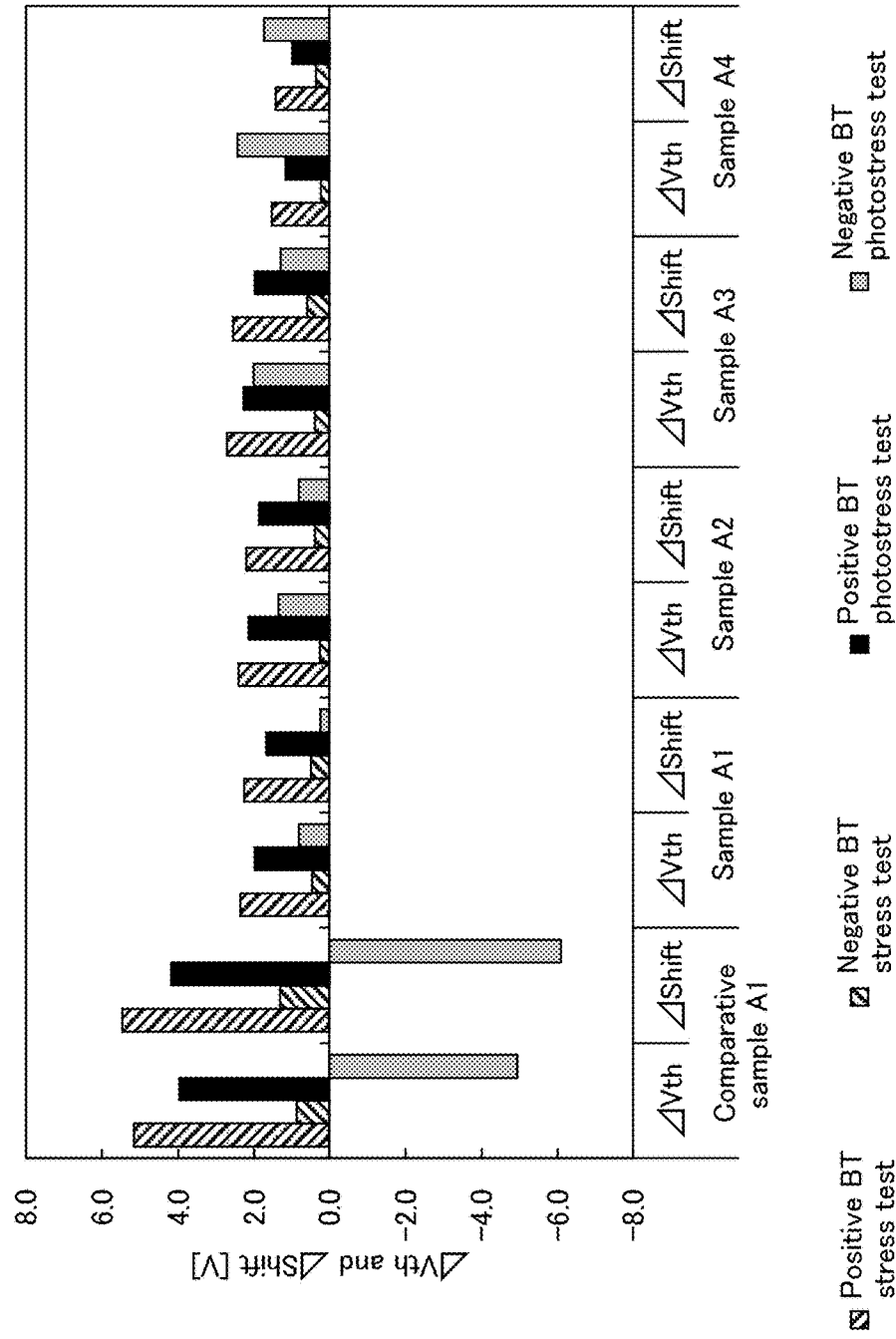
FIG. 11 shows a threshold voltage (Vth) and a shift value (Shift) of a transistor.

Next, Vg-Id characteristics were measured under the same conditions as the measurement of the initial characteristics, and Vg-Id characteristics after the BT stress test and the BT photostress test were obtained. FIG. 11 shows, in each of the samples A1 to A4 and the comparative sample A1, a difference between a threshold voltage in the initial characteristics and a threshold voltage after BT stress tests (i.e., the amount of change in threshold voltage (ΔVth)) and a difference in shift values (i.e., the amount of change in shift value (ΔShift)). FIG. 12 shows, in each of the samples A5 and A6, the amount of change in threshold voltage (ΔVth)) and the amount of change in shift value (ΔShift)). In FIG. 11 and FIG. 12, the vertical axis indicates the ΔVth and ΔShift.

Here, a threshold voltage and a shift value in this specification are described with reference to FIGS. 13A and 13B.

Figure 13A:
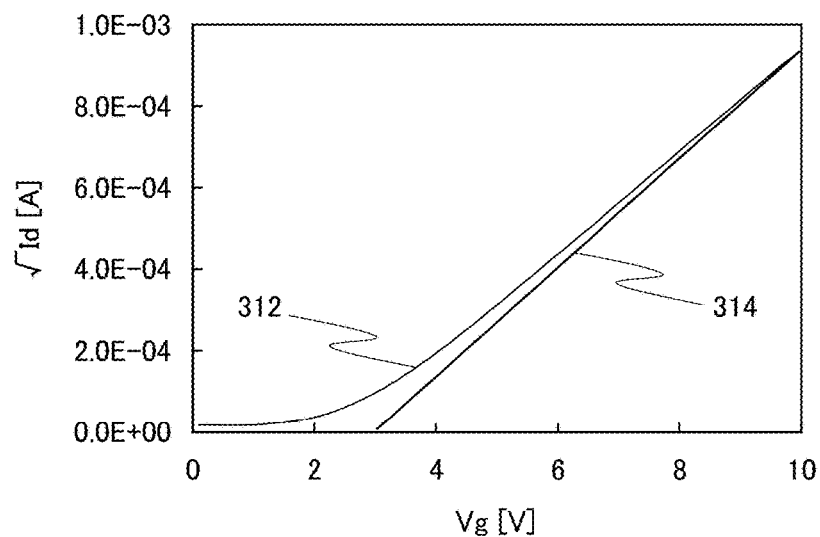
FIGS. 13A and 13B show the definition of a threshold voltage and a shift value.

In this specification, in a curve 312 where the horizontal axis indicates the gate voltage (Vg [V]) and the vertical axis indicates the square root of drain current ($Id^{1/2}$ [A]), the threshold voltage (Vth) is defined as a gate voltage at a point of intersection of an extrapolated tangent line 314 of $Id^{1/2}$ having the highest inclination with the Vg axis (i.e., $d^{1/2}$ of 0 A) (see FIG. 13A). Note that in this specification, threshold voltage is calculated with a drain voltage Vd of 10 V.

Figure 13B:
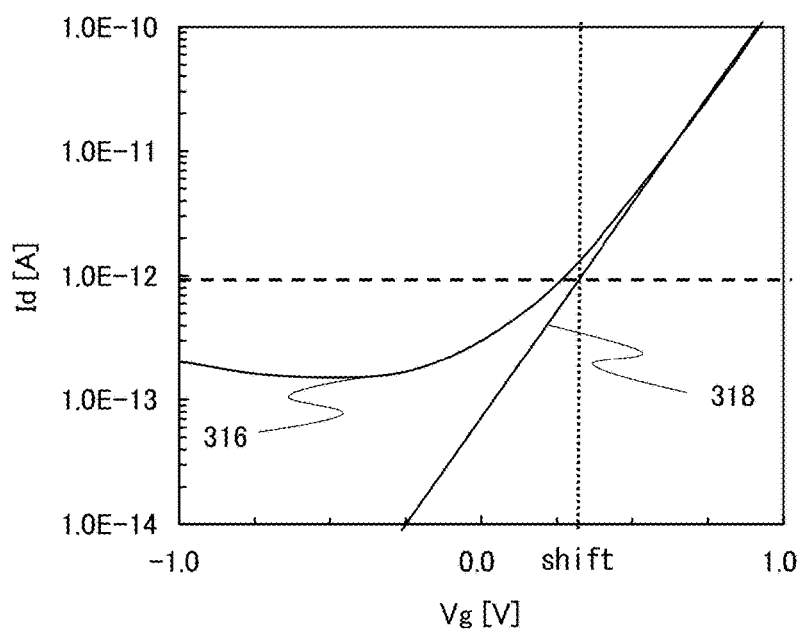

In this specification, in a curve 316 where the horizontal axis indicates the gate voltage (Vg [V]) and the vertical axis indicates the logarithm of drain current (Id [A]), the shift value (Shift) is defined as a gate voltage at a point of intersection of an extrapolated tangent line 318 of Id having the highest inclination with a straight line of $Id=1.0\times10^{-12}$ [A] (see FIG. 13B). Note that in this specification, a shift value is calculated with a drain voltage Vd of 10 V.

As shown in FIG. 11, after the negative BT photostress test in the comparative sample A1, both the threshold voltage and the shift value were shifted in the negative direction and the amount of change in threshold voltage (ΔVth) and the amount of change in shift value (ΔShift) were large. However, after the BT stress test and the BT photostress test in the samples A1 to A6, as shown in FIG. 11 and FIG. 12, both the amount of change in threshold voltage (ΔVth) and the amount of change in shift value (ΔShift) were small. Further, in the samples A1 to A6, both the threshold voltage and the shift value were shifted in the positive direction, and the amount of change in threshold voltage (ΔVth) and the amount of change in shift value (ΔShift) tended to become small, less than or equal to 3.0 V, preferably less than or equal to 2.5 V. Accordingly, it is found that, when an oxide insulating film into which and from which oxygen is diffused and an oxide insulating film which contains oxygen at a higher proportion than the stoichiometric composition are stacked as a protective film of a transistor, a transistor having small amounts of change in threshold voltage and shift value in the BT stress test and the BT photostress test can be manufactured.

Next, samples in each of which a silicon nitride film was formed over the insulating film 24 were subjected to accelerated life test to evaluate moisture resistance. Here, the accelerated life test for evaluating moisture resistance was performed using the samples A5 and A6, and as comparative samples, a comparative sample A2 and a comparative sample A3.

Here, a manufacturing process of a transistor included in each of the comparative samples A2 and A3 is described. In the transistor included in each of the comparative samples A2 and A3, instead of the silicon nitride films in the sample A5 and the sample A6, a 200-nm-thick silicon nitride film was formed by a plasma CVD method under the following conditions: silane with a flow rate of 50 sccm and nitrogen with a flow rate of 5000 sccm were used as a source gas, the pressure in a treatment chamber was 200 Pa, the substrate temperature was 220° C., and the high-frequency power of 1000 W was supplied to an upper electrode of parallel plate electrodes.

Next, a pressure cooker test (PCT) was performed as the accelerated life test to evaluate moisture resistance. In the PCT in this example, the samples A5 and A6 and the comparative samples A2 and A3 were held for 15 hours under the following conditions: the temperature was 130° C., the humidity was 85%, and the pressure was 0.23 MPa.

Figure 14A:
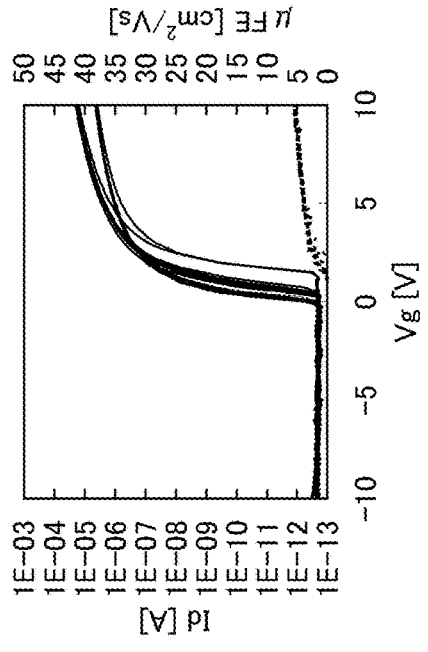
FIGS. 14A to 14D each show Vg-Id characteristics of a transistor.
Figure 14B:
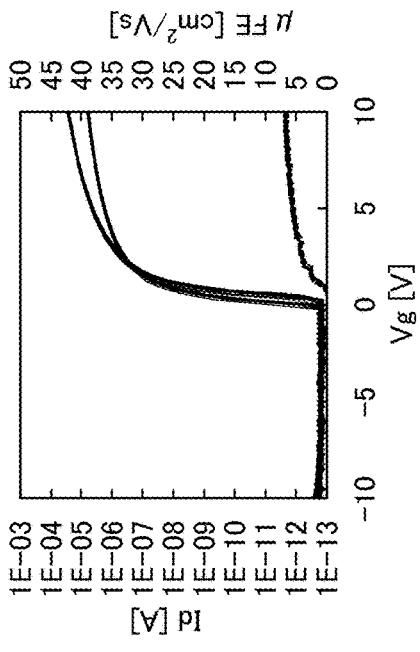
Figure 14C:
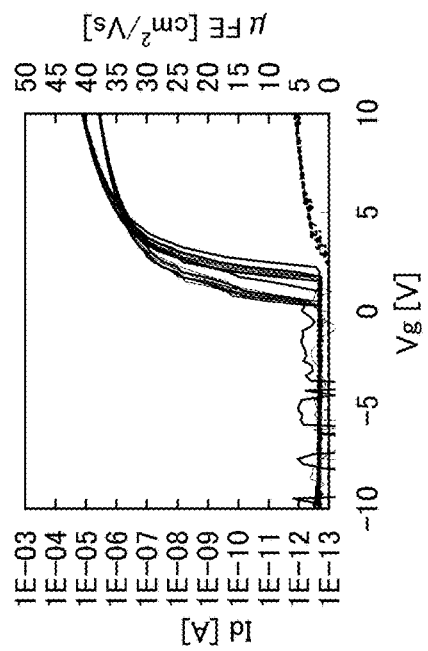
Figure 14D:
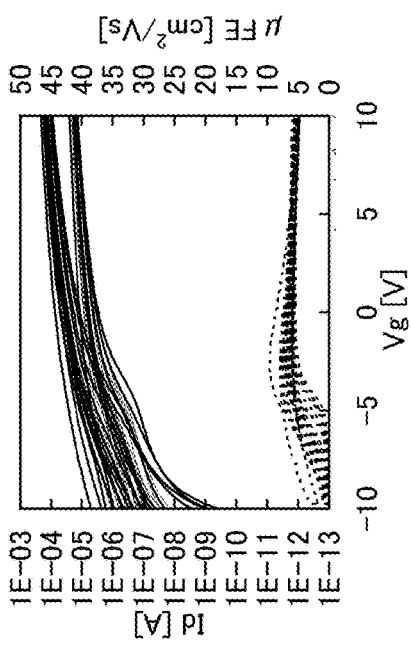

FIG. 14A shows Vg-Id initial characteristics of the transistors included in the comparative sample A2, and FIG. 14B shows Vg-Id initial characteristics of the transistors included in the sample A5. FIG. 14C shows Vg-Id initial characteristics of the transistors included in the comparative sample A2 after the pressure cooker test, and FIG. 14D shows Vg-Id initial characteristics of the transistors included in the sample A5 after the pressure cooker test.

Figure 15A:
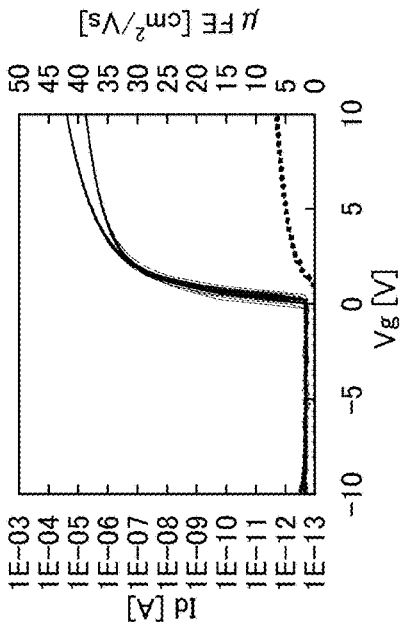
FIGS. 15A to 15D each show Vg-Id characteristics of a transistor.
Figure 15B:
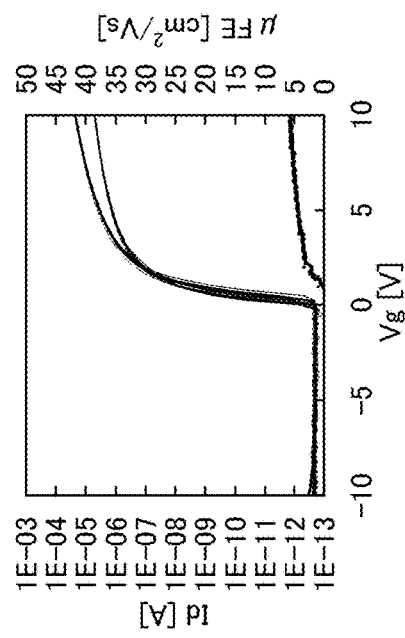
Figure 15C:
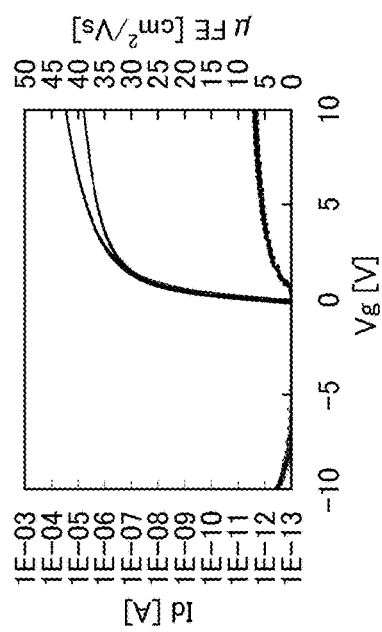
Figure 15D:
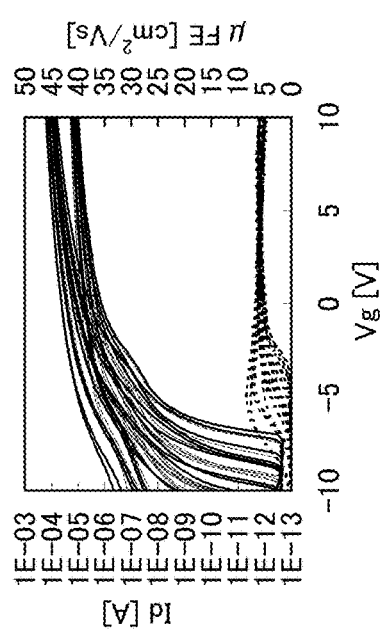

FIG. 15A shows Vg-Id initial characteristics of the transistors included in the comparative sample A3, and FIG. 15B shows Vg-Id initial characteristics of the transistors included in the sample A6. FIG. 15C shows Vg-Id initial characteristics of the transistors included in the comparative sample A3 after the pressure cooker test, and FIG. 15D shows Vg-Id initial characteristics of the transistors included in the sample A6 after the pressure cooker test.

In each of FIGS. 14A to 14D and FIGS. 15A to 15D, the horizontal axis indicates the gate voltage (Vg), the left vertical axis indicates the drain current (Id) flowing between the pair of electrodes 21, and the right vertical axis indicates the field-effect mobility (μFE). Further, the solid line indicates the initial characteristics of current-voltage characteristics at a drain voltage (Vd) of 1 V or 10V, and the dashed line indicates the field-effect mobility with respect to the gate voltage at a drain voltage of 10 V. Note that the field-effect mobility was obtained by operation of each sample in a saturation region. In each sample, electrical characteristics of 20 transistors were measured.

As shown in FIGS. 14A to 14D and FIGS. 15A to 15D, after the pressure cooker test in each of the comparative samples A2 and A3, the threshold voltage is shifted in the negative direction, whereas, after the pressure cooker test in each of the samples A5 and A6, the amount of change in threshold voltage is extremely small. Accordingly, by forming the silicon nitride film over the insulating film 24 under the above conditions, a transistor with less deterioration can be manufactured even under an environment having high humidity.

Example 2

In this example, diffusion of oxygen into and from the insulating film 23 described in Embodiment 1 will be described. In this example, the diffusion of oxygen will be described by measuring the concentration of oxygen by substrate side depth profile secondary ion mass spectrometry (SSDP-SIMS) (SIMS from the back side).

First, a method for forming a sample B1 and a sample B2 is described.

A 100-nm-thick silicon oxynitride (SiON) film was formed over a silicon wafer under the conditions of the insulating film 23, which is described in Embodiment 1. Here, the silicon oxynitride film was formed under the following conditions: the silicon wafer was placed in a treatment chamber of a plasma CVD apparatus, silane with a flow rate of 30 sccm and dinitrogen monoxide with a flow rate of 4000 sccm which were used as a source gas were supplied to the treatment chamber, the pressure in the treatment chamber was controlled to 200 Pa, and the power of 150 W was supplied with the use of a 27.12 MHz high-frequency power source. The silicon oxynitride film was formed at a temperature of the silicon wafer being 220° C. Note that the plasma CVD apparatus used in this example is a parallel plate plasma CVD apparatus in which the electrode area is 6000 cm², and the power per unit area (power density) into which the supplied power is converted is 0.025 W/cm².

Next, a 100-nm-thick silicon oxide (SiO$_x$) film was formed over the silicon oxynitride film by a sputtering method. Here, the silicon oxide film containing $^{18}$O was formed under the following conditions: the silicon wafer was placed in a treatment chamber of a sputtering apparatus, $^{18}$O (an isotope of $^{16}$O) with a flow rate of 300 sccm which was used as a source gas was supplied to the treatment chamber, the pressure in the treatment chamber was controlled to 0.7 Pa, and the power of 8000 W was supplied with the use of a high-frequency power source. This sample is referred to as the sample B1.

Next, the sample B1 was heated at 350° C. for one hour. This sample is referred to as the sample B2.

Next, the concentration profiles of $^{18}$O contained in each of the samples B1 and B2 were measured by SSDP-SIMS (measurement from the back side, here from the silicon wafer side).

Other than $^{16}$O which is a main nuclide in oxygen, isotopes such as $^{17}$O and $^{18}$O exist. It is known that the proportions of $^{17}$O and $^{18}$O in all of the oxygen atoms in nature are about 0.038% and about 0.201%, respectively. That is, the concentrations of $^{17}$O and $^{18}$O can be estimated by measuring the concentration of $^{16}$O in the silicon oxynitride film by SIMS. Here, the concentration of $^{18}$O in the silicon oxynitride film and the concentration of $^{18}$O estimated from its proportion to $^{16}$O are compared, whereby whether $^{18}$O is diffused or not into the silicon oxynitride (SiON) film from the silicon oxide (SiO$_x$) film can be judged.

Here, the concentrations of $^{16}$O and $^{18}$O in the silicon oxynitride film were measured. Note that a cesium primary ion (Cs$^+$) was used as a primary ion species.

Figure 16A:
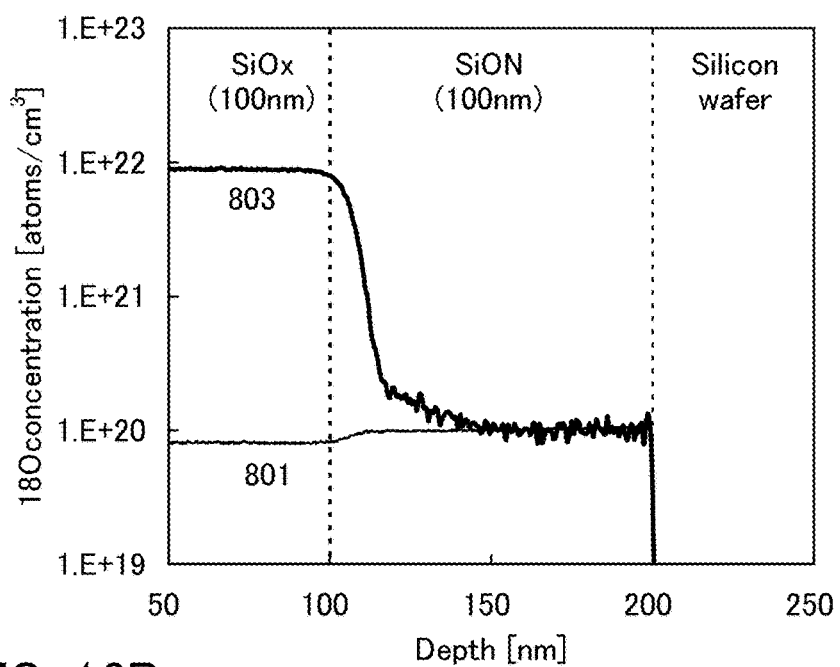
FIGS. 16A and 16B each show results of SSDP-SIMS measurement.
Figure 16B:
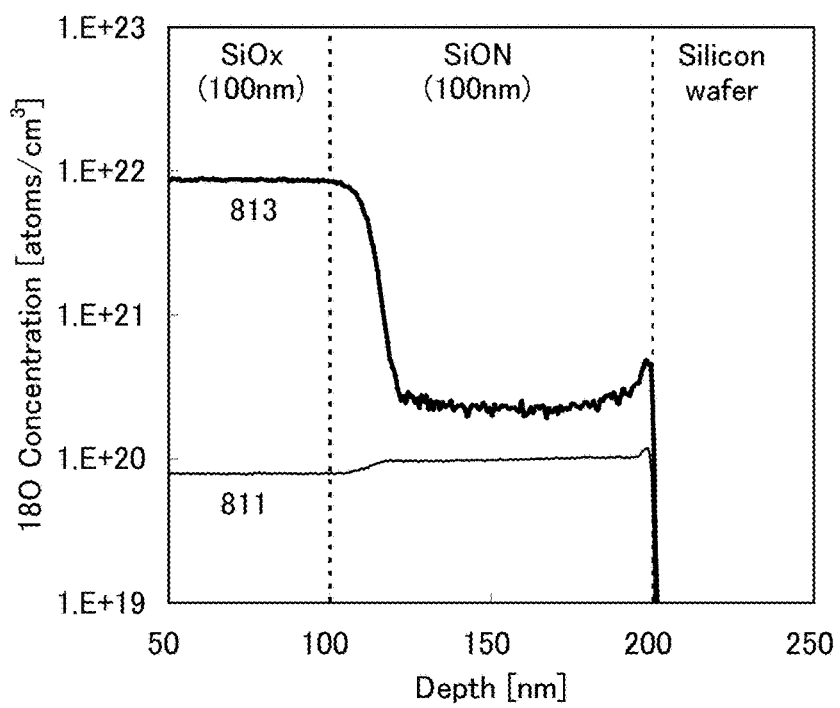

FIGS. 16A and 16B each show the concentration profiles of $^{18}$O which were obtained by the SSDP-SIMS measurement.

FIG. 16A shows the measurement result of the sample B1. A curve 801 is the concentration profile of $^{18}$O which was calculated on the basis of the concentration profile of $^{16}$O measured by SSDP-SIMS with the assumption of a natural proportion of $^{18}$O, and a curve 803 is the concentration profile of $^{18}$O measured by SSDP-SIMS.

FIG. 16B shows the measurement result of the sample B2. A curve 811 is the concentration profile of $^{18}$O which was calculated on the basis of the concentration profile of $^{16}$O measured by SSDP-SIMS, and a curve 813 is the concentration profile of $^{18}$O measured by SSDP-SIMS.

In the SiON in FIG. 16A, the curve 801 and the curve 803 coincide with each other. That is, it is found that $^{18}$O contained in the SiO$_x$ is not diffused into the SiON in the sample B1.

On the other hand, the concentration shown by the curve 813 is raised more than that shown by the curve 811 in the SiON in FIG. 16B. That is, it is found that $^{18}$O contained in the SiO$_x$ is diffused into the SiON by the heat treatment and the concentration of $^{18}$O in the SiON is increased.

As described above, oxygen is diffused into the silicon oxynitride film formed under the conditions of the insulating film 23, which is described in Embodiment 1. That is, excess oxygen contained in an insulating film in contact with the silicon oxynitride film can be diffused into the silicon oxynitride film.

Example 3

In this example, change in defects of the oxide semiconductor film which is caused at the same time as the formation of the insulating film 23 and the insulating film 24 described in Embodiment 1 will be described. In this example, results of electron spin resonance (ESR) by which the amount of oxygen vacancies in the oxide semiconductor film was measured will be described.

Figure 17A:
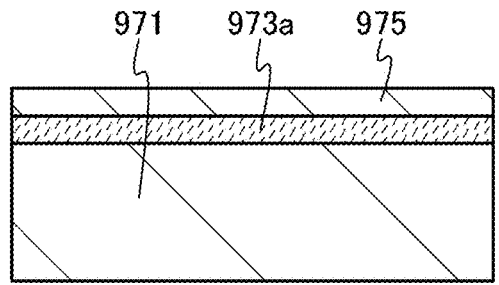
FIGS. 17A to 17C are cross-sectional views each illustrating a structure of a sample.
Figure 17B:
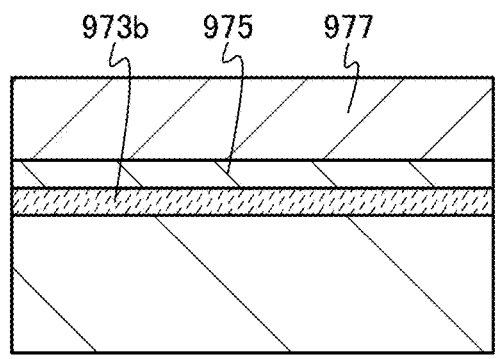
Figure 17C:
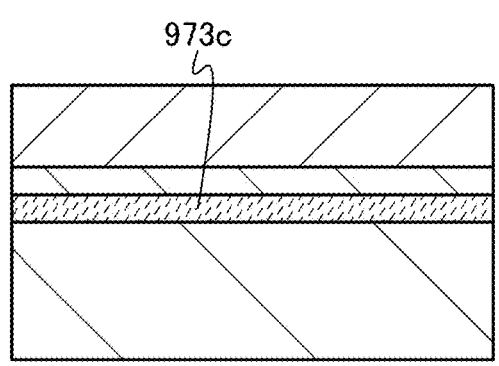

First, a method for forming samples C1, samples C2, and samples C3 which are illustrated in FIGS. 17A to 17C is described.

A method for forming the sample C1 illustrated in FIG. 17A is described.

A 100-nm-thick IGZO film 973a which was a CAAC-OS film was formed by a sputtering method over a quartz substrate 971. Here, the IGZO film was formed under the following conditions: a sputtering target containing In, Ga, and Zn at an atomic ratio of 1:1:1 was used, argon with a flow rate of 50 sccm and oxygen with a flow rate of 50 sccm were supplied as a sputtering gas to a treatment chamber of a sputtering apparatus, the pressure in the treatment chamber was controlled to 0.6 Pa, and the direct current power of 5 kW was supplied. Note that the IGZO film was formed at a substrate temperature of 170° C.

Next, a silicon oxynitride film 975 was formed over the IGZO film 973a under the conditions of the insulating film 23, which is described in Embodiment 1. Here, the silicon oxynitride film was formed under the following conditions: the quartz substrate was placed in a treatment chamber of a plasma CVD apparatus, silane with a flow rate of 30 sccm and dinitrogen monoxide with a flow rate of 4000 sccm which were used as a source gas were supplied to the treatment chamber, and the power of 150 W was supplied with the use of a 27.12 MHz high-frequency power source. The silicon oxynitride film was formed at a temperature of the quartz substrate being 220° C. Note that the plasma CVD apparatus used in this example is a parallel plate plasma CVD apparatus in which the electrode area is 6000 cm$^2$, and the power per unit area (power density) into which the supplied power is converted is 0.025 W/cm$^2$.

A plurality of samples C1 were formed in such a manner that the pressure in the treatment chamber during the formation of the insulating film 23 was controlled to 40 Pa, 120 Pa, and 200 Pa and the silicon oxynitride films 975 were formed to thicknesses of 20 nm, 50 nm, and 100 nm.

Next, a method for forming samples C2 illustrated in FIG. 17B is described.

A silicon oxynitride film 977 was formed over a sample C1 under the conditions of the insulating film 24 formation, which is described in Embodiment 1. Here, the 400-nm-thick silicon oxynitride film was formed by a plasma CVD method under the following conditions: the quartz substrate was placed in a treatment chamber of the plasma CVD apparatus, silane with a flow rate of 160 sccm and dinitrogen monoxide with a flow rate of 4000 sccm which were used as a source gas were supplied to the treatment chamber, the pressure in the treatment chamber was 200 Pa, the substrate temperature was 220° C., and the high-frequency power of 1500 W was supplied to an upper electrode of parallel plate electrodes.

Note that here, the IGZO film which was a CAAC-OS film is an IGZO film 973b illustrated in FIG. 17B.

Through the above process, the samples C2 were formed.

Next, a method for forming the samples C3 illustrated in FIG. 17C is described.

The samples C3 were formed by heating samples C2 at 350° C. for one hour. Note that here, the IGZO film which was a CAAC-OS film is an IGZO film 973c illustrated in FIG. 17C.

Next, ESR measurement was performed on the samples C1 to C3. In the ESR measurement performed at a predetermined temperature, a value of a magnetic field ($H_0$) where a microwave is absorbed is used for an equation $g=h\nu/\beta H_0$, so that a parameter of a g-factor can be obtained. Note that the frequency of the microwave is denoted by $\nu$, and the Planck constant and the Bohr magneton are denoted by, respectively, h and $\beta$ which are both constants.

Here, the ESR measurement was performed under the following conditions. The measurement temperature was room temperature (25° C.), the high-frequency power (power of microwaves) of 9.4 GHz was 20 mW, and the direction of a magnetic field was parallel to a surface of each of the IGZO films in the samples. Note that the lower limit of the detection of the spin densities of a signal due to oxygen vacancies in the IGZO film, which appeared when g (g-factor) was 1.93, was $2.2 \times 10^{16}$ spins/cm$^3$.

Figure 18A:
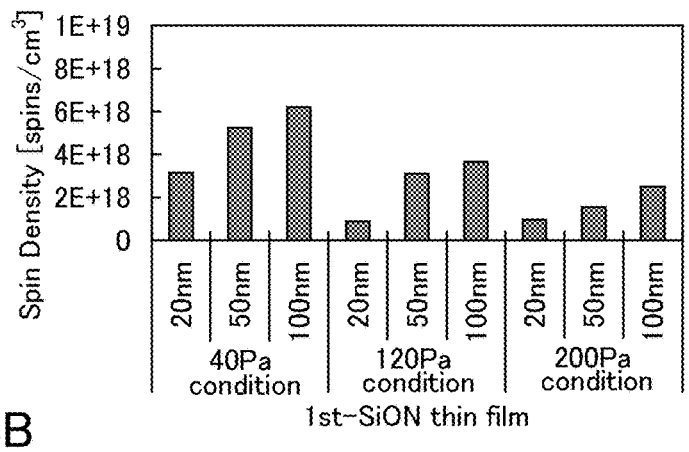
FIGS. 18A to 18C each show results of ESR measurement
Figure 18B:
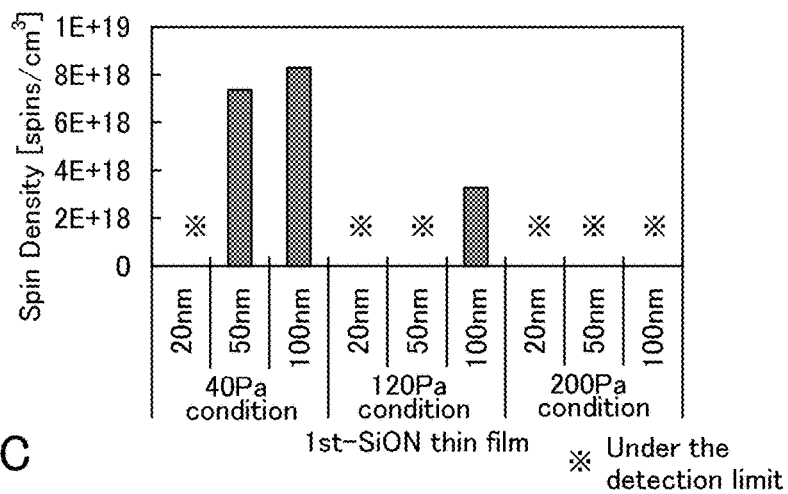
Figure 18C:
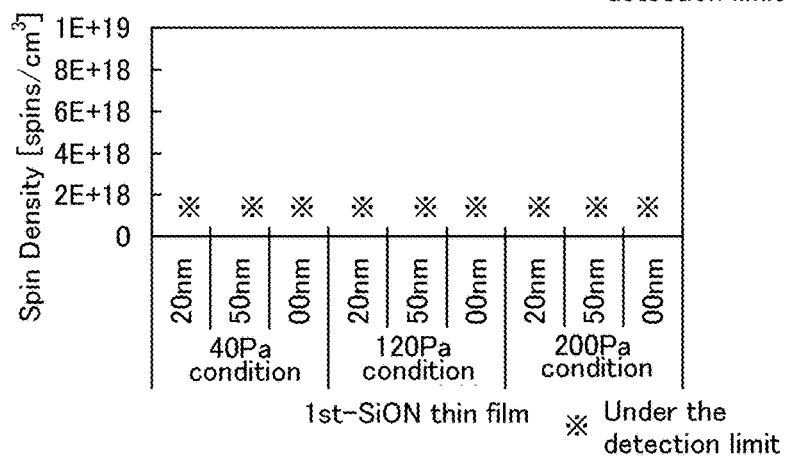

FIGS. 18A to 18C each show spin densities of signals that appear when g (g-factor) is 1.93. FIG. 18A shows spin densities in the samples C1, FIG. 18B shows spin densities in the samples C2, and FIG. 18C shows spin densities in the samples C3. Note that in each of FIGS. 18A to 18C, a 1$^{st}$-SiON indicates the silicon oxynitride film 975.

Figure 19:
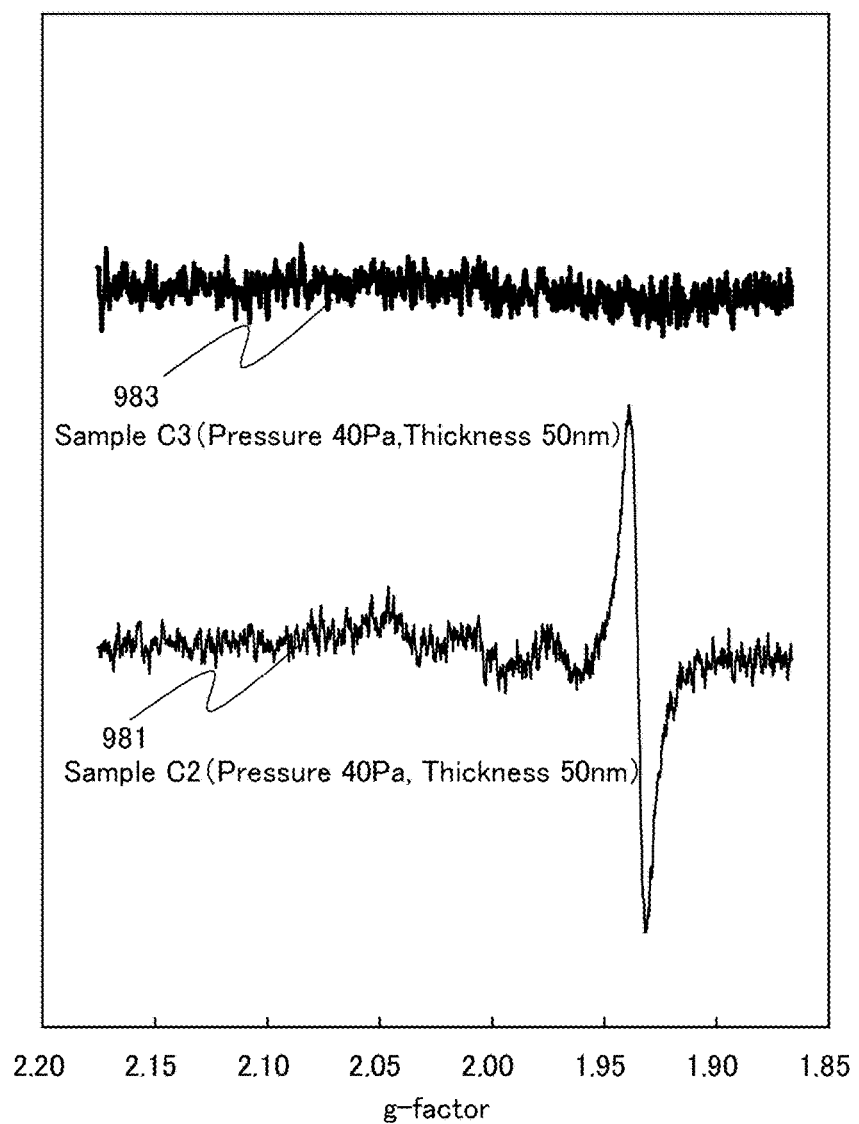
FIG. 19 shows results of ESR measurement.

Moreover, the IGZO films included in one of the samples C2 and one of the samples C3 shown in FIGS. 18B and 18C were evaluated by ESR and their first derivative curves are shown in FIG. 19. A curve 981 is a first derivative curve of a sample C2 in which a 50-nm-thick silicon oxynitride film 975 was formed under the film formation conditions of the pressure of 40 Pa.

A curve 983 is a first derivative curve of a sample C3 in which a 50-nm-thick silicon oxynitride film 975 was formed under the film formation conditions of the pressure of 40 Pa.

It is found from FIG. 19 that, in the sample C2, a signal having symmetry due to an oxygen vacancy is detected at a g-factor of 1.93, which means that the IGZO film contains an oxygen vacancy. On the other hand, it is found that, in the sample C3, a signal having symmetry due to an oxygen vacancy is not detected (i.e., the amount of oxygen vacancies was less than or equal to the lower limit of detection) and that the amount of oxygen vacancies in the IGZO film cannot be detected.

It is found from FIG. 18A that as the thickness of the silicon oxynitride film 975 is larger or the film formation pressure is lower, the amount of oxygen vacancies in the IGZO film 973a increases. This is because it will be more difficult for the excess oxygen contained in the silicon oxynitride film 977 to diffuse into the IGZO film as the thickness of the silicon oxynitride film 975 formed under the conditions of the insulating film 24 described in Embodiment 1 increases. Further, the oxide semiconductor film is damaged as the film formation pressure is lower and thus the amount of oxygen vacancies increases under such film formation conditions of the silicon oxynitride film 975.

It is found from FIG. 18B that, in most of the samples where the silicon oxynitride film 977 is formed over the silicon oxynitride film 975, the amount of oxygen vacancies in the IGZO film 973b is less than or equal to the lower limit of detection, though the amount of oxygen vacancies increases in some samples.

This is because oxygen vacancies in the IGZO film 973b are reduced as follows: the silicon oxynitride film 977 which is an oxide insulating film which contains oxygen at a higher proportion than the stoichiometric composition is formed over the silicon oxynitride film 975, so that excess oxygen contained in the silicon oxynitride film 977 is diffused into the IGZO film 973b through the silicon oxynitride film 975 to compensate the oxygen vacancies.

It is found from FIG. 18C that the amount of oxygen vacancies in the IGZO film 973c is less than or equal to the lower limit of detection by the heat treatment performed after the silicon oxynitride film 977 is formed over the silicon oxynitride film 975.

This is because oxygen vacancies in the IGZO film 973c are reduced as follows: the silicon oxynitride film 977 which is an oxide insulating film which contains oxygen at a higher proportion than the stoichiometric composition is formed over the silicon oxynitride film 975, so that excess oxygen contained in the silicon oxynitride film 977 is diffused into the IGZO film 973c through the silicon oxynitride film 975 to compensate the oxygen vacancies.

As described above, the amount of oxygen vacancies in an oxide semiconductor film can be reduced by stacking a silicon oxynitride film over the oxide semiconductor film. Moreover, with application of the structure to a transistor, as shown in Example 1, the transistor in which the threshold voltage is shifted in the positive direction and the amount of change in threshold voltage is less than or equal to 3.0 V, preferably less than or equal to 2.5 V, can be manufactured.

Example 4

In this example, the insulating film 23 formed over a transistor and the Vg-Id characteristics of the transistor will be described with reference to FIGS. 20A and 20B, FIGS. 21A to 21C, FIGS. 22A and 22B, FIGS. 23A and 23B, and FIGS. 24A to 24E.

First, a manufacturing process of transistors included in each of a sample D1 and a sample D2 is described. Note that the samples D1 and D2 differ only in the flow rate of the source gas used for forming the insulating film 23 described in Embodiment 1.

The sample D1 is similar to the sample A2, and as the insulating film 23, a 50-nm-thick silicon oxynitride film was formed by a plasma CVD method under the following conditions: silane with a flow rate of 30 sccm and dinitrogen monoxide with a flow rate of 4000 sccm were used as a source gas, the pressure in a treatment chamber of a plasma CVD apparatus was 40 Pa, the substrate temperature was 220° C., and the high-frequency power of 150 W was supplied to an upper electrode of parallel plate electrodes. Here, the ratio of the flow rate of dinitrogen monoxide to the flow rate of silane was 133.

The sample D2 is also similar to the sample A2, and as the insulating film 23, a 50-nm-thick silicon oxynitride film was formed by a plasma CVD method under the following conditions: silane with a flow rate of 80 sccm and dinitrogen monoxide with a flow rate of 4000 sccm were used as a source gas, the pressure in a treatment chamber was 40 Pa, the substrate temperature was 220° C., and the high-frequency power of 150 W was supplied to an upper electrode of parallel plate electrodes. Here, the ratio of the flow rate of dinitrogen monoxide to the flow rate of silane was 50.

Figure 20A:
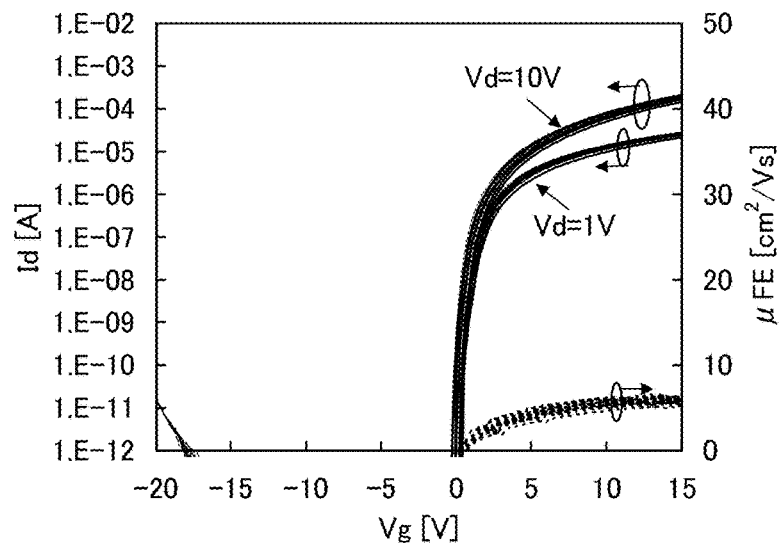
FIGS. 20A and 20B each show Vg-Id characteristics of a transistor.
Figure 20B:
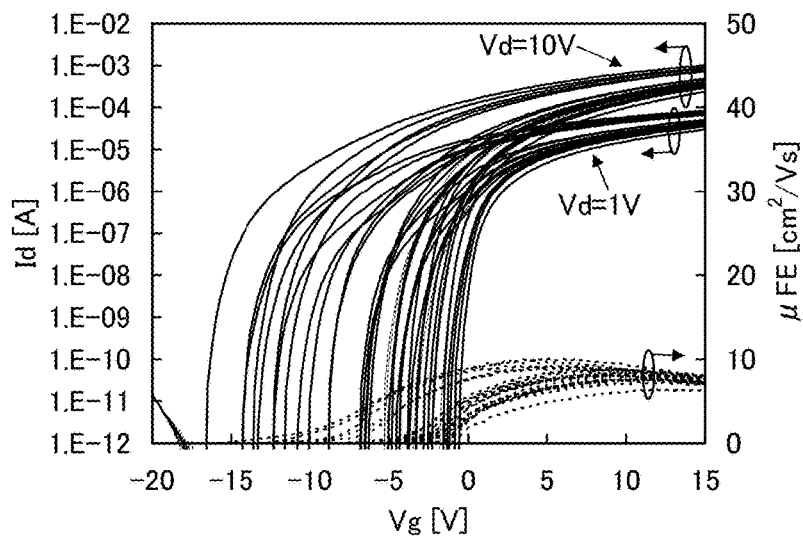

Next, the Vg-Id characteristics of the samples D1 and D2 were measured. FIG. 20A shows the Vg-Id characteristics of the samples D1, and FIG. 20B shows the Vg-Id characteristics of the samples D2. In each of FIGS. 20A and 20B, the horizontal axis indicates the gate voltage (Vg), and the vertical axis indicates the drain current (Id) flowing between the pair of electrodes 21. The Vg-Id characteristics were measured at drain voltages (Vd) of 1 V and 10 V. Further, the field-effect mobility with respect to the gate voltage at the drain voltage of 10 V is shown. Note that the field-effect mobility was obtained by operation of each sample in a saturation region. Note that here, the Vg-Id characteristics of 24 transistors are shown.

Although the samples D2 fluctuate in threshold voltage as shown in FIG. 20B, the samples D1 fluctuate less in threshold voltage as shown in FIG. 20A. Accordingly, it is found that, when the ratio of the flow ratio of dinitrogen monoxide to silane is 100 or higher as the film formation conditions of the insulating film 23, favorable Vg-Id characteristics can be obtained.

Next, the flow rate of the source gas used for forming the insulating film 23 and the amount of oxygen vacancies in the oxide semiconductor film were measured by ESR.

First, a method for forming samples is described.

A 100-nm-thick IGZO film which was a CAAC-OS film was formed by a sputtering method over a quartz substrate. The IGZO film was formed under conditions similar to those of the samples C1 to C3.

Next, a 400-nm-thick silicon oxynitride film was formed over the IGZO film under the conditions of the insulating film 23 formed in the above samples D1 and D2. A sample in which the silicon oxynitride film was formed under a condition where the ratio of the flow rate of dinitrogen monoxide to the flow rate of silane was 100 or higher (133) in a manner similar to that of a sample D1 is referred to as a sample D3. A sample in which the silicon oxynitride film was formed under a condition where the ratio of the flow rate of dinitrogen monoxide to the flow rate of silane was less than 100 (50) in a manner similar to that of a sample D2 is referred to as a sample D4.

Next, a samples D3 and D4 were heated at 350° C. A sample obtained by heating a sample D3 is referred to as a sample D5. A sample obtained by heating a sample D4 is referred to as a sample D6.

Next, the samples D3 to D6 were measured by ESR. The ESR measurement was performed under conditions similar to those of the ESR measurement performed in Example 3.

Figure 21A:
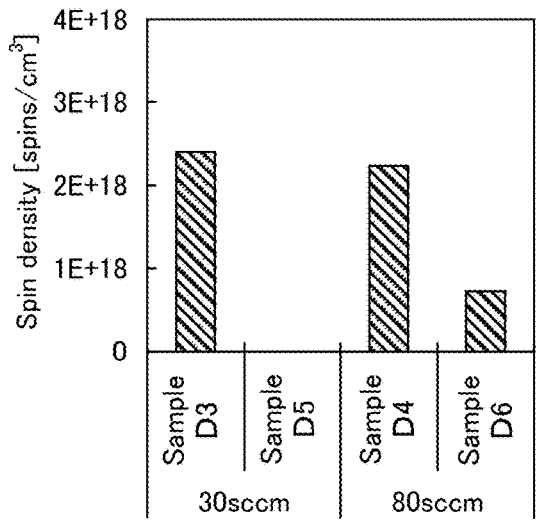
FIGS. 21A to 21C show results of ESR measurement.

FIG. 21A shows spin densities of signals that appear when g (g-factor) is 1.93. In FIG. 21A, the vertical axis indicates the spin density.

Figure 21B:
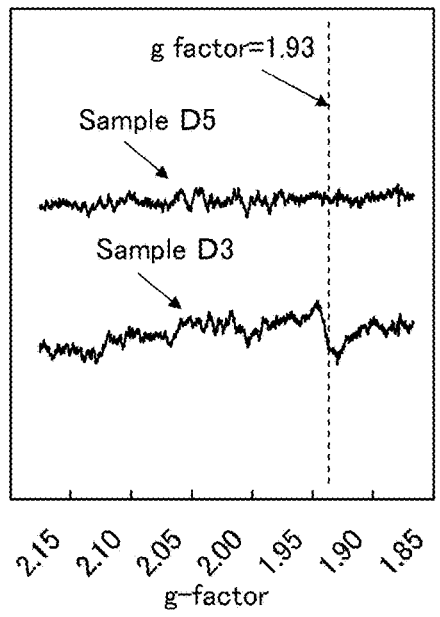
Figure 21C:
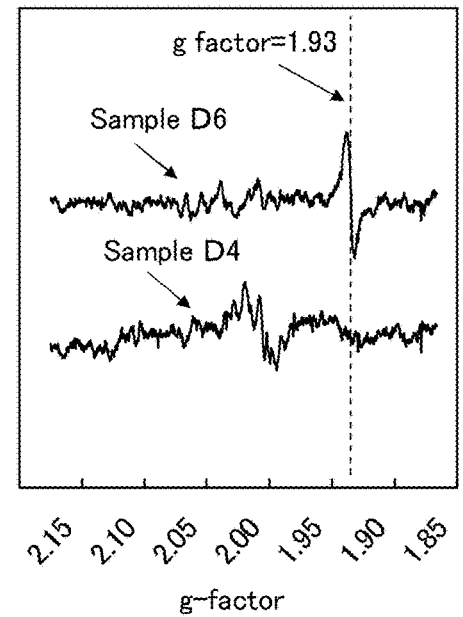

Moreover, FIG. 21B shows first derivative curves which were obtained by measuring the samples D3 and D5 by ESR, and FIG. 21C shows first derivative curves which were obtained by measuring the samples D4 and D6 by ESR.

It is found from FIG. 21A that in the samples D3, D4, and D6, the spin densities are high, and from FIGS. 21B and 21C that in each of the samples D3, D4, and D6, a signal having symmetry due to an oxygen vacancy is detected at a g-factor of 1.93, which means that the IGZO film contains an oxygen vacancy. On the other hand, it is found from FIG. 21B that in the sample D5, a signal having symmetry due to an oxygen vacancy is not detected (i.e., the amount of oxygen vacancies was less than or equal to the lower limit of detection) and, as shown in FIG. 21A, that the amount of oxygen vacancies in the IGZO film cannot be detected.

It is found from FIGS. 21A to 21C that the amount of oxygen vacancies in the IGZO film can be reduced by performing the heat treatment after the silicon oxynitride film was formed under a condition where the ratio of the flow rate of dinitrogen monoxide to the flow rate of silane is 100 or higher.

Next, the flow rate of the source gas used for forming the insulating film 23 and the amount of oxygen vacancies in the insulating film 23 were measured by ESR.

First, samples which were formed are described. In formed samples, a 400-nm-thick silicon oxynitride film was formed over a quartz substrate under the conditions of the insulating film 23 formed in the above samples D1 and D2. A sample in which the silicon oxynitride film was formed under a condition where the ratio of the flow rate of dinitrogen monoxide to the flow rate of silane is 100 or higher (133) in a manner similar to that of the sample D1 is referred to as a sample D7. A sample in which the silicon oxynitride film was formed under a condition where the ratio of the flow rate of dinitrogen monoxide to the flow rate of silane is lower than 100 (55) in a manner similar to that of the sample D2 is referred to as a sample D8.

Next, the samples D7 to D8 were measured by ESR. The ESR measurement was performed under the following conditions: the measurement temperature was room temperature (25° C.), the high-frequency power (power of microwaves) of 9.2 GHz was 20 mW, and the direction of a magnetic field was parallel to a surface of each of the silicon oxynitride films in the samples. The lower limit of the detection of the spin densities of a signal due to dangling bonds of silicon contained in the silicon oxynitride film, which appear when g is 2.001, is $1.0 \times 10^{15}$ spins/cm$^3$. It can be said that, as the spin densities are lower, there are a few defects due to dangling bonds of silicon contained in the silicon oxynitride film.

Figure 22A:
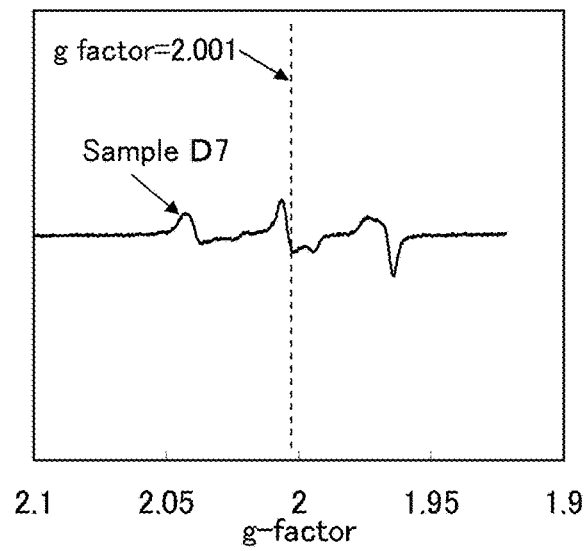
FIGS. 22A and 22B each show results of ESR measurement.
Figure 22B:
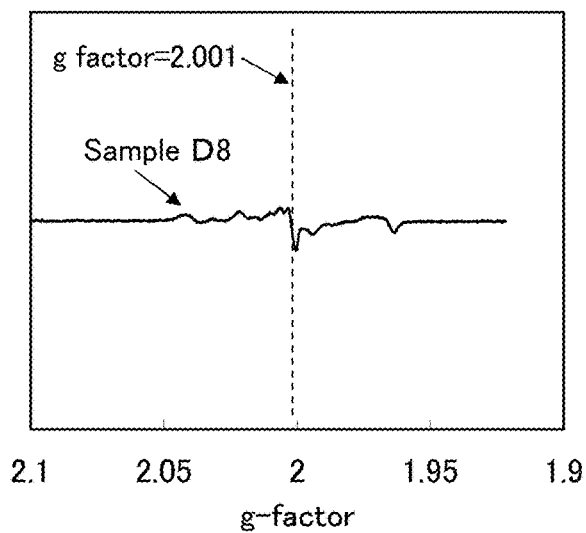

Results of the ESR measurement are shown in FIGS. 22A and 22B. FIG. 22A shows a first derivative curve of the silicon oxynitride film in the sample D7, and FIG. 22B shows a first derivative curve of the silicon oxynitride film in the sample D8. As shown in FIGS. 22A and 22B, although, in the sample D8, a signal having symmetry due to a dangling bond is detected at a g-factor of 2.001, in the sample D7, a signal having symmetry due to a dangling bond is not detected at a g-factor of 2.001. That is, it is found that the amount of dangling bonds of silicon contained in the silicon oxynitride film is small in the sample D7.

It is found from FIGS. 22A and 22B that the amount of dangling bonds in the silicon oxynitride film can be reduced by forming the silicon oxynitride film under a condition where the ratio of the flow rate of dinitrogen monoxide to the flow rate of silane is 100 or higher.

Next, thermal desorption spectroscopy (TDS) analysis was performed on the amount of released oxygen in the case where the insulating film 23 into which and from which oxygen is diffused and the insulating film 24 which contains oxygen at a higher proportion than the stoichiometric composition are stacked and results thereof are shown.

First, samples which were formed are described with reference to FIGS. 23A and 23B. The formed samples each have a structure 1 or a structure 2.

Figure 23A:
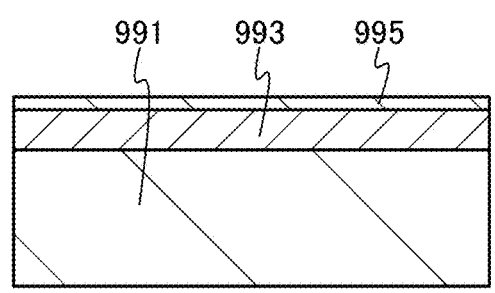
FIGS. 23A and 23B are cross-sectional views each illustrating a structure of a sample.

In the structure 1, as illustrated in FIG. 23A, an insulating film 993 was formed over a silicon wafer 991 under conditions similar to those of the insulating film 24, and then an insulating film 995 was formed over the insulating film 993 under conditions similar to those of the insulating film 23.

Figure 23B:
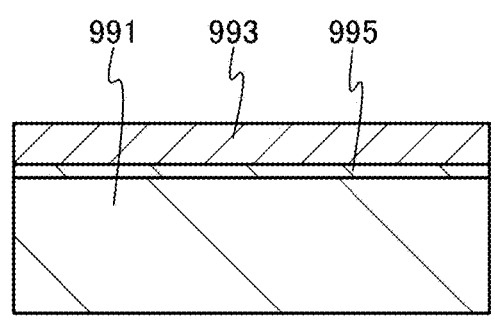

In the structure 2, as illustrated in FIG. 23B, the insulating film 995 was formed over the silicon wafer 991 under conditions similar to those of the insulating film 23, and then the insulating film 993 was formed over the insulating film 995 under conditions similar to those of the insulating film 24.

As the insulating film 993, a 400-nm-thick silicon oxynitride film was formed under the conditions similar to those of the insulating film 24 of the samples A1 to A3.

As the insulating film 995, a 50-nm-thick silicon oxynitride film was formed under the conditions similar to those of the insulating film 23 of the samples D1 and D2.

A sample of the structure 1 in which, as the insulating film 995, the silicon oxynitride film was formed under a condition where the ratio of the flow rate of dinitrogen monoxide to the flow rate of silane was 100 or higher (133) in a manner similar to that of the sample D1 is referred to as a sample E1.

A sample of the structure 1 in which, as the insulating film 995, the silicon oxynitride film was formed under a condition where the ratio of the flow rate of dinitrogen monoxide to the flow rate of silane was lower than 100 (50) in a manner similar to that of the sample D2 is referred to as a sample E2.

A sample of the structure 2 in which, as the insulating film 995, the silicon oxynitride film was formed under a condition where the ratio of the flow rate of dinitrogen monoxide to the flow rate of silane was 100 or higher (133) in a manner similar to that of the sample D1 is referred to as a sample E3.

A sample of the structure 2 in which, as the insulating film 995, the silicon oxynitride film was formed under a condition where the ratio of the flow rate of dinitrogen monoxide to the flow rate of silane was lower than 100 (55) in a manner similar to that of the sample D2 is referred to as a sample E4.

Note that as shown in FIG. 22B, the insulating film 995 included in each of the samples E2 and E4 is a silicon oxynitride film having a dangling bond of silicon, similar to the silicon oxynitride film included in the sample D8.

Figure 24A:
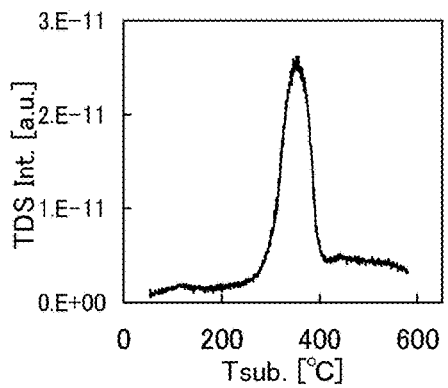
FIGS. 24A to 24E show results of TDS measurement.
Figure 24B:
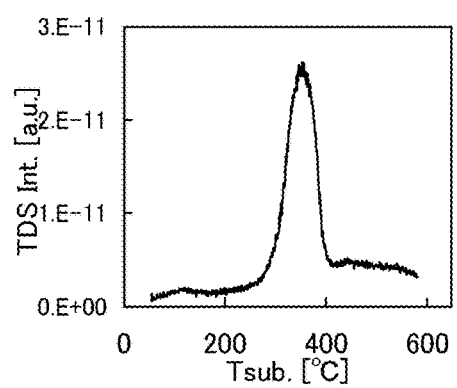
Figure 24C:
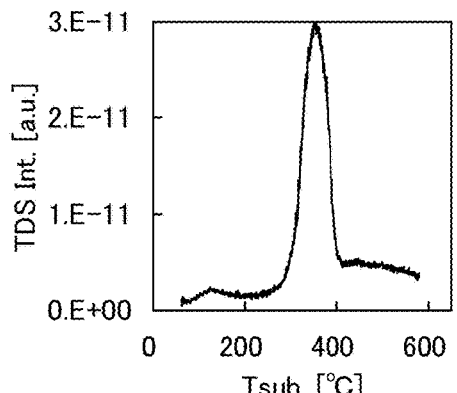
Figure 24D:
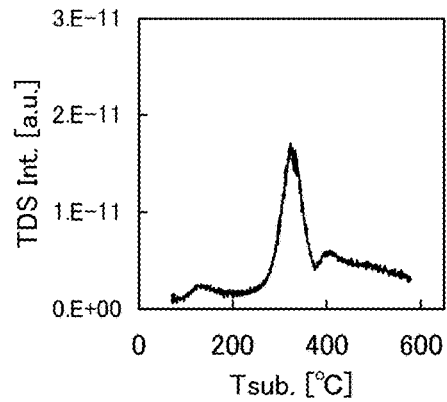

Next, TDS analyses were performed on the samples E1 to E4. Results of the TDS analyses are shown in FIGS. 24A to 24E. FIG. 24A shows TDS analysis result of the sample E1, FIG. 24B shows TDS analysis result of the sample E2, FIG. 24C shows TDS analysis result of the sample E3, and FIG. 24D shows TDS analysis result of the sample E4. In FIGS. 24A to 24D, the horizontal axis indicates the substrate temperature of the samples E1 to E4, and the vertical axis indicates the peak intensity of a TDS spectrum.

Figure 24E:
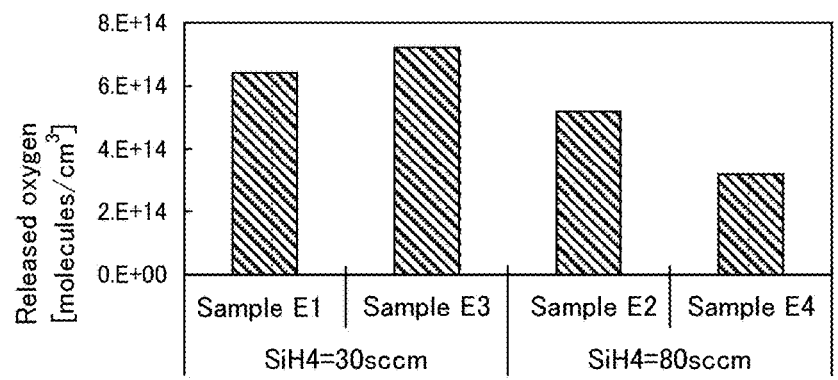

Further, FIG. 24E shows the amount of released oxygen observed from the results of the TDS analyses shown in FIGS. 24A to 24D.

In the TDS analysis, a peak observed at a region where the substrate temperature is higher than or equal to 300° C. and lower than or equal to 400° C. is a peak derived from release of oxygen (specifically, an oxygen atom or an oxygen molecule) contained in the analyzed sample (in this example, the samples E1 to E4) to the outside. The total amount of oxygen released to the outside corresponds to the integral value of the peak. In the case where the oxygen content of the silicon oxynitride film is higher than the content of oxygen which satisfies the stoichiometric composition, it is considered that excess oxygen is easily released to the outside. Thus, with the degree of the peak intensity, the amount of oxygen contained in the stacked silicon oxynitride films can be estimated.

It is found from FIGS. 24A to 24E that the amount of released oxygen is reduced in the sample where a silicon oxynitride film having a dangling bond of silicon is used as the insulating film 995 (the samples E2 and E4). Accordingly, it is found that, when an insulating film into which and from which oxygen is diffused has a dangling bond of silicon, oxygen diffused from an insulating film which contains oxygen at a higher proportion than the stoichiometric composition is bonded to the dangling bond of silicon; therefore, the amount of released oxygen is reduced. That is, in the stack of the insulating film 23 and the insulating film 24 which is used as a protective film of a transistor, the insulating film 23 having a few dangling bonds of silicon is formed, whereby oxygen contained in the insulating film 24 which contains oxygen at a higher proportion than the stoichiometric composition can be efficiently diffused into an oxide semiconductor film of the transistor and oxygen vacancies in the oxide semiconductor film can be compensated. As a result, the fluctuations and negative shifts in the threshold voltage of the transistor can be suppressed as shown in FIGS. 20A and 20B.

Example 5

In this example, the concentrations of hydrogen, nitrogen, and fluorine in an insulating film formed over an oxide semiconductor film were measured by SIMS and results thereof will be shown.

First, a method for forming a sample F1 and a sample F2 is described.

The sample F1 has a structure similar to that of the sample A2. Note that oxygen plasma treatment prior to the formation of the insulating film 23 is not performed.

In the sample F2, the oxygen plasma treatment prior to the formation of the insulating film 23 and the formation of the insulating film 23 which were performed in the sample A2 were not performed, and the insulating film 24 was formed over the oxide semiconductor film 19.

Next, the samples F1 and F2 were measured by SIMS. FIG. 25A shows the concentration of hydrogen, FIG. 25B shows the concentration of nitrogen, and FIG. 25C shows the concentration of fluorine in the insulating films 23 and 24 in the sample F1. FIG. 25D shows the concentration of hydrogen, FIG. 25E shows the concentration of nitrogen, and FIG. 25F shows the concentration of fluorine in the insulating film 24 in the sample F2. In FIGS. 25A to 25F, the horizontal axis indicates the depth from the surface of each sample and the vertical axis indicates the concentration of each element.

In the sample F1, the concentrations of hydrogen and nitrogen are not changed at the interface between the insulating film 23 and the insulating film 24, whereas the concentration of fluorine has a peak at the interface between the insulating film 23 and the insulating film 24. From the following description, the concentration of fluorine has a peak at the above interface. After the insulating film 23 was formed, the power of a plasma CVD apparatus was cut, the flow rate of a source gas introduced into a treatment chamber and the pressure in the treatment chamber were changed, and power was resupplied to the plasma CVD apparatus to form the insulating film 24. Note that after the insulating film 23 was formed, the surface of the insulating film 23 was exposed to the atmosphere in the treatment chamber until the insulating film 24 was formed.

In the treatment chamber, fluorine or $NF_3$ which was used in cleaning of the treatment chamber was attached to the inner wall of the treatment chamber, and the fluorine or $NF_3$ released from the inner wall of the treatment chamber was attached to the surface of the insulating film 23 while the insulating film 24 was formed just after the insulating film 23 was formed. Therefore, the concentration of fluorine is increased at the interface between the insulating film 23 and the insulating film 24 and thus has a peak.

Note that since only a single layer of the insulating film 24 is provided over the oxide semiconductor film 19 in the sample F2, the concentration of fluorine in the insulating film 24 does not have a peak as shown in FIG. 25F.

Example 6

In this example, characteristics of a silicon oxynitride film formed using a method for forming an insulating film of one embodiment of the present invention will be described. Specifically, the etching rate of the silicon oxynitride film formed by the method will be described with reference to FIG. 26.

First, samples which were formed are described. The formed samples are a sample G1, a sample G2, and a comparative sample G1 in each of which a 100-nm-thick silicon oxynitride film was formed over a glass substrate. Note that in the sample G1, the silicon oxynitride film was formed under the conditions of the insulating film 23, which is described in Embodiment 1, and, in the comparative sample G1, the silicon oxynitride film was formed under the conditions of the insulating film 24, which is described in Embodiment 1.

The silicon oxynitride film was formed under the following conditions: the glass substrate was placed in a treatment chamber of a plasma CVD apparatus, silane with a flow rate of 20 sccm and dinitrogen monoxide with a flow rate of 3000 sccm which were used as a source gas were supplied to the treatment chamber, the pressure in the treatment chamber was controlled to 200 Pa, and the power of 100 W was supplied with the use of a 27.12 MHz high-frequency power source. The silicon oxynitride film was formed at a substrate temperature of 350° C. Note that the plasma CVD apparatus used here is a parallel plate plasma CVD apparatus in which the electrode area is 6000 $cm^2$, and the power per unit area (power density) into which the supplied power is converted is 0.017 $W/cm^2$.

A sample formed in the above manner is referred to as the sample G1.

A sample formed as follows is referred to as the sample G2: the silicon oxynitride film was formed under the film formation conditions of the sample G1, except for the pressure in a treatment chamber, which was 40 Pa.

Further, the silicon oxynitride film of another sample was formed under the following conditions: the glass substrate was placed in a treatment chamber of a plasma CVD apparatus, silane with a flow rate of 160 sccm and dinitrogen monoxide with a flow rate of 4000 sccm which were used as a source gas were supplied to the treatment chamber, the pressure in the treatment chamber was controlled to 200 Pa, and the power of 1500 W was supplied with the use of a 27.12 MHz high-frequency power source. The silicon oxynitride film was formed at a substrate temperature of 220° C. Note that the plasma CVD apparatus used here is a parallel plate plasma CVD apparatus in which the electrode area is 6000 $cm^2$, and the power per unit area (power density) into which the supplied power is converted is 0.25 $W/cm^2$.

The sample formed in the above manner is referred to as the comparative sample G1.

Figure 26:
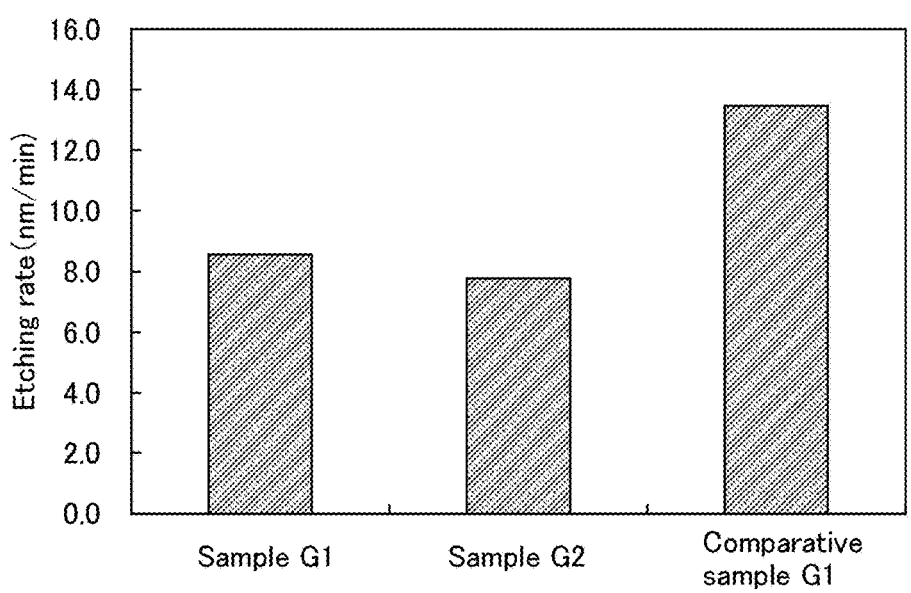
FIG. 26 shows the etching rates of silicon oxynitride films.

Next, the film thicknesses of the samples G1 and G2 and the comparative sample G1 were measured. Then, the samples G1 and G2 and the comparative sample G1 were immersed in 0.5 weight % of hydrofluoric acid for 45 seconds. Note that the temperature of the hydrofluoric acid at this time was room temperature. After that, the film thicknesses of the silicon oxynitride films of the samples were measured. From the results of the thicknesses, the etching rates of the silicon oxynitride films of the samples were calculated. The etching rates of the samples are shown in FIG. 26.

The etching rate of the sample G1 was 8.5 nm/min, the etching rate of the sample G2 was 7.8 nm/min, and the etching rate of the comparative sample G1 was 13.5 nm/min.

As described above, under the conditions of the insulating film 23, which is described in Embodiment 1, a silicon oxynitride film whose etching rate is lower than that of the silicon oxynitride film formed under the conditions of the insulating film 24, which is described in Embodiment 1, and whose etching rate is 10 nm/min, preferably 8 nm/min, can be formed.

This application is based on Japanese Patent Application serial No. 2012-092324 filed with the Japan Patent Office on Apr. 13, 2012, Japanese Patent Application serial No. 2012-108840 filed with the Japan Patent Office on May 10, 2012, and Japanese Patent Application serial No. 2012-125447 filed with the Japan Patent Office on May 31, 2012, the entire contents of which are hereby incorporated by reference.

What is claimed is:

1. A method for manufacturing a semiconductor device, comprising:
   forming an oxide semiconductor film over a substrate;
   forming a first oxide insulating film over and in contact with the oxide semiconductor film, in an apparatus and by chemical vapor deposition in a first atmosphere, and with a first radio-frequency power supplied to an electrode of the apparatus; and
   forming a second oxide insulating film over and in contact with the first oxide insulating film, in the apparatus and by chemical vapor deposition in a second atmosphere, and with a second radio-frequency power supplied to the electrode of the apparatus,
   wherein the first radio-frequency power is lower than the second radio-frequency power,
   wherein the first oxide insulating film is formed thinner than the second oxide insulating film, and a thickness of the first oxide insulating film is less than or equal to 50 nm, and
   wherein spin densities of the first oxide insulating film measured by electron spin resonance are less than or equal to a lower limit of detection at a g-factor of 2.001.

2. The method for manufacturing a semiconductor device according to claim 1,
   wherein the first oxide insulating film is formed at a first temperature,
   wherein the second oxide insulating film is formed in a second temperature, and
   wherein the first temperature is higher than the second temperature.

3. The method for manufacturing a semiconductor device according to claim 1,
   wherein an etching rate of the first oxide insulating film is lower than or equal to 10 nm/min and lower than an etching rate of the second oxide insulating film when etching is performed at 25° C. with a solution of 0.5 weight % of hydrofluoric acid.

4. The method for manufacturing a semiconductor device according to claim 1,
   wherein the second oxide insulating film is formed so as to contain oxygen at a higher proportion than a stoichiometric composition.

5. The method for manufacturing a semiconductor device according to claim 1, further comprising stacking a silicon nitride film on the second oxide insulating film.

6. The method for manufacturing a semiconductor device according to claim 1,
   wherein a threshold voltage of a transistor including the oxide semiconductor film changes in a positive direction by a bias-temperature stress test,
   wherein an amount of change is less than or equal to 3.0V, and
   wherein the bias-temperature stress test is performed when a temperature of the substrate is 80° C., an intensity of an electric field applied to a gate insulating film of the transistor is 1.28 MV/cm, and a performance time is 2000 seconds.

7. A method for manufacturing a semiconductor device, comprising:
   forming an oxide semiconductor film over a substrate;
   forming a first oxide insulating film over and in contact with the oxide semiconductor film, in an apparatus and by chemical vapor deposition in a first atmosphere, and with a first radio-frequency power supplied to an electrode of the apparatus; and
   forming a second oxide insulating film over and in contact with the first oxide insulating film, in the apparatus and by chemical vapor deposition in a second atmosphere, and with a second radio-frequency power supplied to the electrode of the apparatus,
   wherein the first radio-frequency power is lower than the second radio-frequency power,
   wherein the first oxide insulating film is formed thinner than the second oxide insulating film, and a thickness of the first oxide insulating film is less than or equal to 50 nm,
   wherein spin densities of the first oxide insulating film measured by electron spin resonance are less than or equal to a lower limit of detection at a q-factor of 2.001, and
   wherein the first oxide insulating film and the second oxide insulating film are a first silicon oxynitride film and a second silicon oxynitride film, respectively.

8. The method for manufacturing a semiconductor device according to claim 7,
   wherein the first oxide insulating film is formed at a first temperature,
   wherein the second oxide insulating film is formed in a second temperature, and
   wherein the first temperature is higher than the second temperature.

9. The method for manufacturing a semiconductor device according to claim 7,
   wherein an etching rate of the first oxide insulating film is lower than or equal to 10 nm/min and lower than an etching rate of the second oxide insulating film when etching is performed at 25° C. with a solution of 0.5 weight % of hydrofluoric acid.

10. The method for manufacturing a semiconductor device according to claim 7,
    wherein the second oxide insulating film is formed so as to contain oxygen at a higher proportion than a stoichiometric composition.

11. The method for manufacturing a semiconductor device according to claim 7, further comprising stacking a silicon nitride film on the second oxide insulating film.

12. The method for manufacturing a semiconductor device according to claim 7,
    wherein a threshold voltage of a transistor including the oxide semiconductor film changes in a positive direction by a bias-temperature stress test,
    wherein an amount of change is less than or equal to 3.0V, and
    wherein the bias-temperature stress test is performed when a temperature of the substrate is 80° C., an intensity of an electric field applied to a gate insulating film of the transistor is 1.28 MV/cm, and a performance time is 2000 seconds.

13. A method for manufacturing a semiconductor device, comprising:
    forming an oxide semiconductor film over a substrate;
    forming a first oxide insulating film over and in contact with the oxide semiconductor film, in an apparatus and by chemical vapor deposition in a first atmosphere, at a first temperature, and with a first radio-frequency power supplied to an electrode of the apparatus;
    forming a second oxide insulating film over and in contact with the first oxide insulating film, in the apparatus and by chemical vapor deposition in a second atmosphere, at a second temperature, and with a second radio-frequency power supplied to the electrode of the apparatus; and applying a heat treatment to the second oxide insulating film at a third temperature comprised between 250° C. and 450° C. in a nitrogen atmosphere, the third temperature being higher than the first temperature and the second temperature, wherein the first radio-frequency power is lower than the second radio-frequency power, wherein the first oxide insulating film is formed thinner than the second oxide insulating film, and a thickness of the first oxide insulating film is less than or equal to 50 nm, wherein spin densities of the first oxide insulating film measured by electron spin resonance are less than or equal to a lower limit of detection at a g-factor of 2.001, and wherein the first oxide insulating film and the second oxide insulating film are a first silicon oxynitride film and a second silicon oxynitride film, respectively.

14. The method for manufacturing a semiconductor device according to claim 13,
wherein the first temperature is higher than the second temperature.

15. The method for manufacturing a semiconductor device according to claim 13,
wherein an etching rate of the first oxide insulating film is lower than or equal to 10 nm/min and lower than an etching rate of the second oxide insulating film when etching is performed at 25° C. with a solution of 0.5 weight % of hydrofluoric acid.

16. The method for manufacturing a semiconductor device according to claim 13,
wherein the second oxide insulating film is formed so as to contain oxygen at a higher proportion than a stoichiometric composition.

17. The method for manufacturing a semiconductor device according to claim 13, further comprising stacking a silicon nitride film on the second oxide insulating film.

18. The method for manufacturing a semiconductor device according to claim 13,
wherein a threshold voltage of a transistor including the oxide semiconductor film changes in a positive direction by a bias-temperature stress test,
wherein an amount of change is less than or equal to 3.0V, and
wherein the bias-temperature stress test is performed when a temperature of the substrate is 80° C., an intensity of an electric field applied to a gate insulating film of the transistor is 1.28 MV/cm, and a performance time is 2000 seconds.

* * * * *